(12) United States Patent
Christiansen

(10) Patent No.: US 11,053,652 B2
(45) Date of Patent: Jul. 6, 2021

(54) TWO-WIRE CONTROLLING AND MONITORING SYSTEM FOR IN PARTICULAR IRRIGATION OF LOCALIZED AREAS OF SOIL

(71) Applicant: S-RAIN CONTROL A/S, Kvistgard (DK)

(72) Inventor: Tom Nohr Christiansen, Horsholm (DK)

(73) Assignee: S-RAIN CONTROL A/S, Kvistgard (DK)

( * ) Notice: Subject to any disclaimer, the term of this patent is extended or adjusted under 35 U.S.C. 154(b) by 0 days.

(21) Appl. No.: 16/151,084

(22) Filed: Oct. 3, 2018

(65) Prior Publication Data
US 2019/0032294 A1 Jan. 31, 2019

Related U.S. Application Data

(62) Division of application No. 14/404,837, filed as application No. PCT/EP2013/061239 on May 31, 2013, now Pat. No. 10,113,287.

(30) Foreign Application Priority Data

May 31, 2012 (EP) .................................... 12170174
May 31, 2012 (EP) .................................... 13151061
(Continued)

(51) Int. Cl.
*E02B 13/02* (2006.01)
*A01G 25/16* (2006.01)
(Continued)

(52) U.S. Cl.
CPC .............. *E02B 13/02* (2013.01); *A01G 25/16* (2013.01); *A01G 25/167* (2013.01); *E02B 5/082* (2013.01);
(Continued)

(58) Field of Classification Search
CPC ......... E02B 13/02; E02B 5/082; A01G 25/16; A01G 25/167; G01R 31/3278; G01R 27/02
See application file for complete search history.

(56) References Cited

U.S. PATENT DOCUMENTS 3,723,753 A 3/1973 Davis
4,004,612 A 1/1977 Hummel, Jr. et al.
(Continued)

FOREIGN PATENT DOCUMENTS

AU 733334 5/2001
EP 1467268 10/2004

OTHER PUBLICATIONS

Bacanskas et al, ("Aging and Service Wear of Solenoid-Operated Valves Used in Safety Systems of Nuclear Power Plants", Mar. 1987, pp. total 65, downloaded from the internet at https://www.nrc.gov/docs/ML0403/ML040360264.pdf (Year: 1987).*
(Continued)

*Primary Examiner* — Rocio Del Mar Perez-Velez
*Assistant Examiner* — Olvin Lopez Alvarez
(74) *Attorney, Agent, or Firm* — Klein, O'Neill & Singh, LLP

(57) ABSTRACT

The present invention relates to a method for providing watering or non-watering of a specific area of soil through a first plurality of irrigation valves (42). Specific irrigation parameters are measured at the specific area of soil through a second plurality of field sensors (54). A controller unit (30) is interconnected to a third plurality of control units (18). Each control unit is connected to a specific irrigation valve and/or a specific field sensor. A type declaration providing communication under a second communication protocol is transmitted from the controller unit to the third plurality of control units using a first communications protocol. A second set of instructions are transmitted from the controller (Continued)

unit to the third plurality of control units using a second communications protocol. A first set of instructions are transmitted from the controller unit to the third plurality of control units using the first communications protocol.

2 Claims, 21 Drawing Sheets

(30) Foreign Application Priority Data

| | | | |
|---|---|---|---|
| May 31, 2012 | (EP) | ..................................... | 13151075 |
| May 31, 2012 | (EP) | ..................................... | 13151081 |
| May 31, 2012 | (EP) | ..................................... | 13151083 |

(51) Int. Cl.
*G01R 31/327* (2006.01)
*E02B 5/08* (2006.01)
*G01R 27/02* (2006.01)
*H01F 7/18* (2006.01)

(52) U.S. Cl.
CPC ......... *G01R 27/02* (2013.01); *G01R 31/3278* (2013.01); *H01F 7/1805* (2013.01); *H01F 7/1844* (2013.01); *H01F 7/1877* (2013.01)

(56) References Cited

U.S. PATENT DOCUMENTS

| | | | |
|---|---|---|---|
| 4,007,458 A | 2/1977 | Hollabaugh | |
| 4,131,882 A | 12/1978 | Hallabaugh et al. | |
| 4,176,395 A | 11/1979 | Evelyn-Veere et al. | |
| 4,535,401 A | 8/1985 | Penn | |
| 5,023,787 A | 6/1991 | Evelyn-Veere | |
| 5,293,551 A | 3/1994 | Perkins et al. | |
| 5,434,774 A | 7/1995 | Seberger | |
| 5,548,210 A * | 8/1996 | Dittrich | G01R 31/3278 324/415 |
| 5,570,030 A | 10/1996 | Wightman | |
| 5,832,397 A | 11/1998 | Yoshida et al. | |
| 5,839,658 A | 11/1998 | Sarver | |
| 5,868,609 A | 2/1999 | Aaron et al. | |
| 6,017,017 A | 1/2000 | Lutz et al. | |
| 6,402,048 B1 | 6/2002 | Collins | |
| 6,633,478 B2 | 10/2003 | Parisi et al. | |
| 6,766,221 B1 | 7/2004 | Christiansen | |
| 6,823,239 B2 | 11/2004 | Sieminski | |
| 6,856,190 B2 | 2/2005 | Kihara | |
| 6,993,416 B2 | 1/2006 | Christiansen | |
| 7,084,741 B2 | 8/2006 | Plummer | |
| 7,146,255 B2 | 12/2006 | Christiansen | |
| 7,206,669 B2 | 4/2007 | Christiansen | |
| 7,421,317 B2 | 9/2008 | Christiansen | |
| 7,539,560 B2 * | 5/2009 | Boger | F15B 5/006 137/12 |
| 7,558,294 B2 | 7/2009 | Yonge, III et al. | |
| 7,619,322 B2 | 11/2009 | Gardner et al. | |
| D615,050 S | 5/2010 | Christiansen | |
| 7,843,897 B2 | 11/2010 | Casebolt et al. | |
| 8,054,838 B2 | 11/2011 | Huang et al. | |
| 8,352,088 B2 | 1/2013 | Christiansen | |
| 8,620,480 B2 | 12/2013 | Alexanian | |
| 2002/0006136 A1 | 1/2002 | Mallory et al. | |
| 2007/0043476 A1 | 2/2007 | Richards et al. | |
| 2008/0211307 A1 | 9/2008 | Gardner et al. | |
| 2009/0222140 A1 * | 9/2009 | Christiansen | G05B 19/042 700/284 |
| 2010/0192912 A1 * | 8/2010 | Wang | F02D 41/221 123/457 |
| 2010/0217545 A1 * | 8/2010 | Rajagopalan | G01R 31/06 702/58 |
| 2011/0066297 A1 * | 3/2011 | Saberi | F16K 37/0091 700/287 |
| 2012/0099239 A1 * | 4/2012 | Sagues | H01F 7/1805 361/170 |
| 2012/0143378 A1 | 6/2012 | Spears et al. | |
| 2012/0229284 A1 * | 9/2012 | Hern | A01G 25/167 340/618 |
| 2014/0328357 A1 | 11/2014 | Fredriksson et al. | |

OTHER PUBLICATIONS

Search Report from European Patent Office on co-pending EP application (EP 18188757.1) dated Feb. 25, 2019, pp. 6.
International Search Report on corresponding PCT application (PCT/EP2013/061239) from International Searching Authority (EPO) dated Nov. 5, 2013, pp. 7.
Written Opinion on corresponding PCT application (PCT/EP2013/061239) from International Searching Authority (EPO) dated Nov. 5, 2013, pp. 20.

* cited by examiner

TWO-WIRE CONTROLLING AND MONITORING SYSTEM FOR IN PARTICULAR IRRIGATION OF LOCALIZED AREAS OF SOIL

CROSS-REFERENCE TO RELATED APPLICATIONS

This application is a divisional of application U.S. application Ser. No. 14/404,837, filed on Dec. 1, 2014, which is a national phase entry, under 35 U.S.C. Section 371(c), of International Application No. PCT/EP2013/061239, filed May 31, 2013, claiming priority from European Application Nos. 12170174.2, 13151061.2, 13151075.2, 13151083.6, and 13151081.0, all filed May 31, 2012. The disclosures of the International Application and the European Applications from which this application claims priority are incorporated herein by reference in their entirety.

FEDERALLY SPONSORED RESEARCH OR DEVELOPMENT

Not Applicable

BACKGROUND

The present invention relates to a 2-wire controlling and monitoring system for in particular irrigation of localized areas of soil and a method of controlling and monitoring in particular irrigation of localized areas of soil.

DESCRIPTION OF THE RELATED ART

The most commonly known two-wire irrigation control systems, such as control systems disclosed in U.S. Pat. Nos. 4,007,458 and 4,176,395 hereby incorporated by reference, provide control of a number of remotely located irrigation or sprinkler valves from a central location by means of control signals encoded on to a single pair of power transmission lines linking a central encoder and a number of remote decoders.

The two-wire irrigation control system according to U.S. Pat. No. 4,007,458 encodes and transmits an address of a specific remotely located irrigation valve and on/off signals onto an alternating current signal (AC) by clipping half portions of the signal to represent zero values.

Similarly, the two-wire interactive irrigation control system according to U.S. Pat. No. 4,176,395 transmits data by selectively clipping the original power frequency signal during eight consecutive cycles, suppressing the power frequency signal during the following full cycle, during which time a feedback signal may be transmitted from sensors located at specific areas, then transmitting eight undistorted power frequency cycles, and suppressing the power frequency signal for one following cycle, during which time a feedback signal relating to a portable operator may be transmitted.

Both two-wire irrigation control systems according to U.S. Pat. Nos. 4,007,458 and 4,176,395 communicate to remotely located irrigation valves or decoders by clipping of the power signals consequently while performing a transmission on the power line power to the remotely located irrigation valves or decoders is significantly reduced.

Furthermore, the two-wire irrigation control systems according to U.S. Pat. Nos. 4,007,458 and 4,176,395 utilizes sinusoidal signals for transmitting power to remotely located irrigation valves or decoders. Sinusoidal signals being AC signals generally need to be converted into DC in order to drive microprocessor electronic circuitry adding total costs of the two-wire irrigation systems for the electronics incorporated in the remotely located irrigation valves or decoders.

Further similar systems are known from e.g. the applicant's own prior US patent applications and patents U.S. Pat. Nos. 6,766,221, 6,993,416, 7,421,317, 7,146,255, 7,206,669, 5,839,658, U.S. 60/779,857 and U.S. Ser. No. 12/281,968. The above mentioned US patents and patent applications are hereby incorporated by reference.

SUMMARY OF THE INVENTION

Many 2-wire controlling and monitoring systems found in the prior art do not make full use of the power bandwidth. The power bandwidth is understood to mean the ability of the 2-wire cable to deliver power from the controller/power supply to the localized irrigation control units. The theoretical maximum power bandwidth is the controller/power supply×the controller/power supply divided by 2×Rcable. The theoretical power bandwidth may thus be increased by using thicker cables. Further, a higher effective voltage may be used. It should be noted that systems operating with a sinusoidal voltage will per se have a lower power bandwidth, which typically is about 50% of the power bandwidth of an equivalent DC system. Further, the use of power electronics may reduce the power bandwidth even further since some power electronic circuits only draw power near the peaks of the sinusoidal voltage. According to the present invention, a direct current/voltage (DC) is used, which allows a maximum power bandwidth, i.e. maximum power delivered from the controller/power supply to the localized irrigation control units. Pure DC is however not feasible due to significant risk of harmful corrosion on the 2-wire cable in connection with leakage currents between the cable and the surrounding thereof. Leakage currents may occur due to small voids and damages of the cable insulation. To avoid the corrosion, an alternating DC is used. In this way, the average voltage on each of the 2-wire cables are balanced such that the average voltage is slightly below 0 volts, such that the harmful corrosion is minimized. A leakage current from the cable to earth is very harmful since the copper in the cable is dissolved (Cu to Cu++). It is an object of the present invention to allow a two-way communication between the controller/power supply and the localized irrigation control units, in which the power bandwidth is as close to 100% as possible.

The 2-wire cable may also be used for transmitting data packages between the controller/power supply and the localized irrigation control units and vice versa. The signaling on the cable is made by changing the frequency of the alternation of the DC. The alternations have a minimum influence on the total power bandwidth. In order to ensure a constant power supply from the controller/power supply to the localized irrigation control units, the controller/power supply performs the alternations, even when a data package is sent from the localized irrigation control unit to the controller/power supply. In order to achieve this, there are predetermined time periods or time windows, in which the localized irrigation control units are permitted to short circuit the cable in order to provoke an alternation at the controller/power supply and thereby form a sequence of bits, which in turn form a data package. These time windows affect the power bandwidth. These losses together with the power losses during the alternation depend on the cable network, which form the 2-wire cable. The parameters influencing the power loss are the total resistance of the cable between the controller/power supply and the specific localized irrigation control unit and the total capacity of the cable network. It is thus a further object of the present invention to determine the above mentioned parameters and to compensate for the influence on the power bandwidth. It is yet further an object of the present invention to avoid harmful corrosion due to a non-balanced 2-wire cable, which may result from a high use of the communication bandwidth. It is yet a further object of the present invention to optimize the information bandwidth between the localized irrigation control units and the controller/power supply by grouping the localized irrigation control units which transmit the same type of information.

An alternation is in the present context understood to be a change of polarity of the cables, i.e. a change from the maximum voltage to the minimum voltage of one of the two cables and the change from the minimum voltage to the maximum voltage on the other of the two cables. The communication bandwidth is understood to be a number of bits which may be transmitted between the controller/power supply and the localized irrigation control units per second. The communication bandwidth is always indicated as an average number since the exact number of bits per second depends on the number of "1 bit" and "0 bit" which are transmitted since the "1 bit" and "0 bit" require different alternation frequencies to be recognised as such. Further, the length of the individual data packages influences the information bandwidth since each data package must be initiated and terminated by a stop bit.

An object of the present invention is to provide a two-wire controlling and monitoring system for in particular controlling a plurality of controllable irrigation or sprinkler valves placed at specific localized areas, monitoring specific irrigation parameters at the specific localized areas and communicating through a two-wire cable with line and sensor decoders located at the specific localized areas while limiting above described power loss due to signaling on the two-wire cable.

A particular advantage of the present invention is utilization of a power supply signal for the operation of the controllable irrigation valves hence performing an improved power transmission within general safety specifications.

It is a further object of the present invention to be able to automatically register all of the localized irrigation control units in the controller/power supply. In this way, a so-called plug and play function may be implemented.

When the system is upgraded, i.e. the controller/power supply is exchanged for allowing a higher communication speed, the user typically has to replace all of the slow older localized irrigation control units to new and modern units which may communicate using the higher communication speed. In some cases the user may be interested in keeping some of the older units. It is thus a further object of the present invention to be able to use both new and old unit together with a new controller/power supply.

All of the localized irrigation control units are designed to operate between a maximum and a minimum voltage value. In an ideal network, the voltage on the localized irrigation control unit will be equal to the voltage of the cable and on the control unit. However, there will always be a voltage loss between the power supply and each of the localized irrigation control units due to the resistance of the 2-wire cable. In case the load of the 2-wire cable is large, there is a risk that the voltage for one or more of the localized irrigation control units falls outside the acceptable range. Since the voltage loss on the cable is depending on the instant load, i.e. the number of activated valves etc., it may defer depending on the time and position of the cable. It is therefore an object of the present invention to monitor the voltage of the localized irrigation control units.

A short circuit does not necessarily affect both of the wires of the 2-wire cable. In case one of the wires of the 2-wire cable is short-circuited, it may still affect the functionality of the whole cable. In some cases, the localized irrigation control unit may drive its solenoid with a too high current. This may be treated as a short circuit by the control unit. Such short circuit is categorized as a functional short circuit and will normally be found by aid of a test program. The test program may change the parameters of the localized irrigation control unit such that less current is drawn from the localized irrigation control unit. In the present embodiment, the voltage may be cut from the cable and again connected to the cable, where after all localized irrigation control units perform a power on initialization and the failure is removed until the next time the solenoid of the localized irrigation control unit is activated. A non-functional failure is a short circuit which is not removed by a power on initialization. Thus, a non-functional failure, if not repaired, affects the system as long as the system exists. Non-functional failure may be a failure in the 2-wire cable or in one or more of the localized irrigation control units. The failure may relate to a short circuit between the two localized irrigation control units, short circuit between one or more of the 2-wire cables to the earth. Such short circuits may be caused by moisture in the cable connections or a short circuit of the input diodes of the localized irrigation control unit. It is therefore an object of the present invention to provide systems and methods of automatically or manually decouple failed localized irrigation control units such that the remaining part of the network may continue without disturbance.

The above object, the above advantage, and the above need together with numerous other objects, advantages, and needs which will be evident from the below detailed description of the present invention are in accordance with a first aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of field sensors positioned at specific areas of the localized areas of soil, providing specific irrigation parameters and having a pair of sensor outputs, a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, a controller and power supply unit having a first set of schedules of instructions according to a first communications protocol and a second set of schedules of instructions according to a second communications protocol, the controller and power supply having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, the controller and power supply unit transmitting a type declaration to the third plurality of localized irrigation control units through the two-wire cable using the first communications protocol, the type declaration providing communication under the second communication protocol, the controller and power supply unit transmitting the second set of schedules of instructions to the third plurality of localized irrigation control units through the two-wire cable using the second communications protocol, and the controller and power supply unit transmitting the first set of schedules of instructions to the third plurality of localized irrigation control units through the two-wire cable using the first communications protocol.

According to the basic realization of the present invention, the application of two alternating DC voltage signals having respectively inverted polarity on to the two-wire cable provides an improved power transmission with respect to the prior art's application of sinusoidal voltage signals. The improvement using DC in comparison with a sinusoidal AC as used in the prior art is approximately a factor 2. Sinusoidal voltage signals, although ideal for some purposes, impose a restriction on maximum attainable power transmission during a time frame caused by the inherent shape of the voltage signal squared as compared to a square wave voltage signal squared. Furthermore, by relying on slow alternating DC voltage signals for powering of the decoders instead of relying on sinusoidal voltage signals having standard 50 Hz or 60 Hz network frequencies, a less noise sensitive and subsequently cheaper circuit may be implemented, since relatively little attention should be given to noise considerations. Additionally, the square wave structure of the alternating DC voltage signal provides an ideal platform for carrying binary information, which will be further described below.

The water pipeline characteristic of the two-wire irrigation controlling and monitoring system according to the first aspect of the present invention is wholly or partly buried under ground, or the water pipeline is placed on the ground. Parts of the pipelines being above ground level provide movable sections that may easily be moved into positions according to the conditions of the local areas. Furthermore, the water pipeline is constructed from plastic materials or metal materials such as iron, steel, copper, silver, gold or any alloys thereof in any combinations thereof. Generally, plastic tubes are favorable due to the low price in comparison with metal material pipes. Further, since plastic tubes are more flexible than metal tubes, it is possible to rearrange the layout of the pipes without causing severe expenses.

The first plurality of controllable irrigation valves may be magnetically, electrically, hydraulically or pneumatically operated. The first plurality of controllable irrigation valves are preferably electrically operated and opened by applying an inrush voltage or current signal followed by a hold voltage or current signal to the pair of valve control inputs and closed by applying no voltage or current signal to the pair of valve control inputs. The line decoders provide the inrush voltage, the hold voltage and the zero voltage to the first plurality of controllable irrigation valves by supplying from its pair of valve control outputs a pulsed alternating DC control signal to the pair of valve control inputs in accordance with the transmitted schedules of instructions. The pulsed alternating DC voltage signal defines a maximum differential voltage in the range of 25V to 90V such as ranges 27V to 80V or 30V to 70V or preferably the maximum differential voltage is 65V, defines a minimum differential voltage in the range of 0V to 5V such as ranges 0V to 3V or 0V to 1V or preferably the minimum differential voltage is 0V and defines a line decoder output pulse width in the range of 10 us to 0.1 s such as ranges 200 us to 2 ms or 800 us to 1.25 ms or preferably the line decode output pulse width is 1 ms. The line decoder output pulse width defines a first part having the maximum differential voltage and a second part having the minimum differential voltage. The pulsed alternating DC voltage signal constitutes the inrush voltage by having the first part longer than or equal to the second part during a period in the range 10 ms to 1 s such as 30 ms to 100 ms and constitutes the hold voltage by having the first part shorter than the second part during a period determined in accordance with the schedule of instructions transmitted to the line decoders by the controller and power supply unit. The parts may have any particular lengths to provide for any composition of signals generating a wide variety of average voltages, however the composition described above is optimal for driving an electrically driven irrigation valve with respect to power consumption of the line decoder.

The first pulse width of the first and second alternating DC voltage signals according to the first aspect of the present invention is equal to the second pulse width, is smaller than the second pulse width or is greater than the second pulse width. Preferably, the first pulse width is substantially equal to the second pulse width thereby constituting a square wave voltage signal.

The first alternating DC voltage signal and the second alternating DC voltage signal according to the first aspect of the present invention alternate with a frequency less than AC frequency of power networks such as 50 Hz or 60 Hz. The first pulse width of the first alternating DC voltage signal and the second alternating DC voltage signal is in the range of 1 ms to 10 s such as ranges from 200 ms to 2 s, 300 ms to 1 s, 400 ms to 800 ms, 450 ms to 550 ms, 475 ms to 525 ms or 490 ms to 510 ms, or preferably the first pulse width is 500 ms and the second pulse width of the first alternating DC voltage signal and the second alternating DC voltage signal is in the range of 1 ms to 10 s such as ranges from 200 ms to 2 s, 300 ms to 1 s, 400 ms to 800 ms, 450 ms to 550 ms, 475 ms to 525 ms or 490 ms to 510 ms, or preferably the second pulse width is 500 ms. By reducing frequency of alternation, toggling or inversion of the first and the second alternating DC voltage signals the noise sensitivity of the circuitry is reduced and furthermore the tolerances as to acceptable accuracy of pulse widths is shifted from us range to ms range.

The first alternating DC voltage signal and the second alternating DC voltage signal according to the first aspect of the present invention during the first pulse width and the second pulse width averages voltages greater than or equal to zero voltage. Alternatively, the first alternating DC voltage signal and the second alternating DC voltage signal during the first pulse width and the second pulse width averages voltages less than or equal to zero voltage. In particular, the first alternating voltage signal and the second alternating voltage signal during the first pulse width and the second pulse width averages an average voltage in the range −5V to −0.5V such as ranges −4V to −1V or −2.5V to −1.5V, or preferably the average voltage is −2V. The voltage maximum of the first and second alternating DC voltage signals according to the first aspect of the present invention is in a range from +10V to +30V, such as ranges from +13V to +19V or +14V to +17V, or preferable the voltage maximum is +15V and the voltage minimum in a range from −15V to −25V, such as ranges from −17V to −23V and −19V to −21V, or preferable the voltage minimum is −20V. By applying a numerically larger minimum voltage compared to maximum voltage off setting the average voltage below ground voltage the risk for deterioration of the two-wire cable caused by corrosion is significantly reduced since the deterioration of the two-wire cable at locations where the presence of an insulating layer around the two-wire cable has been damaged will be based on an alkaline process. The alkaline process donates electrons to the ground level due to the voltage difference and accepts a layer of ions substituting the missing electrons and thus the layer of ion creates a saturation layer at the exposed part of the two-wire cable reducing further corrosion of the two-wire.

The maximum current according to the first aspect of the present invention is in the range of 0.5 A to 5 A such as 0.75 A to 1.5 A and e.g. preferably the maximum current is 1.1 A, and the minimum current is in the range of 20 mA to 150 mA such as ranges from 30 mA to 100 mA or 35 mA to 85 mA, or preferably the minimum current is 40 mA. Additionally, the third pulse width defining a part of the alternating DC current signal is greater than the fourth pulse width, and the fourth pulse width defining another part of the alternating DC current signal is in the range of 10 us to 10 ms such as ranges from 0.5 ms to 7 ms or preferably the fourth pulse width is shorter than 5 ms. The alternating DC current signal provides low current sequences during which communication may be performed from irrigation control units placed at specific locations to the controller and power supply unit.

Communication from the controller and power supply unit to the irrigation control units placed at specific locations may consist of schedules of instructions according to the first aspect of the present invention. The schedules of instructions are transmitted onto the two-wire system by re-scaling the first pulse width or the second pulse width of the first and second alternating DC voltage signals to a fifth pulse width in the range 100 us to 49 ms such as ranges 200 us to 10 ms or 300 us to 5 ms, or preferably the fifth pulse width is 2 ms indicating a binary "1", or by re-scaling the first pulse width or the second pulse width of the first and second alternating DC voltage signals to a sixth pulse width in the range of 50 us to 9 ms such as ranges from 75 us to 2 ms or 100 us to 1 ms, or preferably the sixth pulse width is 500 us indicating binary "0". By modulating the pulse width of the first and second alternating DC voltage signals instead of clipping of portions of the voltage signals significantly improves power transmission from the controller and power supply unit to the irrigation control units while providing ingenious means for communication.

The transmitted schedules of instructions according to the first communication protocol and the schedules of instructions according to the first communication protocol comprise a type declaration determining additional content of a transmission from the controller and power supply unit to the third plurality of localized irrigation control units, an address declaration specifying content such as an address of a specific designated localized irrigation control unit of the third plurality of localized irrigation control units, and, data declaration specifying information regarding actions to be taken by the specific designated localized irrigation control unit of the third plurality of localized irrigation control units and/or a first check and a second check ensuring a safe reception of the transmission is terminated by stop signal having a seventh pulse width. The seventh pulse width is in the range of 2 ms to 70 ms such as from 5 ms to 65 ms, or preferably said seventh pulse width is 10 ms. The content of transmissions may have numerous purposes and achieve numerous tasks and provide means for performing a wide variety of transmissions comprising a plurality of information types.

The above described type declaration comprising 4 bits provides 16 optional operations such as Arbitration, Data, Control (On/Off), Broadcast, Test and Poll leaving room for still 10 possible operations which according to today's needs is sufficient. However, an increase of the transmission size of the type declaration to 8, 16 or 32 bits will even further expand the possible variety of operations.

The address of the specific designated localized irrigation control unit of the third plurality of localized irrigation control units comprises an address transmission size in the range of 0 to 128 bits such as ranges from 0 to 64 bits or 0 to 32, or the address transmission size is preferably 16 bits. The address transmission size determines the maximum number of possible communicative or addressable irrigation control units connected to the controller and power supply. If additional irrigation control units are needed for either operation of sensors or control of irrigation valves the address transmission size may be extended accordingly.

The data disclosing information regarding actions to be taken by the specific designated localized irrigation control unit of the third plurality of localized irrigation control units comprises a data transmission size in the range of 0 to 64 KBYTE. The data contained in a transmission may include information regarding timing of opening and closing of the controllable irrigation valves, however the data may include a wide variety of information.

The first check and the second check ensuring a safe reception of the transmission comprise a check transmission size in the range of 0 to 128 bits such as ranges from 0 to 64 bits or 0 to 32 bits or preferably the check transmission size is 4 bit for each of the first and second check. The first and second check provides means for checking if transmitted information has been properly received.

The controller and power supply unit according to the first aspect of the present invention comprises a microprocessor, a storage unit for storing the schedules of instructions, an output section for providing power to the two-wire cable and transmitting the schedules of instruction on the two-wire cable, and an input section for monitoring voltage of the two-wire cable. An interrupt window is initiated following a DC alternation of the first alternating DC voltage signal and the second alternating DC voltage signal and a power supply period. The power supply period is in the range of 200 us to 550 ms such as ranges from 500 us to 200 ms or 1 ms to 100 ms, or preferably the power supply time period is 5 ms and the interrupt window is in the range of 5 ms to 550 ms. The microprocessor controls the output section to apply the minimum current to the two-wire cable during an interrupt window. The interrupt window allows the sensor decoders or line decoders to perform an interrupt during which the decoders may communicate information to the controller and power supply unit.

Each of the sensor decoders and/or line decoders comprise a short circuiting circuit providing an interrupt signal during the interrupt window to the controller and power supply unit by unidirectional short circuiting the pair of control and power supply inputs hence reducing differential voltage of the two-wire cable and no interrupt signal by open circuiting the pair of control and power supply inputs. The interrupt signal is constituted by a voltage drop of the differential voltage of the two-wire cable in the range of 5V to 65V such as ranges of 15V to 60V, or preferably the voltage drop is 50V, thus the differential voltage may be 10V. Hence the voltage of the two-wire cable during the interrupt signals is negative relative to the ground voltage, e.g. −10V and therefore the alkaline process described earlier is maintained during interrupt signals. The microprocessor records the interrupt signal from at least one sensor decoder and/or line decoder of the third plurality of localized irrigation control units through the input section monitoring voltage of the two-wire cable and subsequently operates the output section to perform a DC alternation of the first alternating DC voltage signal and the second alternating DC voltage signal and operates the output section to terminate the interrupt window and apply the maximum current to the two-wire cable. Additionally, the microprocessor following a recording of the interrupt signal from at least one interrupting sensor decoder and/or line decoder of the third plurality of localized irrigation control units performs a DC alternation of the first alternating DC voltage signal and the second alternating DC voltage signal and transmits the type declaration Arbitration followed by a series of binary "1"s including an answer window for the at least one interrupting sensor decoder and/or line decoder of the third plurality of localized irrigation control units to answer as described below to the binary "1". The answer window is initiated following a DC alternation of the first alternating DC voltage signal and the second alternating DC voltage signal and a pause period, the pause period is in the range 200 us to 10 ms such as ranges 3 ms to 8 ms or 4 ms to 6 ms, or preferably the pause period is 5 ms. The answer window is in the range of 0 ms to 20 ms or preferably the answer window is shorter than 2.5 ms. The series of binary "1"s constitute an opportunity for the interrupting decoder to answer yes or no during an answer window in accordance with the interrupting decoder's address. By selecting a series of binary "1"s for obtaining the address from the interrupting decoder the shortest Arbitration transmission is achieved since in case of several interrupting decoders the decoder with the lowest address will be addressed first and decoders with higher addresses will be addressed subsequently at the next possible interrupt.

The communication time periods form a set of communication parameters which are called a communication protocol. The basic communication protocol using the longer time periods of the above ranges constitutes the first communication protocol. Older units may due to technical restrictions only be capable of using the first communication protocol allowing longer time periods. Newer units should above communicate under the first communication protocol and in addition under the second communication protocol using another set of communication time periods which may be smaller time periods. The smaller time periods are feasible using the newer units due to technical improvements which allow shorter time periods. The second communication protocol may be fixedly defined in the new units or alternatively, the new communication time parameters may be downloaded from the controller/power supply. The download itself will be made using the original communication parameters under the first communication protocol. A requirement in relation to the alternative set of parameters under the second communication protocol is that it should not be able to form valid packages for units under the first communication protocol. As stated above, the time periods in the first communication protocol are much longer than the time periods under the second communication protocol, since the main reason for using the second communication protocol is an increase in communication speed. Thus, the much quicker voltage alternations under the second communication protocol will not be able to form valid packages under the first communication protocol. A very simple method of initiating a communication sequence using the second communication protocol is by using an inadmissible type as defined by the first communication protocol.

As in the case of the interrupt signal the short circuiting circuit provides an answer signal during the answer window to the controller and power supply unit by unidirectional short circuiting the pair of control and power supply inputs hence reducing differential voltage of the two-wire cable and no answer signal by open circuiting the pair of control and power supply inputs. The answer signal is constituted by a voltage drop of the differential voltage on the two-wire cable in the range of 5V to 65V such as a range of 15V to 60V, or preferably the voltage drop is 25V or the differential voltage is 10V. Hence, the voltage of the two-wire cable during the answer signals is negative relative to ground voltage e.g. −10V and therefore the alkaline process described above is maintained during the answer window. The microprocessor interprets the answer signal as an indication of a binary "0" and no answer signal as a binary "1".

The microprocessor according to the first aspect of the present invention further controls the output section to supply the minimum current to the two-wire cable during the answer window, so as to avoid unnecessary power loss caused by answering decoders transmission of binary "0" s. As soon as the answer form the answering decoder is detected by the controller and power supply unit the controller and power supply unit applies the maximum current to the two-wire cable. Hence, the power loss is significantly reduced as compared to techniques in state of the art control irrigation systems.

The second plurality of field sensors according to the first aspect of the present invention comprises a selection of temperature sensors, humidity sensors, pressure sensors, magnetic field sensors, mechanical movement sensors, mechanical strain sensors, flow sensors, fertiliser sensors or any combination thereof. The objective of these sensors is to provide specific parameters giving a complete picture of the conditions of the specific localized areas and may further be implemented in a wide variety of ways in order to obtain specific requested information regarding the conditions of the ground. A further objective of these sensors is to provide irrigation parameters giving a complete picture of the working conditions, functionality and operation of the controllable irrigation valves.

The controller and power supply unit according to the first aspect of the present invention during a declared type of transmission of schedules of instructions requests the specific irrigation parameters from an addressed sensor decoder of the third plurality of localized irrigation control units and subsequently the controller and power supply unit transmits a series of binary "1" including the answer window for the addressed decoder to answer to the binary "1". The microprocessor records the answer signal from at least one sensor decoder of the third plurality of localized irrigation control units through the input section monitoring the voltage of the two-wire cable and operates the output section to perform a DC alternation of the first alternating DC voltage signal and the second alternating DC voltage signal and subsequently operates the output section to terminate the answer window and apply the maximum current to the two-wire cable. The term DC alternation is to be conceived as a generic term for toggle, inversion or switching between the maximum and minimum voltages of the first and second alternating DC voltage signal. By implementing the communication from the irrigation control units as described above a series of advantages are achieved. The two-wire irrigation controlling and monitoring system consumes little power during normal operation and during transmission of information between the controller and power supply unit and the irrigation control units. By accomplishing the transmission of information using a pulse width defining a binary "1" and a pulse width defining a binary "0" the two-wire irrigation controlling and monitoring system provides an undisturbed power transmission at the same time as exchange of information.

The localized irrigation control unit of the present invention provides means for irrigating of the localized areas, means for measuring of specific irrigation parameters describing the conditions of the localized areas, means for communicating with the mark sender unit and means performing communication with the controller and power supply unit. The localized irrigation control unit circuitry may be implemented for carrying out communication on a two-wire conducting cable, but may however be implemented for carrying out communication on optic cables or be implementing for carrying out communication through radio transmitted signals. The input signals comprising analogue voltage signals, analogue current signals, digital pulse count signals, digital pulse width modulation signals or digital pulse frequency modulation signals or any combinations thereof. The mark sender provides the possibility for manually controlling the operation of the controllable irrigation valves irrespective of the schedules of instructions transmitted by the controller and power supply unit. The mark sender ensures that an operator may initiate irrigation at localized areas by transmitting control signals to the controllable irrigation valve from the mobile mark sender.

The sensor decoder included in the localized irrigation control unit of the present invention comprises a field sensor power supply and field sensor signal amplifier having a pair of sensor inputs connected to a pair of sensor outputs of a specific field sensor, a control and power supply input section having pair of control and power supply inputs connected to a two-wire cable interconnecting the sensor decoder and the controller and power supply unit, a short circuiting circuit having switching means connected between the pair of control and power supply inputs, and a first microprocessor unit interconnecting the field sensor power supply and field sensor signal amplifier and the short circuiting circuit.

The line decoder included in the localized irrigation control unit according to the third aspect of the present invention comprises a control and power supply input section having a pair of control and power supply inputs connected to the two-wire cable interconnecting the line decoder and the controller and power supply unit, a valve control power output stage having at least one pair of valve control outputs connected to a pair of valve control inputs of a specific controllable irrigation valve, and a second microprocessor unit interconnecting the control and power supply input section and the valve control output.

According to a further embodiment according to the first aspect of the present invention, before transmitting the type declaration, the controller and power supply unit transmitting the second communications protocol to the third plurality of localized irrigation control units through the two-wire cable using the first communications protocol. One advantage of downloading the parameters for the second communication protocol from the controller/power supply is that the second communication protocol parameters may then be formed such that they are optimized in relation to the capacity of the cable network and cable resistance such that an optimal communication speed may be achieved. In other words, the second communication protocol may be dynamically adapted in case there is a need, since all of the units also always may be able to react on a correctly issued data sequence under the first communication protocol.

The above object, the above advantage, and the above need together with numerous other objects, advantages, and needs which will be evident from the below detailed description of the present invention are in accordance with a second aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of field sensors positioned at specific areas of the localized areas of soil, providing specific irrigation parameters and having a pair of sensor outputs, a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, a controller and power supply unit having a set of schedules of instructions and a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, provided the second plurality of field sensors and the third plurality of localized irrigation control units are disconnected from the two-wire cable, the controller and power supply unit supplying a specific constant current for alternating the first alternating DC voltage signal from a first voltage to a second voltage during a specific time period and calculating the capacity of the two-wire cable by multiplying the specific current by the time period and dividing the product by the difference between the first voltage and the second voltage.

In all systems having a 2-wire cable, there will be a capacity Ck between the individual conductors of the 2-wire cable. The capacity Ck is caused by the cable itself and various EMC capacities within the individual localized irrigation control units. In case the capacity Ck is too large, it will reduce the power band width in case the signal frequency (time period between the alternations) is too large. This is due to the fact that all of the current originating from the controller/power supply is used for recharging the total cable capacity during the alternation (within the time period Talt) instead of supplying the localized irrigation control units. The lower the cable capacity and cable resistance are, the faster the signaling can be performed. In order to optimize the signal speed and thereby be able to optimize the second communication protocol parameters optimally, it is important to be able to measure Ck. The capacity Ck influences the signaling speed between the controller/power supply and the localized irrigation control units and in addition, also influences the required width of the arbitration window (the window, i.e. time period in which the localized irrigation control units may short circuit the cable and thereby force the controller/power supply to alternate). When the localized irrigation control unit short circuits the 2-wire cable, the complete capacity Ck should be recharged to a voltage below a given level, in which the controller/power supply may register that it should alternate. In case the cable resistance Rli from the localized irrigation control unit to the controller/power supply is too large, the recharging will take too long in case also the capacity Ck is large, since the time needed for recharging is approximately 2×Rli×Ck. In order to be able to detect a short circuit, the controller/power supply is required to hold the arbitration window a longer time period and thereby further reducing the power bandwidth.

It will now be described how Ck and Rle may be measured from the controller/power supply and thereby how the minimum Taw (time period for arbitration window) and power band width may be established. In addition, it will be described how to compensate the effects of high Ck and Rli, respectively. In buried cables, which are used for field installations, there is typically a capacity of between 60 pF/m and 160 pf/m. Translated to kilometers, it will correspond to about 60 nF/km to 160 nF/km of cable. Under the present circumstances, the cable installations may be larger than 1 km such as up to 20 km of total cable length, which would correspond to a total capacity of up to 3.2 uF. In addition, the capacities from the EMC protection in the localized irrigation control unit are added to the cable capacity. The capacity from the EMC protection of the localized irrigation control unit is typically about 500 pF per unit. Thus, in a large system with e.g. 1000 localized irrigation control units over 20 km of cable, the total capacity Ck may be 3.7 uF. The complete capacity Ck should be recharged during each alternation or discharged in the arbitration window.

The capacity Ck is measured as follows: During the alternation, the controller/power supply is measuring the amount of charge Qk, which is used for recharging the capacity Ck from e.g. 0V to +20V. The capacity Ck is thereby simply calculated as Qk divided by 20V. The charge may be derived by integrating the current in the cable during the measurement. Thus, in case a constant current IM is used and the alternation takes TM seconds, the capacity Ck=(IM×TM)/20V. During the measurement, the localized irrigation control units are or should be disconnected from the 2-wire cable due to the presence of one or more diodes and electrolytic capacitors within the localized irrigation control units.

According to a further embodiment according to the second aspect, the controller and power supply unit supplies a specific low constant current, a leakage voltage being measured between the pair of control and power outputs of the controller and power supply unit and a leakage resistance in the two-wire cable being calculated by dividing the leakage voltage by the specific low constant current. Under these circumstances, it may also be required to compensate for the total leakage between the individual wires of the 2-wire cable. This leakage may in an equivalent circuit diagram be substituted by a resistor Rleak between the individual wires of the 2-wire cable and may simply be measured by the controller/power supply by using a known small current, i.e. 40 mA in the cable. After a short time period, typically less than 1 ms, the voltage on the cable will be stabilized to $B_{leak}$ and the equivalent leakage resistance may be calculated to be Rleak=Vleak/40 mA. Circuit diagrams for measuring the voltage between two wires of a 2-wire cable and for generating constant currents are shown in US 2009/0222140, which is hereby incorporated by reference.

The above object, the above advantage, and the above need together with numerous other objects, advantages and needs which will be evident from the below detailed description of the present invention are in accordance with a third aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of field sensors positioned at specific areas of the localized areas of soil, providing specific irrigation parameters and having a pair of sensor outputs, a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, a controller and power supply unit having a set of schedules of instructions and a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, the controller and power supply unit determining at the end of the third pulse width the difference between a first voltage measured between the pair of control and power outputs, and, a second voltage measured between the pair of control and power supply inputs of the sensor decoder and/or line decoder, and calculating a cable resistance by dividing the difference with the current maximum.

The total cable resistance Rli between the controller/power supply and the individual localized irrigation control units is of importance for determining the utilization of the power band width and communicating from the localized irrigation control units to the controller/power supply, but also for ensuring that the overall installation fulfils the basic requirements for the system. For example, the degeneration of the 2-wire cable between the localized irrigation control unit and the controller/power supply may be monitored continuously by monitoring Rli. It should be noticed that Rli is individually determined for each localized irrigation control unit.

A solenoid is activated by using a high current (inrush current) through the coil of the solenoid and thereafter using a low current (hold current) in order to move the solenoid and keeping the solenoid in the activated position, respectively. At the end of the inrush period, all current from the cable is delivered to the solenoid. The decoder may then measure the current in the solenoid $I_S$ and at the same time measure the actual line voltage at the decoder $V_D$ and return both these values to the controller/power supply. The controller/power supply may then calculate the actual resistance in the cable to be Rle=(Vcontroller/power supply–$V_D$)/$I_D$. Vcontroller/power supply is the output voltage of the controller/power supply. In case Vcontroller/power supply is known by the localized irrigation control unit, the localized irrigation control unit can itself calculate the resistance Rle and return the value to the controller/power supply. In this way, the decoder itself may under normal operation continuously be able to monitor Rle without involving the controller/power supply. The controller/power supply may be contacted by an interrupt in case there is a problem. The test program the same way as when the solenoid is activated during operation.

According to a further embodiment of the third aspect, the current maximum is compensated for the duty cycle used. It should then be taken into account that the solenoid will during a short time period be moved to the open position and thereby for a short time period open the valve. Circuit diagrams for measuring the coil current $I_S$ and the decoder voltage $I_D$ may be found in U.S. Pat. No. 7,421,317, which is hereby incorporated by reference. In case the decoder doesn't drive the solenoid with a 100% duty cycle during the inrush current, $I_S$ should be compensated (see e.g. U.S. Pat. No. 7,146,255, which is hereby incorporated by reference) such that the use $I_S$ is equal to the measured $I_S$×duty cycle factor N. For example assuming N to be 70% and the $I_S$ measured to be 600 mA, the $I_S$ which is used for the calculation with the 0.7×600=420 mA. According to a further embodiment of the third aspect, a test program is used for calculating the cable resistance or alternatively, the cable resistance is calculated during normal operation. For localized irrigation control units including solenoids, Rli may be monitored either during operation or during a specific test program. The advantage of measuring Rli during operation is that it must not be taken into consideration whether the valve is activated or not.

According to a further embodiment of the third aspect, the cable resistance is calculated during the arbitration window. Another method for determining Rle for all types of localized irrigation control units is described below:

A localized irrigation control unit may communicate with the controller/power supply by short circuiting the 2-wire cable in a short time period within the arbitration window. This short circuit is registered at the controller/power supply as a voltage drop on the controller/power supply output, since the controller/power supply at the same time has reduced the current in the cable to 1 W. By measuring the controller/power supply at the controller/power supply at this time period the resistance may be simply calculated by Rli=Vcontroller/power supply/1 W. This may be performed for all localized irrigation control units in order to determine all Rli or it may be performed as a true test sequence.

The above object, the above advantage, and the above need together with numerous other objects, advantages, and needs which will be evident from the below detailed description of the present invention are in accordance with a fourth aspect according to the present invention by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of field sensors positioned at specific areas of the localized areas of soil, providing specific irrigation parameters and having a pair of sensor outputs, a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, a controller and power supply unit having a set of schedules of instructions and a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, the controller and power supply unit transmitting the schedules of instructions to the third plurality of localized irrigation control units through the two-wire cable and receiving the specific irrigation parameters from the third plurality of localized irrigation control units through the two-wire cable, wherein the controller and power supply unit comprising a microprocessor, a storage unit for storing the schedules of instructions, an output section for providing power to the two-wire cable and transmitting the schedules of instruction on the two-wire cable, and an input section for monitoring voltage of the two-wire cable, the microprocessor controls the output section to apply the minimum current to the two-wire cable during an interrupt window and/or wherein each of the sensor decoders and/or line decoders comprise a short circuiting circuit providing an interrupt signal during the interrupt window to the controller and power supply unit by unidirectional short circuiting the pair of control and power supply inputs hence reducing differential voltage of the two-wire cable and no interrupt signal by open circuiting the pair of control and power supply inputs, the interrupt signal is constituted by a voltage drop of the differential voltage of the two-wire cable in the range of 5V to 65V such as a range of 15V to 60V, or preferably the voltage drop is 25V and/or wherein the interrupt window is initiated following a DC alternation of the first alternating DC voltage signal and the second alternating DC voltage signal and a power supply period, the power supply period is in the range 5 ms to 550 ms such as ranges 10 ms to 250 ms or 50 ms to 100 ms, the interrupt window being dependent on the distance between the controller and power supply unit and each of the sensor decoders and/or line decoders, the interrupt window being in the range of 0.2 ms to 10 ms or preferably the interrupt window is shorter than 1 ms.

In case a localized irrigation control unit in a system with a high Ck is located at a distant location in relation to the controller/power supply, such as the cable distance, and thereby the Rli being large, the time period $T_{AW}$ for the arbitration window may be unreasonably large. As an example, in a system having 20 km of cable over 2½ m2 and including a localized irrigation control unit LE1 which exceptionally is located 6 km from the controller/power supply, the Ck will be above 3 uF and Rle between the controller/power supply and LE1 will be about 90 Ohm. This results in a minimum time period of the arbitration window $T_{AW}$ of 2×Ck×Rle=540 us. In case this time period of the arbitration window should be used for all communication, it will result in a reduced utilization of the power bandwidth and longer communication time periods, i.e. lower communication bandwidth.

Instead, the controller/power supply may use a $T_{AW}$ of e.g. 150 us for all localized irrigation control units except LE1, i.e. corresponding to a maximum distance between the controller/power supply and all localized irrigation control units except LE1 of about 1.6 km. When communication is established with LE1, the $T_{AW}$ may be extended to 540 us. There will thus be a slightly lower power bandwidth during the communication with LE1, however, since this communication is of short duration in relation to the mandatory energy reservoir in the capacitor of the localized irrigation control unit, the energy balance is quickly re-established after the end of the communication. The communication between the controller/power supply and the other localized irrigation control units, i.e. all localized irrigation control units except only one, the short TAW of 150 us is used and thereby, the power bandwidth is optimally used.

A required time period $T_{AW}$ for the arbitration window may therefore be established for each of the localized irrigation control units. In this way, an individual $T_{AW}$ may be established for each of the localized irrigation control units and thereby, the use of the power bandwidth may be optimized. The time period TAW of the arbitration window may be established by measuring the capacity Ck and the resistance Rli as described above. When a localized irrigation control unit short circuits the 2-wire cable in order to signal the controller/power supply, it will hold the arbitration window open until a stable voltage level is reached of the output section of controller/power supply and in this way, the minimum time period $T_{AW}$ of the arbitration window may be measured and stored for the individual localized irrigation control unit. This measurement may be performed when communication is established for the first time with the individual localized irrigation control unit under the communication protocol 1. By using communication protocol 1, the time periods are fixed, i.e. $T_{AW}$ is typically more than 2 ms and therefore sufficiently long time for the arbitration window $T_{AW}$ to be established for all feasible lengths between the controller/power supply and the localized irrigation control units.

The arbitration window is the time period in which the controller/power supply lowers the supplied current in order to detect a possible response from the localized irrigation control units.

The above object, the above advantage, and the above need together with numerous other objects, advantages, and needs which will be evident from the below detailed description of the present invention are in accordance with a fifth aspect according to the present invention obtained by a two-wire controlling and monitoring system for in particular irrigation of localized areas of soil and comprising:
- a water pipeline providing water to the localized areas of soil,
- a first plurality of controllable irrigation valves each positioned at a specific area of the localized areas of soil, each connected to the water pipeline for providing watering or non-watering of the specific area of the localized areas of soil and each having a pair of valve control inputs,
- a second plurality of field sensors positioned at specific areas of the localized areas of soil, providing specific irrigation parameters and having a pair of sensor outputs,
- a third plurality of localized irrigation control units, each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs,
- a controller and power supply unit having a set of schedules of instructions and a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs,
- a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and
- wherein said maximum current and said minimum current are temporarily increased/decreased during alternation of said first and second alternating DC voltage signal.

Typically, the output section of the controller/power supply is limited to a maximum current of e.g. 600 mA or 1.1 A. These values depend on the current carrying capabilities of the 2-wire cable. A too large current will result in large voltage losses. The maximum current supplied by the controller/power supply, hereafter referred to as the maximum current, is depending on the maximum allowed current for the cables, hereafter referred to as the cable maximum current. However, in case the Ck value is high, the recharge time period $T_{ALT}$ for Ck may be very large. In case Ck is 2 uF and the maximum current is set to 600 mA, an alternation from e.g. −0.5V to +0.5V will give a total recharge time period of $T_{ALT}=(2$ uF×2×35)/0.6 A=233 us. Since the recharge time period $T_{ALT}$ will occur at each alternation, i.e. alternations from minimum voltage to maximum voltage or vice versa, there will be a reduction of the power bandwidth. By temporary increasing the maximum current on the controller/power supply and the 2-wire cable to e.g. 3 A during the actual alternation and thereafter reducing the maximum current to the above mentioned values, the alternation time period $T_{ALT}$ may be reduced to 46 us. The increased current for recharging Ck is drawn in the controller/power supply from the capacitors at the controller/power supply output section. Thus, the power supply of the controller/power supply must not be increased in order for the controller/power supply to be able to deliver the higher currents. Thus, a faster alternation is achieved by temporarily increasing the current during the alternation.

According to a further embodiment of the fifth aspect, the cable maximum current being in the range of 0.5 A to 5 A such as 0.75 A to 1.5 A, the maximum current being in the range 2-4 A, such as 3 A. The above value constitutes typical values for the maximum current and the cable maximum current.

The above object, the above advantage, and the above need together with numerous other objects, advantages, and needs which will be evident from the below detailed description of the present invention are in accordance with a sixth aspect according to the present invention obtained by a two-wire controlling and monitoring system for in particular irrigation of localized areas of soil and comprising:
- a water pipeline providing water to the localized areas of soil,
- a first plurality of controllable irrigation valves each positioned at a specific area of the localized areas of soil, each connected to the water pipeline for providing watering or non-watering of the specific area of the localized areas of soil and each having a pair of valve control inputs,
- a second plurality of field sensors positioned at specific areas of the localized areas of soil, providing specific irrigation parameters and having a pair of sensor outputs,
- a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, and the controller and power supply unit transmitting the schedules of instructions to the third plurality of localized irrigation control units through the two-wire cable and receiving the specific irrigation parameters from the third plurality of localized irrigation control units through the two-wire cable.

wherein the schedules of instructions comprise a an address of a specific designated group of localized irrigation control unit of the third plurality of localized irrigation control units, data disclosing information regarding actions to be taken by the specific designated group of localized irrigation control unit of the third plurality of localized irrigation control units.

All transmission of data from the localized irrigation control units (irrigation control units) to the controller/power supply is being controlled by the controller/power supply in the form of a polling sequence. The localized irrigation control units have a possibility of sending an interrupt to the controller/power supply and identify themselves during the arbitration window using an arbitration sequence. The transmission of data from the localized irrigation control units to the controller/power supply is thus always controlled by the controller/power supply and the localized irrigation control units may thus not communicate with the controller/power supply outside the designated arbitration windows. This type of communication is known as a polling sequence. A polling sequence may have the following structure: "stop-bit"; "type=poll"; "address of localized irrigation control unit"; "retrieve data in localized irrigation control units"; "check"; "stop-bit". The data retrieved from the localized irrigation control units are typically very small, such as 16 bits or 32 bits. Thus, the overhead, i.e. the stop-bits, the type and the address of the localized irrigation control unit, which much be sent for each communication sequence is very large compared to very small amount of data which is transmitted. Especially in case a very large amount of localized irrigation control units wish to send data during a small time period, the communication bandwidth may not be sufficient. In order to reduce the overhead, a number of localized irrigation control units may be grouped under a separate address. In this way, data may be retrieved from the whole group of localized irrigation control units at the same time without requiring the overhead for each individual localized irrigation control unit. This function is known as group-poll. Each localized irrigation control unit is thereby designated by a group-poll address and a sequence number. All localized irrigation control units within the same group has the same group-poll address, however, each localized irrigation control unit is designated an individual sequence number. As an example, 10 localized irrigation control units LE1 to LE10 having the same group-poll address may be communicated to by sending the following sequence: "stop-bit"; "type=group-poll"; "group-poll address"; "data retrieval"; "check"; "stop-bit". The data retrieval is a time period in which the data is sent from the localized irrigation control units to the controller/power supply. Data retrieval has the structure data LE1; data LE2; ... data LE10. Each localized irrigation control unit of the group of localized irrigation control units 1-10 automatically communicates to the controller/power supply in the time period corresponding to the data field corresponding to each sequence number. In this way, only one overhead is used for retrieving information from in the present case 10 localized irrigation control units. The overhead may be even smaller using the group-poll function since the group-poll address may include fewer bits due to the fact that the number of group-poll addresses will be smaller than the number of localized irrigation control unit addresses. This is so since each localized irrigation control unit must have a unique address, but may belong to a group-poll address including a plurality of localized irrigation control units. Typically, the localized irrigation control unit address is 16 bits, whereas the group-poll address comprises between 4-8 bits. Localized irrigation control units which regularly shall deliver the same type of measurement data to the controller/power supply may be grouped, such that they may be read at the same time, i.e. using only one overhead sequence. In this way, the data collection will be faster and the requirement on the information bandwidth will be reduced.

According to a further embodiment of the sixth aspect, the specific irrigation parameters from the third plurality of localized irrigation control units includes the address of the specific designated group of localized irrigation control units followed by specific irrigation parameters of each of the localized irrigation control units of the specific designated group of localized irrigation control units. In this way, even by using the group poll address, an individual irrigation control unit may be accessed. The overhead may in some cases be reduced by sending a group poll including several individual addresses compared to sending a separate package to each of the irrigation control units.

The above object, the above advantage, and the above need together with numerous other objects, advantages, and needs which will be evident from the below detailed description of the present invention are in accordance with a seventh aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of field sensors positioned at specific areas of the localized areas of soil, providing specific irrigation parameters and having a pair of sensor outputs, a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, and the controller and power supply including a register for storing a register balance value representing the difference between the accumulated time of maximum voltage of the first alternating DC voltage signal and the accumulated time of minimum voltage of the first alternating DC voltage signal or alternatively the average voltage of the first alternating DC voltage signal.

Corrosion constitutes a critical issue in relation to buried cables. In case the copper in the cable may exchange electrons and ions with the surrounding earth, corrosion may occur. There are two possible scenarios. Either, current is flowing from the cable to the earth or the current is flowing from the earth to the cable. In case the current flows from the cable to the earth, i.e. the voltage of the cable is positive in relation to earth, a very aggressive form of corrosion may occur on the cable, which may cause the cable to fail within a few days or even in extreme cases within a few hours. The resister stores a register balance value which represents the difference between the accumulated time of maximum voltage of the first alternating DC voltage signal and the accumulated time of minimum voltage of the first alternating DC voltage signal or alternatively the average voltage of the first alternating DC voltage signal in order to avoid the aggressive form of corrosion.

In order to avoid this aggressive form of corrosion, the average voltage of each of the two wire of the 2-wire cable are caused to be below 0V, preferably above −2.5V in relation to the surrounding earth. Thus, in average, a current which may be flowing due to a minor void or failure in the insulation between the 2-wire cable and the earth will flow from the earth to the cable and not vice versa. A flow of current from the earth to the cable will also result in corrosion, however, this type of corrosion is much less severe than the corrosion caused by a current from the cable to the earth.

In order for the average voltage of each of the two wires of the 2-wire cable to be below 0V and preferably below or equal to −2.5V, the voltage of each of the wires of the 2-wire cable should assume its minimum voltage and its maximum voltage approximately the same amount of accumulated time. It is thereby understood that during each alternation, one wire of the 2-wire cable is switched from the maximum voltage to the minimum voltage and the other wire is switched from the minimum voltage to the maximum voltage and that the average value of the minimum voltage and the maximum voltage is below 0, such as −2.5V. In a system in which very few or no data bits are sent, the alternations will be essentially decided by the basic system frequency and therefore, the average voltage value will be the average value of the maximum voltage and the minimum voltage for both wires of the 2-wire cable. However, in a system in which a large amount of data is sent, the average voltage of each of the wires of the 2-wire cable may be different from the average voltage of the maximum voltage value and the minimum voltage value. This is so since each bit, i.e. "0 bit", "1 bit" and "stop-bit" have a different length. The alternation frequencies are thus not fixed and there is a risk that a positive average voltage is accumulated on one of the wires, whereas the other wire is accumulating a corresponding negative voltage. Although the average voltage of both of the wires is below 0, the average voltage of each of the wires is not controlled and thus, one of the cables may have an average voltage above 0. In order to be able to control the average voltage of each of the wires of the 2-wire cable, the controller/power supply may at each alternation register the time period $T_{AP}$, which has lapsed since the last alternation and the voltage, i.e. maximum or minimum for each of the two wires. For each of the wires of the 2-wire cable, the accumulated time period in which the individual wire has been in the positive voltage $R_{ACC1}$ and the negative voltage $R_{ACC2}$ is recorded in a register of the controller/power supply. As an example, the following calculations may be made during a series of alternations:

1. Conductor 1+; Conductor 2−; $T_{AP}$=1 ms; $R_{ACC1}$=$R_{ACC1}$+1 ms; $R_{ACC2}$=$R_{ACC2}$−1 ms.
2. Conductor 1−; Conductor 2+; $T_{AP}$=0.7 ms, $R_{ACC1}$=$R_{ACC1}$−0.71115, $R_{ACC2}$=$R_{ACC2}$+0.7 ms.
3. Conductor 1+; Conductor 2−; $T_{AP}$=0.7 ms, $R_{ACC1}$=$R_{ACC1}$+0.7 ms; $R_{ACC2}$=$R_{ACC2}$−0.7 ms.

In case the alternation times are balanced, $R_{ACC1}$ and $R_{ACC2}$ will both have a similar value of above 0. However, in case there is some imbalance between the $R_{ACC1}$ and $R_{ACC2}$, it will be known in the register for how long time the imbalance has been present. In practice, a resulting of a positive voltage of one or the wires for a few seconds will not cause any harmful corrosion, however, longer time periods will result in harmful corrosion on the wire having a positive voltage.

According to a further embodiment of the seventh aspect, the first and second pulse widths are chosen such that the register balance value is equal to or approaches zero. In case there is a low utilization of the communication bandwidth, i.e. a small amount of data has been sent over the 2-wire cable, the controller/power supply will use the basic alternation frequency. The controller/power supply may thus compensate for a small imbalance between the wires of the 2-wire cable in that the basic alternation frequency is slightly changed such that one of the wires have a positive voltage for slightly longer time period than the other of the wires. In case $R_{ACC1}$ is positive, the $T_{AP}$ is made slightly shorter when the first conductor is in a positive voltage and slightly longer than conductor one is in the negative voltage. To approach zero in the present context means to be as close to zero as possible taking account the constraints of the system.

According to a further embodiment of the seventh aspect, the controller and power supply unit calculates an instruction balance value representing the difference between the accumulated time of maximum voltage of the first alternating DC voltage signal and the accumulated time of minimum voltage of the first alternating DC voltage signal according to the schedules of instructions. The resulting imbalance of each of the schedules of instructions may be predicted such that the schedules of instructions may be sent in a suitable order for minimizing the amount of corrosion.

According to a further embodiment of the seventh aspect, the controller and power supply unit transmitting the schedules of instructions to the third plurality of localized irrigation control units through the two-wire cable and the voltage of the first and second alternating DC voltage signals before the start of the transmission are chosen such that the register balance value after the transmission is equal to zero or approaches zero. In case of a higher utilization of the communication bandwidth, i.e. one or more data packages are sent over the 2-wire cable, the package may be examined in that the accumulated time period of maximum voltage and minimum voltage on the respective wires are predicted such that the voltage levels at the start of the transmission are in a position for allowing the sum of RACC1 and RACC2 to be equal to 0 or at least to approach 0. There are typically only two possible options of starting transmission, namely when a specific wire of the two wire cable is in the maximum current or minimum current. Thus, to approach zero in the present context means to start at the appropriate maximum or minimum current such that the register balance value becomes lower than using the only other starting position.

According to a further embodiment of the seventh aspect, the schedules of instructions are transmitted onto the two-wire system by re-scaling the first pulse width or the second pulse width to fifth pulse width in the range 100 us to 49 ms indicating a binary "1", or by re-scaling the first pulse width or the second pulse width to a sixth pulse width in the range 50 us to 9 ms indicating binary "0", the transmission being terminated by a stop signal having a seventh pulse width in the range 2 ms to 70 ms, the fifth, sixth and seventh pulse width being altered by no more than 10%, preferably no more than 5% such that the register balance value after the transmission is equal to zero or approaches zero. In case of a maximum utilization of the communication bandwidth, i.e. the data packages are sent constantly, the time periods for the "1 bit", "0 bit" and "stop-bit" may be slightly changed. A slight change of 5% or 10% of the length of the "1 bit", "0 bit" and "stop-bit" have no influence for the decoding of the signals, however, RACC1 and RACC2 may be influenced and caused to be 0 or approach the value 0.

The above object, the above advantage, and the above need together with numerous other objects, advantages and needs, which will be evident from the below detailed description of the present invention, are in accordance with a eight aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of field sensors positioned at specific areas of the localized areas of soil, providing specific irrigation parameters and having a pair of sensor outputs, a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, and the controller and power supply unit transmitting the schedules of instructions to the third plurality of localized irrigation control units through the two-wire cable and receiving the specific irrigation parameters from the third plurality of localized irrigation control units through the two-wire cable, wherein the schedules of instructions comprise a type declaration determining a primary address of a specific designated localized irrigation control unit of the third plurality of localized irrigation control units, the primary address of the specific designated localized irrigation control unit of the third plurality of localized irrigation control units being defined by the controller and power supply and comprises an address transmission size in the range 0 to 128 bits such as ranges 0 to 64 bits or 0 to 32, or the address transmission size preferably 16 bits, wherein the schedules of instructions comprise a type declaration determining a secondary address of a specific designated localized irrigation control unit of the third plurality of localized irrigation control units, the secondary address of the specific designated localized irrigation control unit of the third plurality of localized irrigation control units being unique, permanently predefined and comprises an address transmission size greater than the address transmission size of the primary address, the address transmission size of the secondary address being the range 0 to 256 bits such as ranges 0 to 128 bits or 0 to 64, or the address transmission size preferably 32 bits.

In a system according to the prior art, all localized irrigation control units have a 16 bit address, which is used for the communication between the controller/power supply and the localized irrigation control unit. The localized irrigation control units are typically provided with a pre-programmed address which is noted on a label on the individual unit. Despite the relatively large number of addresses which may be defined using 16 bits, it is still possible that occasionally, during installation, two different localized irrigation control units will have been assigned the same address. In such cases, one of the conflicting localized irrigation control units may be reprogrammed to another address. Alternatively, the conflicting localized irrigation control unit may be excluded. The risk of conflicting localized irrigation control units may be minimized, but not entirely excluded, by using addresses having a longer transmission size such as a 32 bit address or a 64 bit address. However, 36000 localized irrigation control units are considered to be the maximum number of units, which may be reasonably connected to a single controller/power supply and using a longer address than 16 bit for the single reason to minimize the risk of two localized irrigation control units having the same address will be considered a waste of the communication bandwidth. According to the present invention, all localized irrigation control units have a primary address being e.g. a 16 bit address and a secondary address being a longer address such as a 32 bit or even a 64 bit address. The primary address may be reprogrammed in case of a conflict while the secondary address is constant. The secondary address is unique and permanently defined within the individual unit. 64 bits allow for a very large number of addresses and thus, it may be guaranteed that even though the address is unique and permanent, i.e. no other unit in the world may have the same address, the addresses will never run out. The secondary address is only used in a specific search program, which is used for identifying all of the localized irrigation control units connected to the cable. The controller/power supply may also have a unique address, which is used for verifying the synchronization between the controller/power supply and the localized irrigation control units. Thus, each localized irrigation control unit has a reprogrammable primary address, which is used for the normal communication between the controller/power supply and the localized irrigation control units and a secondary address which is used during installation and in case of reprogramming of conflicting localized irrigation control units.

The controller/power supply uses the secondary address when identifying all of the localized irrigation control units and when collecting basic data from the localized irrigation control units. The basic data may include the primary address, the type of the unit and similarly data. The communication may be established under the first communication protocol (KP1) or the second communication protocol (KP2), however, since KP2 requires less cable capacitance and resistance, which may be unknown at the time of installation, typically KP1 is used. By using typical communication parameters under KP1 and using a 32 bit secondary address, the identification will take approximately 1 second per localized irrigation control unit. Thus, a typical installation of 500 localized irrigation control units may be installed in about 8 minutes using KP1. In this way, a total overview of the localized irrigation control units including the various parameters such as cable resistance and cable capacitance, which is used for initiation of the communication under KP2. The installation and identification process is initiated by the controller/power supply sending its address as a broad cast over a 2-wire cable network. The address of the controller/power supply is stored in the localized irrigation control units.

According to a further embodiment of the eighth aspect, the schedules of instructions comprise a type declaration determining basic data of a specific designated localized irrigation control unit of the third plurality of localized irrigation control units, the basic data including e.g. the resistance and the capacitance of the two-wire cable and/or GPS coordinates of the specific designated localized irrigation control unit. The test program which is run during the installation of the system, may in addition to determining and in case of conflict, reprogram the primary address of the individual localized irrigation control units, also have the additional function of determining the resistance and capacitance of the two wire cable as described above. Further, the test program may automatically establish the location of the individual localized irrigation control units by receiving a GPS signal as will be described below in a separate aspect.

According to a further embodiment of the eighth aspect, the schedules of instructions comprise a type declaration determining an address of the controller and power supply unit. In order to verify which localized irrigation control units are connected to which controller and power supply, the address of the connected controller and power supply may be stored in the individual localized irrigation control unit. The controller and power supply may during installation send a schedule of instructions for determining which controller and power supply the localized irrigation control unit is connected to.

According to a further embodiment of the eighth aspect, the controller and power supply unit receives the primary address and/or the secondary address through the two-wire cable. In order to avoid altogether the risk of two localized irrigation control units having the same address, the localized irrigation control units may be provided without a primary address and the primary address may be assigned by the controller and power supply during installation, i.e. when the test program is run.

The above object, the above advantage, and the above need together with numerous other objects, advantages, and needs which will be evident from the below detailed description of the present invention are in accordance with an ninth aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of field sensors positioned at specific areas of the localized areas of soil, providing specific irrigation parameters and having a pair of sensor outputs, a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, each of the localized irrigation control units further comprising a wireless communication unit for communicating with a portable communication device. Using a wireless communication unit eliminates all errors relating to malfunctioning cables and contacts. In case of data transmission between the localized irrigation control unit and the control unit, typically a wire communication is used, such as by 2-wire cable as explained above. The portable communication device is used on-site in order to reprogram the localized irrigation control unit in case of conflict or receive any information of the status of the localized irrigation control unit. It may also be used to find the exact location of the localized irrigation control unit.

According to a further embodiment of the ninth aspect, the wireless communication unit comprises a Bluetooth communication unit. The wireless communication unit may be configured to work over longer ranges, however, preferably, a short range unit is used such as a Bluetooth unit.

According to a further embodiment of the ninth aspect, the wireless communication unit comprises an RFID communication unit. Bluetooth units are similar short range radio communication units and require power in order to work. Thus, preferably a radio frequency identification (RFID) unit is used as a wireless communication unit.

According to a further embodiment of the ninth aspect, the wireless communication unit communicates in the frequency range 10 MHz to 20 MHz, such as 13.45 MHz to 13.65 MHz. RFID is available in different frequency ranges, however, preferably the so-called mid-frequency range around 13.56 MHz is used. This frequency range is compatible with near field units such as Smartphones. However, other portable units are equally feasible.

According to a further embodiment of the ninth aspect, the wireless communication unit transmits an address of the specific designated localized irrigation control unit of the third plurality of localized irrigation control units to the portable communication device or vice versa.

According to a further embodiment of the ninth aspect, wherein the address comprises an address transmission size in the range of 0 to 128 bits, such as ranges from 0 to 64 bits or 0 to 32, the transferred data is typically the 16 bit address of the localized irrigation control unit or the 32-64 bit secondary address. It may also be possible to reprogram the localized irrigation control unit, such as establishing a new 16 bit primary address. The 16 bit address may also be reprogrammed from the controller using the secondary address and the 2-wire cable as described above. Further, the identity, i.e. the name used on the user level or the localized irrigation control unit may be sent from the portable communication device to the localized irrigation control unit. The name of the unit may then be given directly on location. The logical link between the identification, the address and the location is then automatically established using the hand held communication device. The controller may then retrieve this information using the 2-wire cable.

According to a further embodiment of the ninth aspect, the portable communication device includes a GPS receiver and wherein the portable device transmits GPS coordinates corresponding to the specific area of the localized areas of soil to the localized irrigation control unit. During the installation of the localized irrigation control unit, it is possible to register the geographic position of the unit, i.e. GPS coordinates using a GPS receiver in the hand held communication device. A GPS receiver is included in almost modern Smartphones. Typically, the valve is located at the same position as the localized irrigation control unit, however, in case the valve is located at a different location, or in case several valves are connected to a single localized irrigation control unit, the GPS coordinates or each valve must be registered in the localized irrigation control unit. In the present embodiment, it is intended for up to seven sets of GPS coordinates to be stored in a localized irrigation control unit, i.e. six coordinates representing valves and one set of coordinates representing the location of the localized irrigation control unit. The GPS coordinates are transmitted from the portable communication device using wireless technology such as RFID to the localized irrigation control unit. Hereafter, all relevant location data is stored in the localized irrigation control unit and may be transmitted to the controller using a 2-wire cable. In this way, the hand held communication device is used as a programming device and not for retrieving any information. It is further contemplated that for some embodiments, which do not require the transmission of GPS coordinates, it is sufficient to use a barcode, such as 1D or 2D barcodes. Conversely, data may also be transmitted from the localized irrigation control unit to the portable communication device.

According to a further embodiment of the ninth aspect, the two-wire controlling and monitoring system further comprises a controller and power supply unit having a pair of control and power outputs supplying power and a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, the GPS coordinates are transmitted via the two-wire cable from each of the third plurality of localized irrigation control units to the controller and power supply unit. In case of data transmission between the localized irrigation control unit and the control unit, typically the 2-wire cable is used. This is the case during normal operation, however, during installation and testing, a dedicated portable device may be used. In addition to the communication using the 2-wire cable, each localized irrigation control unit may also communicate using the wireless communication unit in case of malfunctioning of the two wire cable.

According to a further embodiment of the ninth aspect, the GPS coordinates are displayed on a screen, preferably in conjunction with a map software such as Google Earth. When all data in relation to location and address have been collected for all localized irrigation control units, the position of each localized irrigation control unit may be visualized by the controller using Google Earth or a similar mapping software. In this way, the user may visually determine the location of each localized irrigation control unit and/or valve. In order to achieve this, the controller should store at least the GPS coordinates and the corresponding address or identification of the localized irrigation control unit. The geographic coordinates are then mapped onto the mapping software such as Google Earth. The user may then directly establish a suitable ID for a specific localized irrigation control unit. Further, the units may be grouped in a suitable mode.

The above object, the above advantage, and the above need together with numerous other objects, advantages, and needs which will be evident from the below detailed description of the present invention are in accordance with an ninth aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of localized irrigation control units each comprising a line decoder having a pair of valve control outputs connected to the pair of valve control inputs of a specific controllable irrigation valve of the first plurality of controllable irrigation valves for providing valve control signals to the first plurality of controllable irrigation valves, the line decoder further each having a pair of control and power supply inputs for communicating with a controller and power supply over a two-wire cable, the specific controllable irrigation valve of the first plurality of controllable irrigation valves comprises a solenoid connected to the valve control inputs, a core operable between a first position and a second position, and a piston connected to the core, the line decoder defining an inrush DC voltage level signal for forcing the core into the second position, the line decoder defining a hold DC voltage level signal for retaining the core in the second position, the line decoder determining the first position or the second position of the core and measuring a self inductance value and a resistance value of the solenoid, and the line decoder transmitting the self inductance value and the resistance value to the controller and power supply via the two-wire cable or alternatively monitors the self inductance value and the resistance value and signals the controller and power supply in case any of the self inductance value and the resistance value is outside a predetermined range.

The solenoid in the valve is constantly degenerated due to e.g. moisture and lightning. This degeneration may eventually affect the function of the solenoid and thereby the valve. It is thus an object of the present invention to constantly monitor the quality of the solenoid. This may be done in the localized irrigation control unit by using the decoder, which monitors the status of the connected solenoid by measuring the self-induction and the resistance of the solenoid. The solenoid, which is severely degenerated may not only cause problems related to its own function, i.e. difficulties in opening and closing of the valve; it may also affect the whole network, e.g. a partially short circuited solenoid may require large amounts of power and possibly cause the network to be overloaded. The degeneration of a solenoid may be sudden such as after a lightning strike, however, most often the degeneration is caused by moisture, which is slowly entering the valve. The performance of the valve will then be worse over time. The monitoring of the degeneration of a solenoid which is partially degenerated may be exchanged before any severe problems such as a complete malfunction occurs. The monitoring and reporting of the degeneration of the solenoid may be performed in several modes. One mode is to monitor the degeneration autonomously within the localized irrigation control unit and in case the degeneration exceeds certain trigger levels or ranges, the localized irrigation control unit reacts by transmitting a data package to the controller/power supply. For this the interrupt system may be used. Alternatively, the degeneration of the solenoid is reported to the controller/power supply by a request of the controller/power supply. The localized irrigation control unit may also respond to a request of e.g. opening the valve by sending a not acknowledged, as described in e.g. U.S. Pat. No. 7,421,317. The monitoring may also be controlled completely by the controller/power supply, which continuously collects and evaluates measurement from the relevant localized irrigation control units and thereafter reacts by e.g. sending a warning to the user. The two most important electrical parameters of the solenoid is its self-induction and its resistance, i.e. the electrical resistance of the copper wire of the solenoid. Both of these values should be essentially constant over time when proper concern is taken of temperature (the resistance of copper will vary about 0.43% per centigrade) and that the self-induction is depending on the current which flows through the solenoid, the position of the solenoid core and the frequency used for the measurement. When moisture is entering the valve, there will typically be a short circuit between two or more windings of the solenoid, which in turn causes an induction of both the resistance and the self-induction. In case the connections between the localized irrigation control unit and the solenoid degenerates, e.g. water accumulating in the connectors etc., the resistance will normally increase while the self-induction remains unchanged. In this way, the type of failure may be determined. The mode of measuring the resistance and self-induction may be found in US 2009/0222140.

The above object, the above advantage, and the above need together with numerous other objects, advantages and needs, which will be evident from the below detailed description of the present invention are in accordance with a tenth aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of field sensors positioned at specific areas of the localized areas of soil, providing specific irrigation parameters and having a pair of sensor outputs, a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs, a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, and the sensor decoder and/or the line decoder measuring a voltage value on the control and power inputs, and the sensor decoder and/or line decoder transmitting the voltage value to the controller and power supply via the two-wire cable or alternatively the sensor decoder and/or line decoder monitors the voltage value and signals the controller and power supply in case any of the voltage value is outside a predetermined range.

The monitoring and reporting of the voltage value of the localized irrigation control unit input may be performed in several ways similar to the monitoring of the solenoid resistance and self-inductance as described above. It may be autonomous within the localized irrigation control unit constantly monitors the voltage of the input capacitor. In case the voltage of the input capacitor falls below a specific voltage figure point or voltage range, the localized irrigation control unit sends the data package to the controller/power supply, e.g. by using the interrupt system as described above, or alternatively following a request of the controller/power supply. Optionally, the localized irrigation control unit may refuse to open a valve and/or performing any tasks in case the voltage is not within the prescribed range and instead it may issue the command: 'Not acknowledged', as described in e.g. U.S. Pat. No. 7,421,317. The monitoring may also be completely controlled by the controller/power supply, which collects measurement data regularly from a relevant localized irrigation control unit. Typically, only the localized irrigation control units at the end of a cable network must be monitored since such units will be most affected by an overloaded network. The controller/power supply may then itself react in a proper manner to the voltage measurement, e.g. by issuing a warning to the user or closing some of the valves in order to reduce the power consumption.

The above object, the above advantage, and the above need together with numerous other objects, advantages and needs, which will be evident from the below detailed description of the present invention are in accordance with an eleventh aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, a second plurality of localized irrigation control units each comprising a line decoder having a pair of valve control outputs connected to the pair of valve control inputs of a specific controllable irrigation valve of the first plurality of controllable irrigation valves for providing valve control signals to the first plurality of controllable irrigation valves, the line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, and a two-wire cable interconnecting the controller and power supply unit and the third plurality of localized irrigation control units and connecting the pair of control and power outputs of the controller and power supply unit to the control and power inputs of the third plurality of localized irrigation control units in a parallel connection, the two-wire cable including one or more line circuit breakers in a series connection for automatically interrupting the connection between at least one of the pair of control and power outputs of the controller and power supply unit and at least one of the control and power inputs of at least one of the third plurality of localized irrigation control units.

The cable network is sectioned by including a switch at suitable locations in the 2-wire cable in the series between the controller/power supply and the localized irrigation control units. In a network, in which one of the wires of the 2-wire cable has the same voltage as the surrounding earth and thus not actively aiding the signaling, it will be sufficient to include a switch only in the other active wire of the 2-wire cable. In networks, in which both wires actively participate in the signaling, a switch should be included in each of the two wires of the 2-wire cable. Depending on the system, the switch represents an interruption of one or both of the wires of the 2-wire cable. The switches should operate automatically, i.e. when the current exceeds a trigger point, the switch should be activated. Some of the switches used in the prior art may only be operated manually and may not be capable of handling the excessive currents generated during a lightning strike. The switch will hereafter be called Line Circuit Breaker or LCB. The Line Circuit Breaker may be considered to be a localized irrigation control unit, which is capable of receiving and transmitting data over the 2-wire cable. The LCB may be placed anywhere in the network, i.e. also on the output of the controller/power supply between the controller/power supply and one of the localized irrigation control units or between two localized irrigation control units.

The LCB is capable of interrupting the electrical connection in the 2-wire cable at the location of the LCB. The advantage of a loop configuration is that a failed section of the loop may be completely isolated by opening two of the LCB's. For this purpose, the LCB-L is used. The LCB-L does not have a difference between input and output, i.e. is bi-directional. The LCB-L is more complex and more expensive to produce than the LCB-C. The LCB-C has and input side, which is always oriented towards the controller/power supply and an output side, which is oriented away from the controller/power supply and towards a localized irrigation control unit. However, any LCB-C may also be replaced by an LCB-L. Both types of LCB's will after a power on be set in the open position.

According to a further embodiment of the eleventh aspect, the line circuit breaker automatically interrupts in case the current in the two wire cable exceeds a trigger level. The localized irrigation control units which are causing an overload or short circuit will be automatically decoupled such that the rest of the system may continue to work. The trigger level is chosen to correspond to the maximum current at which the 2-wire cable and the localized irrigation control units may be operated safely, i.e. without any risk of overheating or damaging the localized irrigation control units.

According to a further embodiment of the eleventh aspect, the line circuit breaker constitutes an LCB-C having an input oriented towards the controller and power supply unit and an output oriented against at least one of the third plurality of localized irrigation control units. As stated above, there are two types of LCB's, namely LCB-L and LCB-C. The most basic type is the LCB-C. In order to use LCB-C, the network must have a tree structure, i.e. no loops. In case an LCB-C disconnects, the cable at the output side of the LCB-C will be disconnected and unpowered. In other installations, in which a loop is used, i.e. the 2-wire cable both starts and ends at the controller/power supply, the opening of one LCB-C will not remove any overload or short circuiting the cable since the cable is connected to the rest of the network on both sides of the LCB.

According to a further embodiment of the eleventh aspect, the two-wire cable forms a loop beginning and ending at the pair of control and power outputs of the controller and power supply unit. In case a tree structure is used, a failing localized irrigation control unit in the beginning of the 2 wire cable will cause all of the localized irrigation control units located downstream of the failing localized irrigation control unit to be excluded when the LCB in front of the failing unit closes. By using a loop structure, preferably a structure in which the two wire cable both starts and ends at the pair of control power outputs, at least one failing localized irrigation control unit may be excluded from the two wire cable without interrupting any of the other localized irrigation control units connected to the same 2 wire cable.

According to a further embodiment of the eleventh aspect, the two-wire cable including at least two line circuit breakers having at least one of the third plurality of localized irrigation control units in-between themselves, the two-wire controlling and monitoring system being capable of detecting a failure of the at least one of the third plurality of localized irrigation control units by opening and closing the line circuit breakers. In case a short circuit is detected in the two wire cable, all of the affected line circuit breaker will open. The line circuit breakers are subsequently closed from the controller/power supply in an outward direction in order to determine the location of the failing localized irrigation control unit.

According to a further embodiment of the eleventh aspect, the line circuit breaker constitutes a MOSFET or a latching relay. MOSFETs and/or latching relays constitute promising embodiments for the line circuit breaker due to the fact that they have a low power consumption.

According to a further embodiment of the eleventh aspect, the two-wire controlling and monitoring system is capable of finding the location of a short circuit by supplying from the controller and power supply unit a current having a frequency of 40-100 HZ and finding the location of the short circuit by using a clamp ampere meter. The exact location of a short circuit may be found by using a clamp meter and detecting the location of the two wire cable in which the current approaches zero.

According to a further embodiment of the eleventh aspect, the line circuit breaker is protected from overvoltage by a spark gap. A spark gap may be connected in parallel with the circuit breaker to conduct high voltage peaks which should not be conducted through the line circuit breaker.

The above object, the above advantage, and the above need together with numerous other objects, advantages, and needs which will be evident from the below detailed description of the present invention are in accordance with a twelfth aspect according to the present invention obtained by a two-wire controlling and monitoring system for in particular irrigation of localized areas of soil and comprising:

a water pipeline providing water to the localized areas of soil, a first plurality of controllable irrigation valves each positioned at a specific area of the localized areas of soil, each connected to the water pipeline for providing watering or non-watering of the specific area of the localized areas of soil and each having a pair of valve control inputs, each of the first plurality of controllable irrigation valves including an activity sensor for detecting whether the controllable irrigation valve providing watering or non-watering of the specific area of the localized areas of soil, a second plurality of localized irrigation control units each comprising a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, and a two-wire cable interconnecting the controller and power supply unit and the third plurality of localized irrigation control units and connecting the pair of control and power outputs of the controller and power supply unit to the control and power inputs of the third plurality of localized irrigation control units and providing the power from the controller and power supply unit to each of the third plurality of localized irrigation control units, When a localized irrigation control unit (decoder) controls the solenoid of a valve, the localized irrigation control unit cannot ensure that the valve connected to the solenoid works correctly. The localized irrigation control unit may inform the controller/power supply that a current is sent through the solenoid and that the solenoid appears to work correctly, however, the localized irrigation control unit cannot determine whether water is expelled from the valve or not. In order to ensure the correct functioning of the valve, the localized irrigation control unit may include a sensor, which registers the functioning of the valve. The detection of an activated valve may be made in many different ways. Some of the possible ways are:

According to a further embodiment of the twelfth aspect, the activity sensor comprises a pressure sensor located at a water outlet of the controllable irrigation valve. A pressure sensor may be mounted on the outlet of the valve or in connection with an internal valve servo in the valve. When the valve is open, the pressure increases and when the valve is closed, the pressure decreases. The pressure sensor may be of an analogue type or an off-type.

According to a further embodiment of the twelfth aspect, the activity sensor comprises a moisture sensor located at a water outlet of the controllable irrigation valve, the moisture sensor being affected by water from the water outlet but protected from natural water flows such as rain. A moisture sensor may be mounted adjacent the opening of the valve such that when the valve is open, some of the water flowing out of the valve will affect the moisture sensor and when the valve is closed, the moisture sensor will be dry. The moisture sensor should thus be protected from natural water flows such as rain. This may be made by e.g. partially encapsulating the moisture sensor.

According to a further embodiment of the twelfth aspect, the activity sensor comprises a chock detector or an accelerometer. In case the valve has a nozzle which is moving such as the impact type valves, a chock detector or accelerometer may be used to detect each movement of the nozzle or an electrical contact may be used to detect the movement of the nozzle.

According to a further embodiment of the twelfth aspect, the activity sensor comprises a microphone. A microphone may be used to register the noise of the water flowing through the valve.

The above objects, the above advantages and the above features together with numerous other objects, advantages and features, which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves, each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and transmitting the schedules of instructions from the controller and power supply unit to the third plurality of localized irrigation control units through the two-wire cable and receiving the specific irrigation parameters from the third plurality of localized irrigation control units through the two-wire cable.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a first set of schedules of instructions according to a first communications protocol and a second set of schedules of instructions according to a second communications protocol by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and transmitting a type declaration from the controller and power supply unit transmitting to the third plurality of localized irrigation control units through the two-wire cable using the first communications protocol, the type declaration providing communication under the second communication protocol, transmitting the second set of schedules of instructions from the controller and power supply unit to the third plurality of localized irrigation control units through the two-wire cable using the second communications protocol, and transmitting the first set of schedules of instructions from the controller and power supply unit to the third plurality of localized irrigation control units through the two-wire cable using the first communications protocol.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and disconnecting the second plurality of field sensors and the third plurality of localized irrigation control units are disconnected from the two-wire cable, supplying a specific constant current from the controller and power supply unit for alternating the first alternating DC voltage signal from a first voltage to a second voltage during a specific time period, and calculating the capacity of the two-wire cable by multiplying the specific current by the time period and dividing the product by the difference between the first voltage and the second voltage.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and determining at the end of the third pulse width by using the controller and power supply unit the difference between a first voltage measured between the pair of control and power outputs, and, a second voltage measured between the pair of control and power supply inputs of the sensor decoder and/or line decoder, and calculating a cable resistance by dividing the difference with the current maximum.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves, each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and transmitting the schedules of instructions from the controller and power supply unit to the third plurality of localized irrigation control units through the two-wire cable and receiving the specific irrigation parameters from the third plurality of localized irrigation control units through the two-wire cable, wherein the controller and power supply unit comprising a microprocessor, a storage unit for storing the schedules of instructions, an output section for providing power to the two-wire cable and transmitting the schedules of instruction on the two-wire cable, and an input section for monitoring voltage of the two-wire cable, the microprocessor controls the output section to apply the minimum current to the two-wire cable during an interrupt window and/or wherein each of the sensor decoders and/or line decoders comprise a short circuiting circuit providing an interrupt signal during the interrupt window to the controller and power supply unit by unidirectional short circuiting the pair of control and power supply inputs hence reducing differential voltage of the two-wire cable and no interrupt signal by open circuiting the pair of control and power supply inputs, the interrupt signal is constituted by a voltage drop of the differential voltage of the two-wire cable in the range of 5V to 65V such as a range of 15V to 60V, or preferably the voltage drop is 55V and/or wherein the interrupt window is initiated following a DC alternation of the first alternating DC voltage signal and the second alternating DC voltage signal and a power supply period, the power supply period is in the range 5 ms to 550 ms such as ranges 10 ms to 250 ms or 50 ms to 100 ms, the interrupt window being dependent on the distance between the controller and power supply unit and each of the sensor decoders and/or line decoders, the interrupt window being in the range of 0.2 ms to 10 ms or preferably the interrupt window is shorter than 1 ms.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and temporarily increasing said maximum current and decreasing said minimum current during alternation of said first and second alternating DC voltage signal.

The alternation of the first and second alternating DC voltage signal will always take some time which depends on the line capacitance Ck. During the alternation, the maximum current may be increased and the minimum current may be decreased in order to shorten the alternation period.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and transmitting the schedules of instructions from the controller and power supply unit to the third plurality of localized irrigation control units through the two-wire cable and receiving the specific irrigation parameters from the third plurality of localized irrigation control units through the two-wire cable, wherein the schedules of instructions comprise a an address of a specific designated group of localized irrigation control unit of the third plurality of localized irrigation control units, data disclosing information regarding actions to be taken by the specific designated group of localized irrigation control unit of the third plurality of localized irrigation control units.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, transmitting the schedules of instructions from the controller and power supply unit to the third plurality of localized irrigation control units through the two-wire cable and receiving the specific irrigation parameters from the third plurality of localized irrigation control units through the two-wire cable, and registering in a register a balance value representing the difference between the accumulated time of maximum voltage of the first alternating DC voltage signal and the accumulated time of minimum voltage of the first alternating DC voltage signal or alternatively registering in a register the average voltage of the first alternating DC voltage signal.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, transmitting the schedules of instructions from the controller and power supply unit to the third plurality of localized irrigation control units through the two-wire cable and receiving the specific irrigation parameters from the third plurality of localized irrigation control units through the two-wire cable, wherein the schedules of instructions comprise a type declaration determining a primary address of a specific designated localized irrigation control unit of the third plurality of localized irrigation control units, the primary address of the specific designated localized irrigation control unit of the third plurality of localized irrigation control units being defined by the controller and power supply and comprises an address transmission size in the range of 0 to 128 bits such as ranges from 0 to 64 bits or 0 to 32, or the address transmission size is preferably 16 bits, and wherein the schedules of instructions comprise a type declaration determining a secondary address of a specific designated localized irrigation control unit of the third plurality of localized irrigation control units, the secondary address of the specific designated localized irrigation control unit of the third plurality of localized irrigation control units being unique, permanently pre-defined and comprises an address transmission size greater than the address transmission size of the primary address, the address transmission size of the secondary address being the range 0 to 256 bits such as ranges 0 to 128 bits or 0 to 64, or the address transmission size is preferably 32 bits.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing a water pipeline providing water to the localized areas of soil, providing a first plurality of controllable irrigation valves each positioned at a specific area of the localized areas of soil, each connected to the water pipeline for providing watering or non-watering of the specific area of the localized areas of soil and each having a pair of valve control inputs, providing a second plurality of field sensors positioned at specific areas of the localized areas of soil, providing specific irrigation parameters and having a pair of sensor outputs, providing a third plurality of localized irrigation control units each comprising a sensor decoder having a pair of sensor inputs connected to the pair of sensor outputs of a specific field sensor of the second plurality of field sensors for providing power to the second plurality of field sensors and recording the specific irrigation parameters from the second plurality of field sensors and/or a line decoder having a pair of valve control outputs connected to the pair of valve control inputs of a specific controllable irrigation valve of the first plurality of controllable irrigation valves for providing valve control signals to the first plurality of controllable irrigation valves, the sensor decoder and the line decoder further each having a pair of control and power supply inputs, each of the localized irrigation control units further comprising a wireless communication unit providing a portable communication device, and communicating between the portable communication device and the wireless communication unit.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing a water pipeline providing water to the localized areas of soil, providing a first plurality of controllable irrigation valves, each positioned at a specific area of the localized areas of soil, each connected to the water pipeline for providing watering or non-watering of the specific area of the localized areas of soil and each having a pair of valve control inputs, providing a second plurality of localized irrigation control units each comprising a line decoder having a pair of valve control outputs connected to the pair of valve control inputs of a specific controllable irrigation valve of the first plurality of controllable irrigation valves for providing valve control signals to the first plurality of controllable irrigation valves, the line decoder further each having a pair of control and power supply inputs for communicating with a controller and power supply over a two-wire cable, the specific controllable irrigation valve of the first plurality of controllable irrigation valves comprise a solenoid connected to the valve control inputs, a core operable between a first position and a second position, and a piston connected to the core, defining in the line decoder an inrush DC voltage level signal for forcing the core into the second position, defining in the line decoder a hold DC voltage level signal for retaining the core in the second position, determining by means of the line decoder, the first position or the second position of the core, measuring a self inductance value and a resistance value of the solenoid, and transmitting by means of the line decoder the self inductance value and the resistance value to the controller and power supply via the two-wire cable or alternatively monitoring the self inductance value and the resistance value and signals in the controller and power supply in case any of the self inductance value and the resistance value is outside a predetermined range.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, measuring a voltage value on the control and power inputs by using the sensor decoder and/or the line decoder, and transmitting the voltage value from the sensor decoder and/or the line decoder to the controller and power supply via the two-wire cable or alternatively monitoring the voltage value and signals the controller and power supply in case any of the voltage value is outside a predetermined range.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing a water pipeline providing water to the localized areas of soil, providing a first plurality of controllable irrigation valves each positioned at a specific area of the localized areas of soil, each connected to the water pipeline for providing watering or non-watering of the specific area of the localized areas of soil and each having a pair of valve control inputs, providing a second plurality of localized irrigation control units each comprising a line decoder having a pair of valve control outputs connected to the pair of valve control inputs of a specific controllable irrigation valve of the first plurality of controllable irrigation valves for providing valve control signals to the first plurality of controllable irrigation valves, the line decoder further each having a pair of control and power supply inputs, providing a controller and power supply unit having a set of schedules of instructions and having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable interconnecting the controller and power supply unit and the third plurality of localized irrigation control units and connecting the pair of control and power outputs of the controller and power supply unit to the control and power inputs of the third plurality of localized irrigation control units in a parallel connection, providing one or more line circuit breaker in the two-wire cable in a series connection, and interrupting the connection between at least one of the pair of control and power outputs of the controller and power supply unit and at least one of the control and power inputs of at least one of the third plurality of localized irrigation control units by using the one or more line circuit breakers.

The above objects, the above advantages and the above features together with numerous other objects, advantages and features which will be evident from the below detailed description of a preferred embodiment of the present invention is according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, each of the first plurality of controllable irrigation valves including an activity sensor for detecting whether the controllable irrigation valve providing watering or non-watering of the specific area of the localized areas of soil, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and transmitting the schedules of instructions from the controller and power supply unit to the third plurality of localized irrigation control units through the two-wire cable and receiving the specific irrigation parameters from the third plurality of localized irrigation control units through the two-wire cable.

The above objects, the above advantages and the above features together with numerous other objects, advantages and features, which will be evident from the below detailed description of a preferred embodiment of the present invention are according to a further aspect of the present invention obtained by a method for controlling and monitoring in particular irrigation of localized areas of soil and comprising the following steps of:

providing water to the localized areas of soil through a water pipeline, controlling discharge or supply of water from the water pipeline, providing watering or non-watering of a specific area of the localized areas of soil through a first plurality of controllable irrigation valves each positioned at the specific area of the localized areas of soil and the first plurality of controllable irrigation valves having a pair of valve control inputs, measuring specific irrigation parameters through a second plurality of field sensors positioned at the specific areas of the localized areas of soil and the second plurality of field sensors having a pair of sensor outputs, transmitting control signals to the first plurality of controllable irrigation valves and the second plurality of field sensors though a third plurality of localized irrigation control units comprising a sensor decoder and a line decoder, providing valve control signals to the first plurality of controllable irrigation valves and/or recording the specific irrigation parameters from the second plurality of field sensors, each of the third plurality of localized irrigation control units having a pair of valve control outputs connected to the pair of valve control inputs of a specific controllable irrigation valve of the first plurality of controllable irrigation valves and/or a pair of sensor inputs connected to the pair of sensor outputs of a specific field sensor of the second plurality of field sensors and having a pair of control and power supply inputs, each of the third plurality of localized irrigation control units having a register for storing a sync address, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to the first alternating DC voltage signal to another of the pair of control and power outputs and applying an alternating DC current defining a current maximum having a third pulse width and defining a current minimum having a fourth pulse width to the pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, transmitting the schedules of instructions from the controller and power supply unit to the third plurality of localized irrigation control units through the two-wire cable and receiving the specific irrigation parameters from the third plurality of localized irrigation control units through the two-wire cable, wherein the schedules of instructions comprise a type declaration determining an address of the controller and power supply, the address of the controller and power supply comprises an address transmission size in the range of 0 to 128 bits such as ranges from 0 to 64 bits or 0 to 32, or the address transmission size preferably 16 bits, each specific designated localized irrigation control unit of the third plurality of localized irrigation control units determining whether or not the address correspond to the sync address stored in the register, sending a NACK command from the specific localized irrigation control unit to the controller and power supply in case the address of the controller does not correspond to the sync address, and storing the address of the controller and power supply in the register.

In order to enable plug and play functionality, the above mentioned method of identifying and synchronizing the controller/power supply and the localized irrigation control units are used. The controller/power supply broadcasts the address of the controller/power supply. In case one of the third plurality of localized irrigation control units does not recognize the controller/power supply address, the unit is a new unit or a replaced unit and should therefore be synchronized. It should therefore respond during the arbitration window by sending a NACK command. In case the localized irrigation control unit knows the address of the controller/power supply, the localized irrigation control unit does not respond. In case the localized irrigation control unit responds, the synchronization process may be initiated, i.e. the address of the controller and power supply may be stored in the register of the localized irrigation control unit and further data may be exchanged between the localized irrigation control unit and the controller and power supply, such as the address of the localized irrigation control unit which may be stored in the controller and power supply. Thus, only non-synchronized localized irrigation control units participate in the synchronization process, which thus is capable of immediately finding new or replaced localized irrigation control units. It should be noticed that, in case the controller/power supply is being replaced, e.g. due to a reparation, the new controller/power supply will use a different address, which should be unique and thus, the new synchronization of the complete network will automatically be initiated.

The methods according to the further aspects of the present invention describes operation of a two-wire controlling and monitoring system which includes any of the above discussed features and provides a method for achieving significant reductions in power consumption relative to today's state of the art.

DETAILED DESCRIPTION OF THE DRAWINGS

Figure 1:
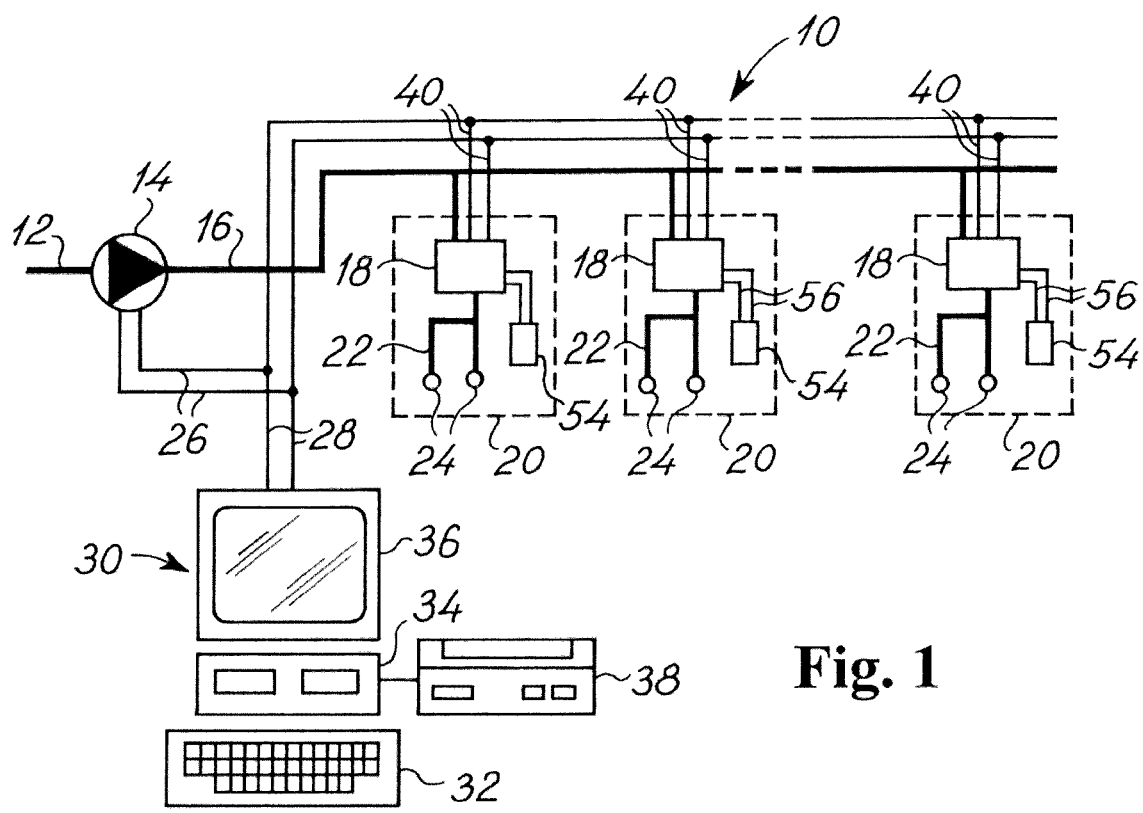
FIG. 1 shows a schematic overview of the two-wire controlling and monitoring system according to an embodiment of the present invention.

The two-wire controlling and monitoring system designated by numeral 10 in its entirety and shown in FIG. 1, provides irrigation of localized areas, e.g. a golf course having certain areas needing a particular amount of irrigation and others a smaller amount of irrigation, parks having tree sections, lawns or flower beds all needing particular amounts of irrigation, greenhouse production lines having a series of production steps for plants, flowers or vegetables all needing a particular amount of irrigation or farming fields having a variety of produce needing a variety of amounts of irrigation.

The two-wire controlling and monitoring system 10 has an inlet connection 12 supplying water from a general household water pump station or a water tank to a pump 14. The pump 14 is mechanically, pneumatically, hydraulically, electrically or magnetically driven or driven by combinations thereof and provides a water pressure on a water pipeline 16 enabling the water pipeline 16 to supply water to a plurality of localized irrigation control units 18 positioned at a series of localized areas of soil 20.

The water pipeline 16 may be constructed from metal pipes produced in materials such as iron, steel, copper, aluminum, silver, gold or any alloys thereof and/or plastic pipes produced in materials such as PVC, PP or PE or any combinations thereof.

The localized irrigation control units 18 are positioned at the series of localized areas of soil 20 and provide irrigation to specific areas of each of the localized areas of soil 20 through a plurality of local pipelines 22 possibly mounted with sprinkling gadgets 24. The localized irrigation control units 18 utilises connections 40 and the pump 14 utilizes connections 26 to communicate through a two-wire cable 28 interconnecting a controller and power supply unit 30 with the plurality of localized irrigation control units 18 and the pump 14. The controller and power supply unit 30 transmits power and schedules of instructions to the plurality of localized irrigation control units 18.

The controller and power supply unit 30 comprises a keyboard 32 for a user to communicate schedules of instructions i.e. controlling timing of irrigation and position of irrigation to be stored and executed by a computer 34. The controller and power supply unit 30 further comprises a monitor 36 for displaying the operation of the two-wire controlling and monitoring system 10 and a printer 38 for printing out information from the computer 34. The computer 34 may include a an internal or external modem through which remotely monitoring and controlling of the computer 34 is achieved and thereby remotely monitoring and controlling of the controller and power supply unit 30. The computer 34 may further have access to internet facilities which similarly provides the possibility for remotely monitoring and controlling of the computer 34 and thereby the controller and power supply unit 30. Additionally, a series of computers for example operating irrigation monitoring and controlling systems like the computer 34 may be monitored and controlled from a central unit located at any position world-wide hooked up to the internet or connecting to the series of computers through use of modems.

Figure 2:
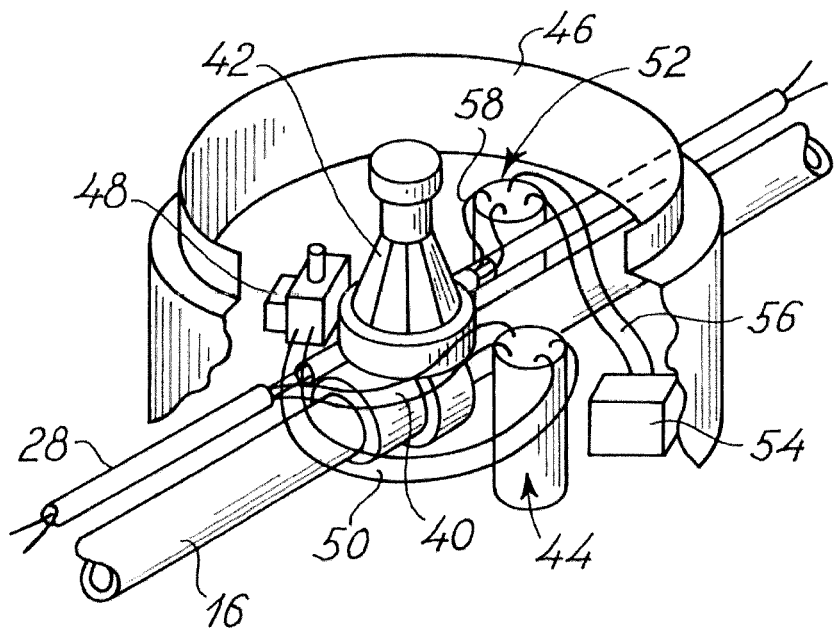
FIG. 2 shows in perspective a localized irrigation control unit according to the preferred embodiment of the present invention and interconnecting a two-wire cable and a controllable irrigation valve in communication with a water pipeline, and the localized irrigation control unit further being connected to a field sensor.

The localized irrigation control units 18 are situated in a house or cabinet 46, shown in FIG. 2, made of a wear resistant material such as metals like aluminium or steel or plastics like PVC, PP or PE. The house 46 protects the localized irrigation control units 18 from any hostile environment the house is positioned in.

Each of the localized irrigation control units 18, as shown in FIG. 2, may comprise a controllable irrigation valve 42 controlling release of water from the water pipeline 16 and a line decoder 44 transmitting the necessary schedules of instructions to the controllable irrigation valve 42.

The controllable irrigation valve 42 may be magnetically, electrically, hydraulically or pneumatically operated or combinations thereof, however, according to the presently preferred embodiment of the invention the controllable irrigation valve 42 is electrically operated through connectors placed in a connector box 48 in the house 46. The connector box 48 comprises a solenoid, which controls the valve in an open or closed position. Variations of current applied to the solenoid causes the induction of magnetic fields, which subsequently activate the valve.

Figure 5:
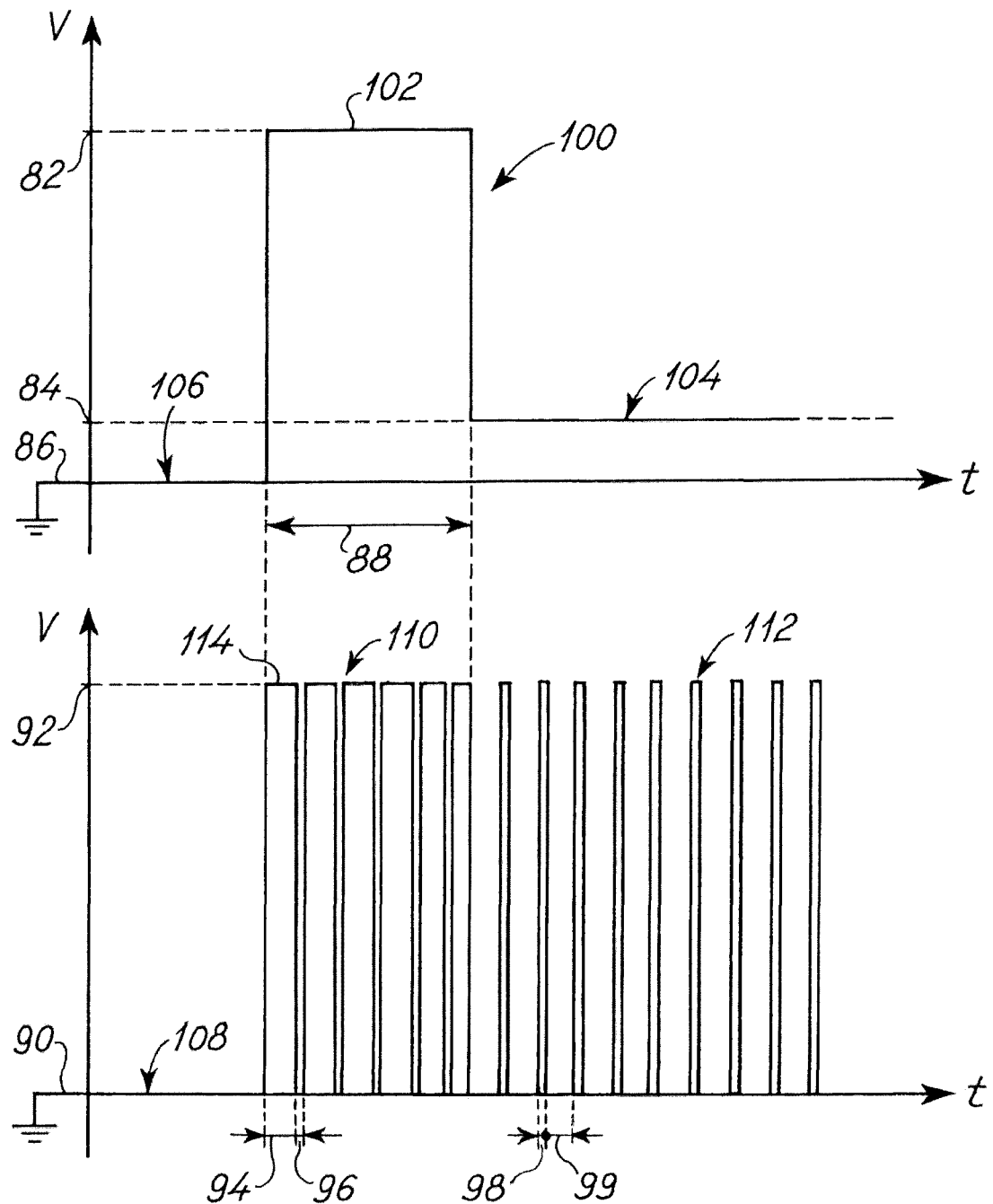
FIG. 5 shows a control voltage signal versus time provided by a line decoder in one of the localized irrigation control units to one of the controllable irrigation valves.

The line decoder 44 receives transmissions of schedules of instructions from the controller and power supply unit 30 through the two-wire cable 28. A pair of control and power inputs 40 connects the line decoder 44 to the two-wire cable 28. A pair of valve control outputs 50 connects the connector box 48 to the line decoder 44. The line decoder 44 applies control signals 100 to the connector box 48 through the pair of valve control outputs 50, which control signals 100, described in further detail below with reference to FIG. 5, are further communicated by the connector box 48 to the controllable irrigation valve 42. Alternatively the line decoder 44 may receive start instructions through radio transmissions produced by a mobile handhold mark sender providing the opportunity to initiate irrigation at specific localized areas regardless of schedules of instructions. This enables manual control of the controllable irrigation valves 42.

The localized irrigation control unit 18 further comprises a sensor decoder 52, as shown in FIGS. 1 and 2, recording a specific irrigation parameter from a field sensor 54 through a pair of sensor outputs 56 and providing a conversion of the specific irrigation parameter measured by the field sensor 54 to a binary number and additionally performing a transmission of the binary number to the controller and power supply unit 30. The sensor decoder 52 is connected to the two-wire cable 28 through a pair of control and power inputs 58. The specific irrigation parameters may be soil or air temperature, soil or air humidity, water pressure in the water pipeline 16, water flow in the water pipeline 16 or water flow through one of the controllable irrigation valves 42. Furthermore, the specific irrigation parameters may be mechanical movement, mechanical strain or magnetic fields which may be utilized for the determination of the functionality or operation of the controllable irrigation valves 42.

Figure 3:
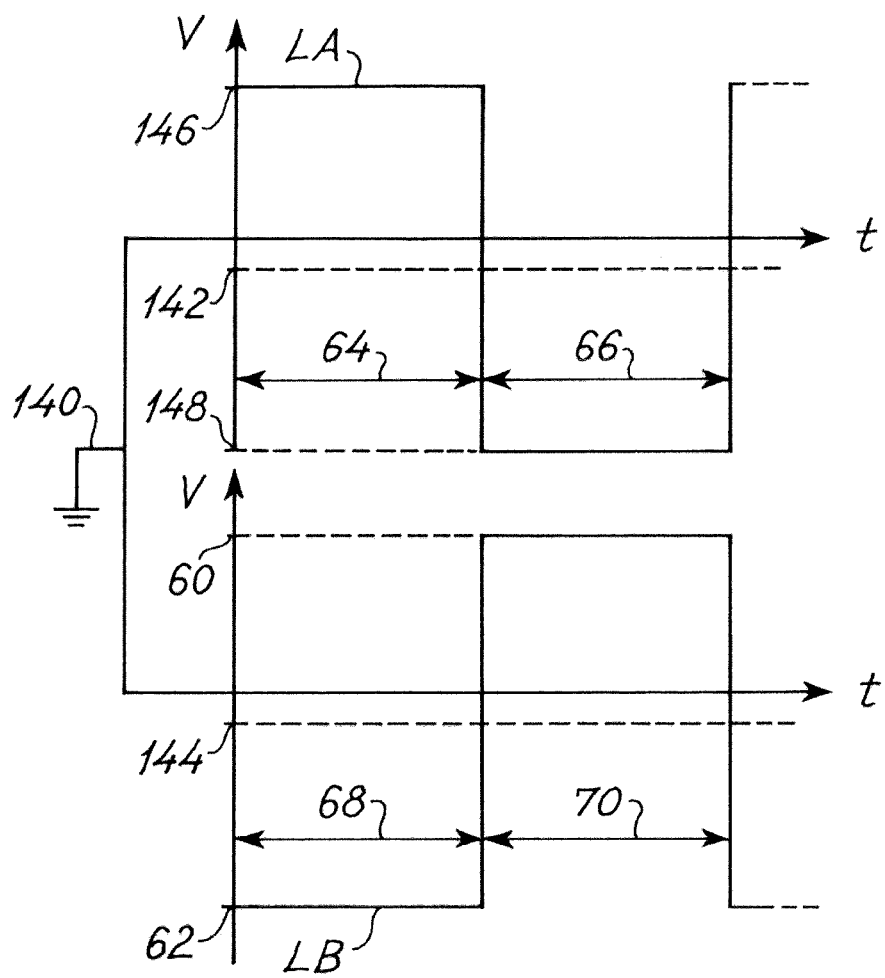
FIG. 3 shows alternating DC voltage signals versus time provided from a controller and power supply unit on the two-wire cable to at least one of the localized irrigation control units.

The line decoder 44 and the sensor decoder 52 receive power through the two-wire cable 28 from the controller and power supply unit 30. FIG. 3 shows voltage versus time curves of a first alternating DC voltage signal, designated by LA, and a second alternating DC voltage signal, designated by LB, simultaneously provided by the controller and power supply unit 30 to the two-wire cable 28 for powering of the line decoder 44 and the sensor decoder 52.

The first alternating DC voltage signal LA has a positive pulse with a pulse width 64 in the range 1 ms to 10 s and a negative pulse with a pulse width 66 in the range of 1 ms to 10 s. In the presently preferred embodiment of the invention, the pulse width 64 is substantially equal to 500 ms, and the pulse width 64 and the pulse width 66 are substantially equal.

The first alternating DC voltage signal LA has a maximum voltage 146 in the range of +10V to +30V and has a minimum voltage 148 in the range of −15V to −30V. In the presently preferred embodiment of the invention, the maximum voltage 146 is +15V and the minimum voltage 148 is equal to −20V.

The first alternating DC voltage signal LA is symmetrical about a line 142 indicating a negative off set voltage of the first alternating DC voltage signal LA, in the presently preferred embodiment of the invention the off set voltage is approximately −2V.

The second alternating DC voltage signal LB is inverted in comparison with the first alternating DC voltage signal LA and has a negative pulse with a pulse width 68 in the range 10 ms to 10 s and a positive pulse with a pulse width 70 in the range 10 ms to 10 s. In the presently preferred embodiment of the present invention, the pulse width 68 is substantially equal to 500 ms and the pulse width 64, the pulse width 66, the pulse width 68 and the pulse width 70 are substantially equal.

The term inverted in this context means a phase shift between the first alternating DC voltage signal LA and the second alternating DC voltage signal LB of approximately 180°.

The second alternating DC voltage signal LA has a maximum voltage 60 in the range of +10V to +30V and has a minimum voltage 62 in the range of −15V to −25V. In the presently preferred embodiment of the invention the maximum voltage 60 is equal to the maximum voltage 146 of the first alternating DC voltage signal LA, and the minimum voltage 62 is equal to the minimum voltage 148 of the first alternating DC voltage signal LA.

The second alternating DC voltage signal LA is symmetrical about a line 144, which line 144 indicates a negative off set voltage of the second alternating DC voltage signal LB. In the presently preferred embodiment of the invention, the offset voltage of the second alternating DC voltage signal is approximately equal to the offset voltage of the first alternating DC voltage signal.

By off setting the first and the second alternating DC voltage signals LA, LB with a negative voltage relative to ground 140, a substantially slower corrosion of the two-wire cable 28 is achieved. In case of negative off set, the current will run from the ground level 140 to copper material of the two-wire cable 28 resulting in an alkaline process, which is less hazardous to the copper material than an electron acceptor donating process relative to ground level 140, achieved in case of positive off set forcing the current to run from the copper material to the ground level 140.

Figure 4:
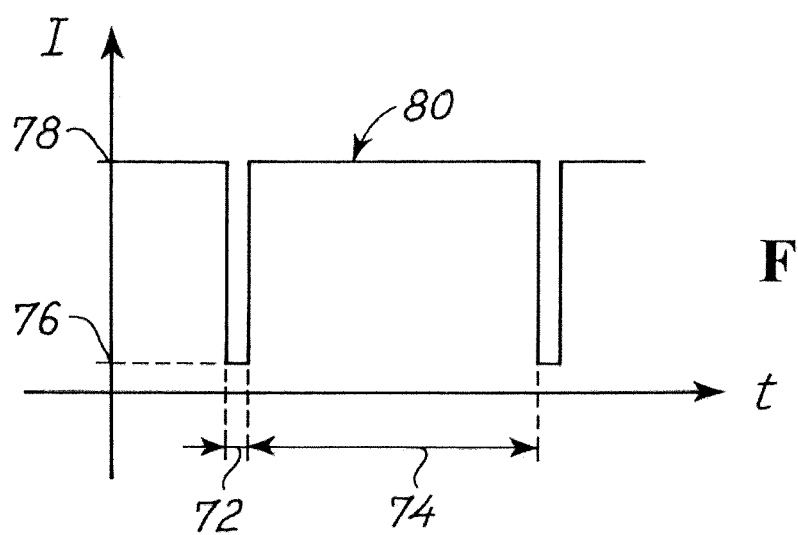
FIG. 4 shows alternating DC current signal versus time applied by the controller and power supply unit on to the two-wire cable and received by at least one of the localized irrigation control units.

FIG. 4 shows a current versus time curve of an alternating DC current signal 80 provided by the controller and power supply unit 30 between the wires of the two-wire cable 28. The alternating DC current signal 80 has a maximum current 78 in the range of 0.5 A to 5 A, and has a minimum current 76 in the range of 20 mA to 150 mA. In the presently preferred embodiment of the invention the maximum current 78 is 1.1 A and the minimum current 76 is 40 mA.

The alternating DC current signal 80 furthermore has a pulse width 72 defining the period of minimum current 76 of the alternating DC current signal 80, which pulse width 72 is in the range 25 us to 10 ms, and has a pulse width 74 defining the period of maximum current 78 of the alternating DC current signal 80. In the presently preferred embodiment of the invention the pulse width 72 is shorter than 5 ms and the pulse width 74 is lesser than 500 ms. The length of the pulse width 74 is depending on which operation is performed by the controller and power supply unit 30. In case of an Arbitration or data transferring transmission consisting of a series of binary "1" s, then the pulse width 74 is shorter than 20 ms. During normal operation the pulse width 74 however, is shorter than 500 ms.

FIG. 5 shows a voltage versus time curve of the control signal 100 provided by the line decoder 44 to the controllable irrigation valve 42. The control signal 100 consists of an inrush signal 102 and a hold signal 104. The inrush signal 102 provides a maximum voltage 82 for operating the controllable irrigation valve 42 in an open position enabling water to flow from the water pipeline 16 to the local pipeline 22 positioned in the localized areas 20. The inrush signal 102 defines a pulse width 88 in the range 10 ms to 1 s in the presently preferred embodiment of the invention the pulse width 88 is in the range 30 ms to 100 ms. When the controllable irrigation valve 42 is completely opened, the line decoder 44 changes the control signal 100 from the inrush signal 102 to the hold signal 104. The hold signal 104 has a reduced maximum voltage 84. The line decoder 44 continues to transmit the hold signal 104 as long as dictated by the schedules of instructions. As soon as the control signal is turned off 106 providing ground voltage 86 to the controllable irrigation valve 42, the controllable irrigation valve 42 closes and thereby disables the flow of water from the water pipeline 16 to the local pipeline 22.

In order to reduce power consumption of the controllable irrigation valves 42, the control signal 100 in the presently preferred embodiment of the invention is construed from a series of square wave pulses 114 constituting a pulsed inrush signal 110 and constituting a pulsed hold signal 112. The square wave pulse 114 defines a voltage maximum 92 having a pulse width 94 and defines a voltage minimum 90 having a pulse width 96 in the pulsed inrush signal 110 and defines the voltage maximum 92 having a pulse width 99 and defines the voltage minimum 90 having a pulse width 98 in the pulsed hold signal 112. According to a first embodiment of the present invention, the pulse width 94 and the pulse width 96 and the pulse width 99 are 1 ms, but may be any value in the range 10 us to 0.1 s. The pulse width 98 is 10 ms, but may be any value in the range 6 ms to 30 ms. The average voltage of the pulsed inrush signal 110 is equal to the maximum voltage 82 of the inrush signal 102 and the average voltage of the pulsed hold signal 112 is equal to the reduced maximum voltage 84 of the hold signal 104. According to a second and presently preferred embodiment of the invention and as shown in FIG. 5 the sum of the pulse widths 94 and 96 and the sum of the pulse widths 98 and 99 are 1 ms, but may be any value in the range 100 us to 0.1 s. During the pulsed inrush signal 110 the pulse width 94 is substantially larger than the pulse width 96 thereby constituting an average voltage of the pulsed inrush signal 110 equal to the maximum voltage 82 of the inrush signal 102. During the pulsed hold signal 112, the pulse width 98 is substantially smaller than the pulse width 99, thereby constituting an average voltage of the pulsed hold signal 112 equal to the reduced maximum voltage 84 of the hold signal 104.

The maximum voltage 92 of the control signal 100 in the presently preferred embodiment of the invention is 65V, but may have any value in the range of 5V to 75V. The minimum voltage 90 of the control signal 100 in the presently preferred embodiment of the invention is 0V equal to ground level 86, but may be in the range 0V to 5V.

Figure 6:
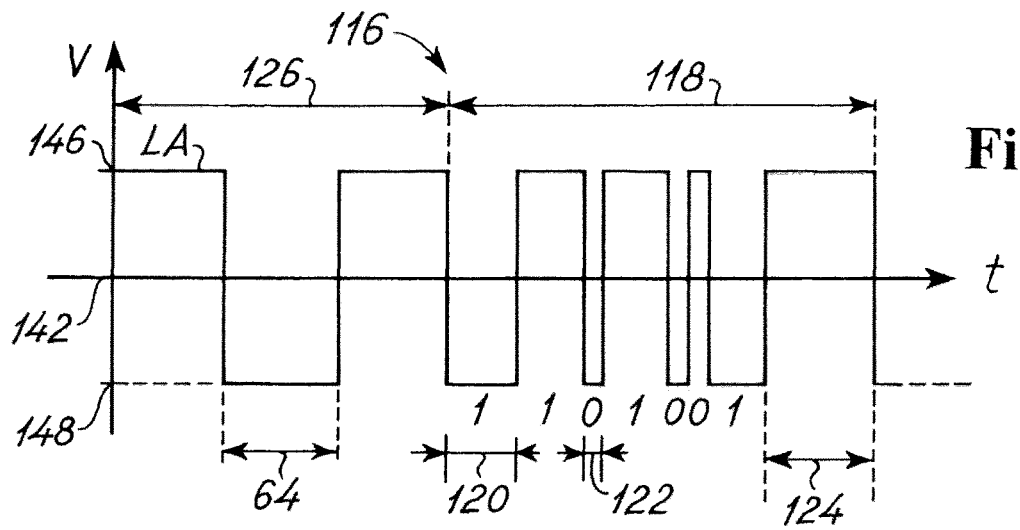
FIG. 6 shows a transmission of schedules of instructions provided by the controller and power supply unit to the localized irrigation control units.

The controller and power supply unit 30 transmits schedules of instructions simultaneously to transmitting power through the two-wire cable 28 to the line decoder 44. The schedules of instructions are transmitted to the irrigation control units 18 in a sequential binary pattern 118 construed from alternations or toggling of the first alternating DC voltage signal LA and the second alternating DC voltage signal LB. FIG. 6 shows a voltage versus time curve 116 having a normal pattern 126 where the first alternating DC voltage signal LA has the pulse width 64, the maximum voltage 146 and minimum voltage 148 and having the binary pattern 118. The sequential binary pattern 118 is provided by simultaneous alternations of the first alternating DC voltage signal LA and the second alternating DC voltage signal LB. FIG. 6 shows only the first alternating DC voltage signal for simplicity.

The binary pattern 118 defines a binary "1"s by having a pulse width 120 in the range 100 us to 49 ms and defines a binary "0"s by having a pulse width 122 in the range 50 us to 9 ms. In the presently preferred embodiment of the invention the pulse width 120 defining binary "1" is 20 ms and the pulse width 122 defining binary "0" is approximately 5 ms.

A transmission of the binary pattern 118 is concluded by a pulse width 124 defining a stop signal in the range of 2 ms to 70 ms. In the presently preferred embodiment of the invention the pulse width 124 is 60 ms.

Figure 7:
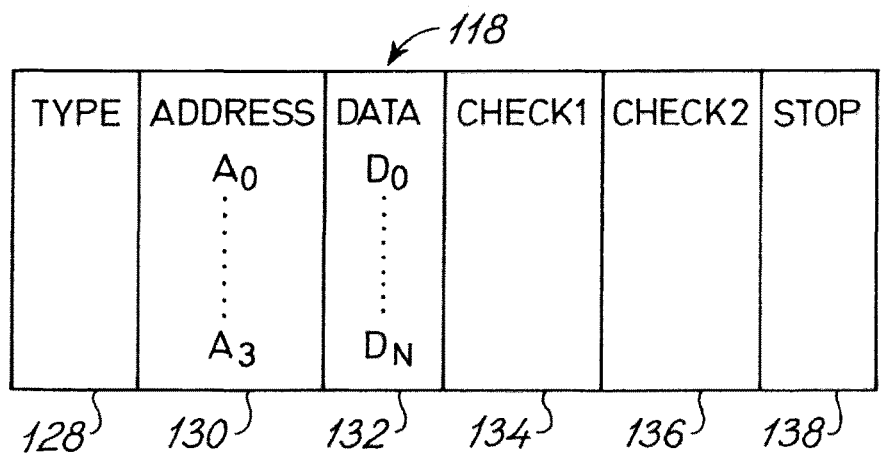
FIG. 7 shows an example of the contents of a transmission from the controller and power supply unit to the localized irrigation control units.

The transmission of schedules of instructions in the form of the binary pattern 118 from the controller and power supply unit 30 to the irrigation control unit 18 is shown as an example in FIG. 7 and according to the presently preferred embodiment of the invention, the transmission consists of type declaration 128 defining the type of operation needed by the irrigation control unit 18. In the presently preferred embodiment of the invention type declarations may be "Arbitration" used for prioritising functions, "Data" used for transmitting data to the irrigation control unit 18, "Control" used for switching line decoders 44 in the irrigation control units 18 on and off, "Broadcast" used for transmission of data to all irrigation control units 18 in the two-wire controlling and monitoring system 10, "Test" used for testing the functionality of one of the irrigation control units 18 and "Poll" used for extracting specific irrigation parameters from one of the sensor decoders 52 in the irrigation control units 18.

Depending on which type declaration 128 is transmitted, the binary pattern 118 may further consist of an address 130 having a transmission size in the range 0 128 bits, data having a transmission size in the range of 0 to 1 Gbits, a first check having a transmission size in the range of 0 to 128 bits, a second check having a transmission size in the range of 0 to 128 bits and finally the transmission is concluded by the stop signal defined by the pulse width 124. In the presently preferred embodiment of the invention the type declaration consists of 4 bits, the address consists of 16 bits, the data consists of up to 64 KBYTE (1 BYTE equal to 1024 bits), the first check consists of 4 bits and the second check consists of 4 bits.

Figure 8:
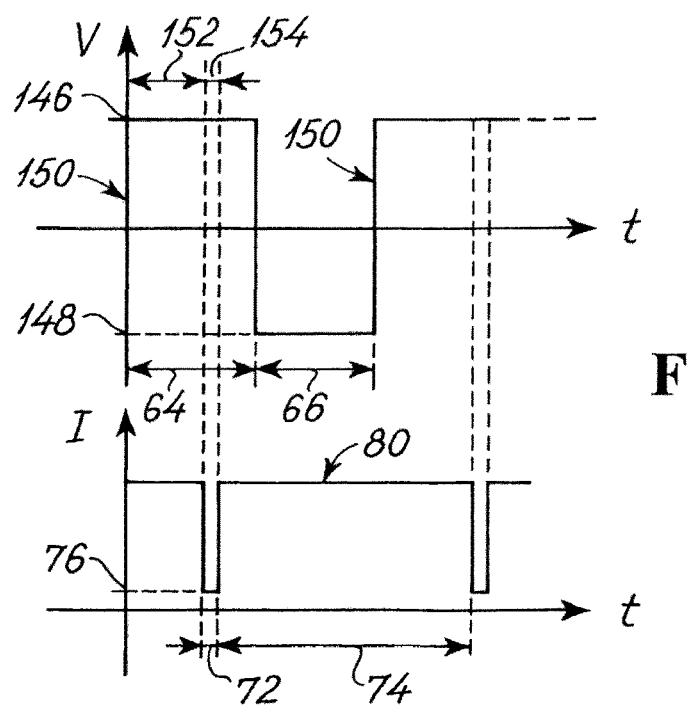
FIG. 8 shows an alternating DC voltage line signal transmitted on one conductor of the two-wire cable and corresponding alternating DC current signal between conductors of the two-wire cable.

FIG. 8 shows a voltage versus time curve of the first alternating DC voltage signal LA and simultaneously a curve of current versus time of the alternating DC current signal 80. During the positive pulse having the pulse width 64, the controller and power supply unit 30 provides an interrupt window 154 during which the alternating DC current signal applies the minimum current 76 to the two-wire cable 28 until an interrupt from the irrigation control units 18 is detected. The pulse width 72 of the minimum current 76 part of the alternating DC current signal 80 determines the interrupt window's 154 active time period. In the presently preferred embodiment of the invention, the active time period of the interrupt window is shorter than 5 ms. The precise length of the pulse width 72 is determined according to detection by the controller and power supply 30 of an interrupt from the irrigation control units 18. As soon as an interrupt is detected during the interrupt window 154, the DC alternating current signal shifts state and provides maximum current 78 to the two-wire cable.

The interrupt window 154 follows an alternation 150 of the first alternating DC voltage signal LA and a power active time period 152. In the presently preferred embodiment of the invention the power active time period 152 is 400 ms.

Figure 9:
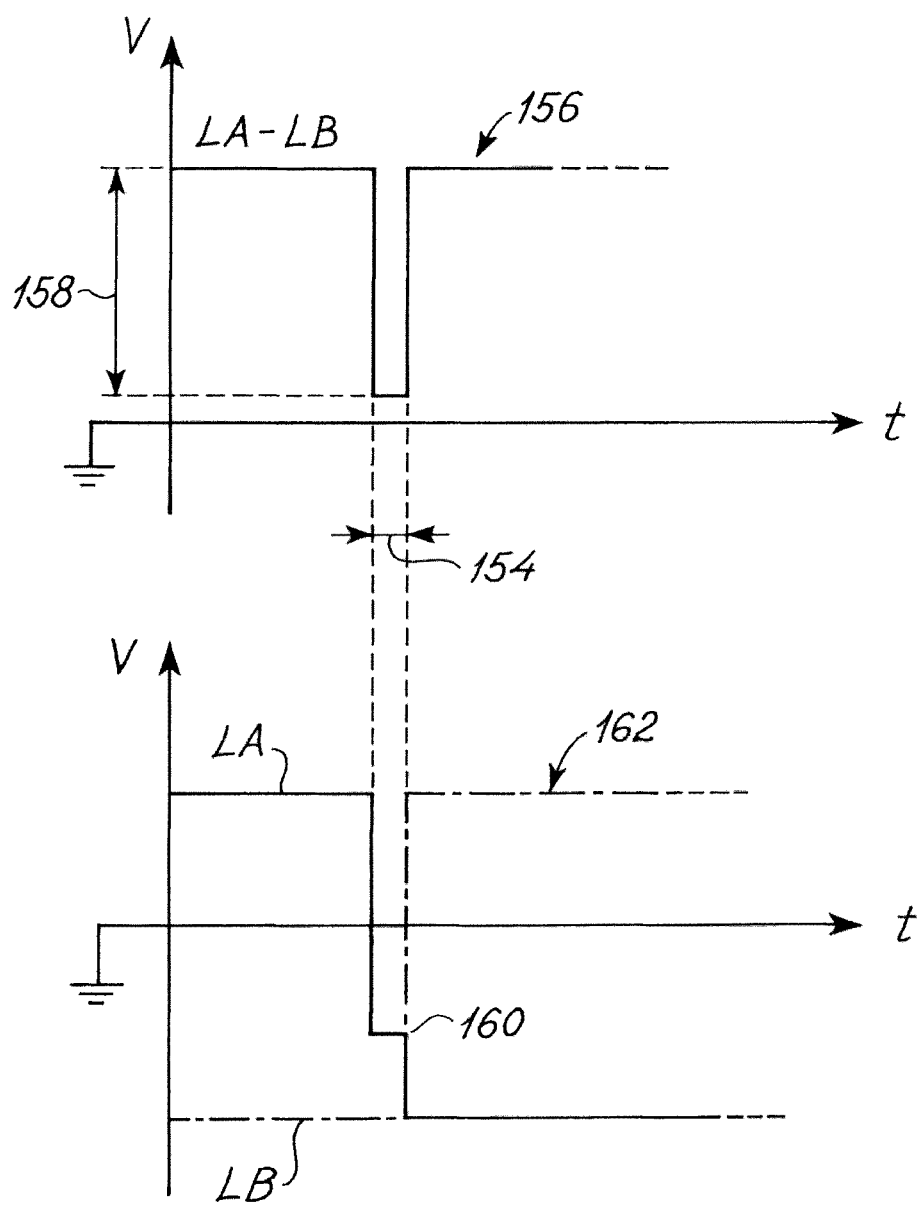
FIG. 9 shows a differential voltage signal between conductors of the two-wire cable and the corresponding two alternating DC voltage line signals.

The sensor decoder 52 comprises a short circuiting circuit for unidirectional short circuiting the pair of control and power inputs 58. The sensor decoder 52 may request an interrupt of the two-wire controlling and monitoring irrigation system 10 by unidirectional short circuiting the pair of control and power inputs 58 during the interrupt window 154 and hence provide a voltage drop 158 of a differential voltage 156 between the first alternating DC voltage signal LA and the second alternating DC voltage signal LB, shown in FIG. 9. FIG. 9 shows a voltage versus time curve of the differential voltage 156 during transmission of the request of an interrupt. In the presently preferred embodiment of the invention the maximum voltage of the differential voltage 156 is in the range 25V to 60V or preferably 35V and during the request of an interrupt the differential voltage may drop to a value in the range 15V to 30V. However, in the presently preferred embodiment of the invention the differential voltage may drop to a maximum of 25V or to a voltage of −10V relative to ground voltage.

FIG. 9 furthermore shows voltage versus time curves of the first alternating DC voltage signal LA and the second alternating DC voltage signal LB during the request for an interrupt. As FIG. 9 shows, during the request of an interrupt performed in the interrupt window 154, the voltage difference between the first alternating DC voltage signal LA and the second alternating DC voltage signal LB is significantly reduced, which reduction is detected by the controller and power supply unit 30. In response to the request of an interrupt, the controller and power supply unit 30 performs an alternation 160 of the first alternating DC voltage signal LA and the second alternating DC voltage signal LB and performs a shift in state of the DC alternating current signal 80 from minimum current 76 to maximum current 78. Since the short circuiting is unidirectional, the effect of the short circuit is avoided following the DC alternation of the first alternating DC voltage signal LA and the second alternating DC voltage signal LB. At the same time the DC alternation indicates to the plurality of irrigation control units 18 that the controller and power supply unit 30 has received an interrupt from one of the plurality of irrigation control units 18 and therefore, the plurality of irrigation control units 18 are prepared for the controller and power supply unit's 30 initiation of a transmission 162 of the type declaration "Arbitration" on the two-wire cable 28.

Figure 10:
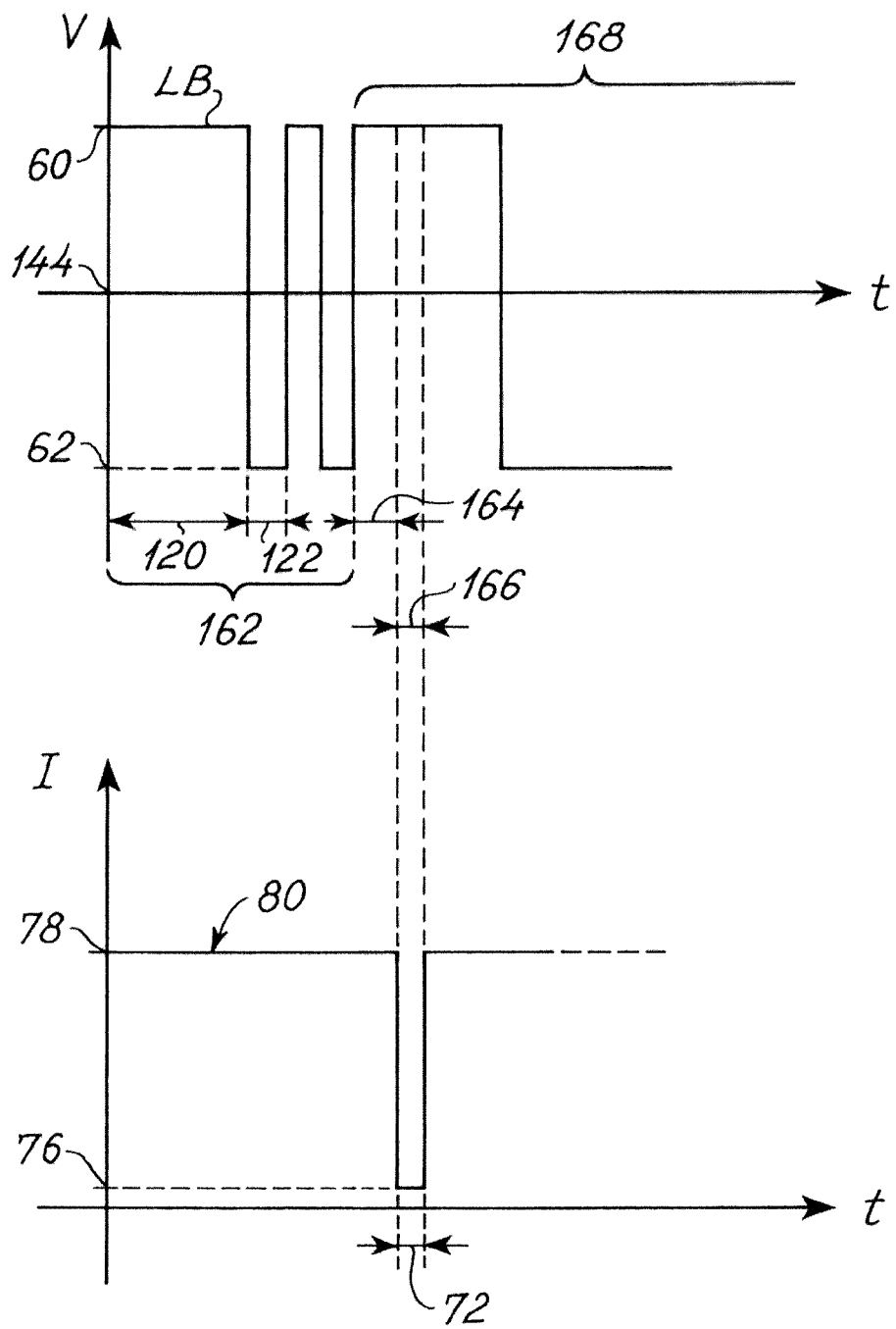
FIG. 10 shows a transmission of a type declaration followed by a sequence of binary "1"s including an answer window.

FIG. 10 shows a curve of the second alternating DC voltage signal LB transmitting the transmission 162 comprising a type declaration. If the type declaration transmitted is "Arbitration", then the controller and power supply unit 30 continues it's transmission by applying a series of binary "1"s 168 to the two-wire cable 28 in order to obtain an address of the interrupting irrigation control unit 18 having the lowest address. Each of these binary "1"s include an answer window 166 during which the minimum current 76 is applied to the two-wire cable 28. If at least one of the interrupting irrigation control units 18 during the first answer window 166 performs a unidirectional short circuiting of the pair of control and power inputs 58, then the controller and power supply unit 30 interprets the resulting voltage drop as a binary "0" indicating that the most significant bit of the address of the at least one of the interrupting irrigation control units 18 is "0". On the other hand, if none of the interrupting irrigation units 18 perform a short circuiting of the pair of control and power inputs 58 during the answer window 166, then the controller and power supply unit 30 interprets a binary "1" indicating that the most significant bit of the addresses of all of the interrupting irrigation control units 18 is "1". Subsequently, the controller and power supply unit 30 initiates transmission of a second binary "1" including a second answer window 166 by performing a new alternation of the first alternating DC voltage signal LA and the second alternating DC voltage signal LB and applies the maximum current 78 to the two-wire cable 28. This process is repeated until the controller and power supply unit 30 has located the interrupting irrigation control unit 18 having the lowest address. In effect, the interrupting irrigation control units 18 answer "yes" or "no" to the transmission of the series of binary "1"s 168 in accordance with the interrupting irrigation control units' 18 own address. When the controller and power supply unit 30 has identified for example the interrupting sensor decoder 52 by detecting the sensor decoder's 52 answers in the answer window 166, then the controller and power supply unit 30 continues a new transmission of binary "1"s including answering windows 166 for the interrupting sensor decoder 52 to transmit data from the sensor decoder 52 to the controller and power supply unit 30 by answering "yes" or "no".

Similar communication techniques as described above between the controller and power supply unit 30 and the individual irrigation control units 18 is utilized during the controller and power supply unit's 30 request for data from the irrigation control units 18 and during any type declaration in which obtaining information from the irrigation control units 18 is required.

Voltage drops outside a designated interrupt window 154 or answer window 166 or voltage drops below an acceptable voltage minimum during such a window (154, 166) may be due to erroneous equipment. Thus, voltage drops further may show if the two-wire controlling and monitoring system has faulty equipment. Alternatively, the controller and power supply unit 30 may establish a separate test window in both high and low pulses of both the first alternating DC voltage signal LA and the second alternating DC voltage signal LB. The test window may be initiated following a toggle or alternation of the first and second alternating DC voltage signal LA and LB. According to one embodiment of the present invention, the test window is initiated 100 ms following a specific pre-selected alternation and has a length of 10 ms. By reducing the alternating DC current signal 80 to minimum current 76 during the test window, erroneous signaling from the irrigation control unit 18 is avoided.

In the presently preferred embodiment of the invention, the alternating DC current signal 80 during the answer window 166 is reduced to the minimum current 76, which minimum current 76 lasts for the pulse width 72. The length of the pulse width 72 is determined in accordance with the earliest response from one of the answering irrigation control units 18 and limited to a having a maximum length of 2.5 ms. The answer window 166 during a transmission of a series of binary "1"s is initiated following a non-active time period of approximately 5 ms. These time periods are according to the first communication protocol (KP1).

Generally speaking, the communication between the controller and power supply unit 30 and the irrigation control units 18 is implemented by utilizing a unidirectional short circuiting circuit in the irrigation control units 18 for transmitting an interrupt request to the controller and power supply unit 30 and for transmitting answers to the controller and power supply unit 30. The reaction of the controller and power supply unit 30 is immediate alternation and consequently a shorter time having minimum current 76 applied to the two-wire cable 28. Even if the reaction of the controller and power supply unit 30 during the process of obtaining information from the irrigation control units 18 during the answer windows 166 is not restricted in the sense that a binary "0" must be 5 ms but rather that a binary "0" is indicated entirely by a short circuiting signal from the irrigation control units 18 at any moment within the answer window. However, the faster the short circuiting signal is detected by the controller and power supply unit, the better the power transfer to the irrigation control units 18 becomes.

The two-wire controlling and monitoring system 10 may be configured in a variety of ways. The presently preferred embodiment of the electronics of the two-wire controlling and monitoring system 10 is shown in FIGS. 11 to 16.

Figure 11:
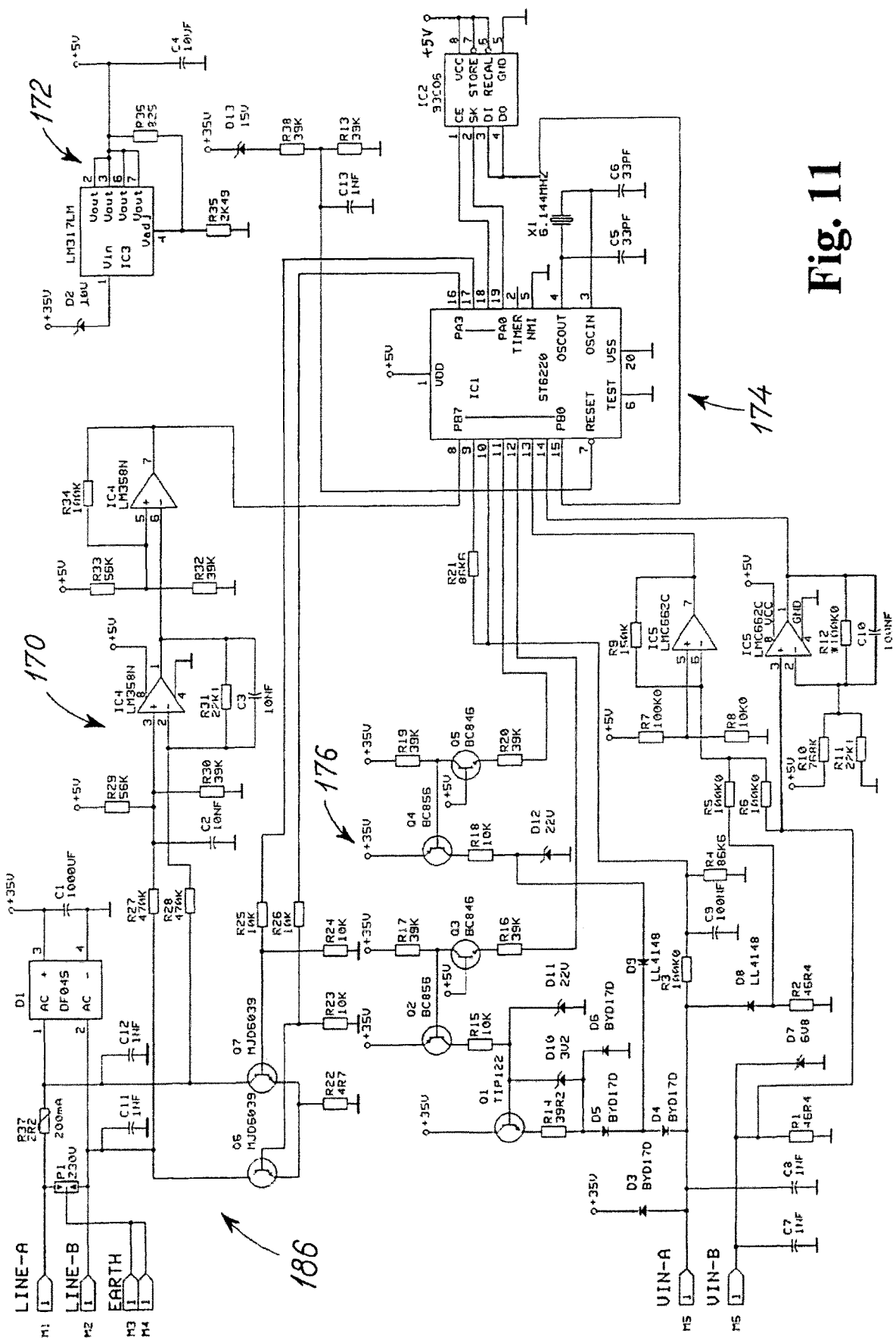
FIG. 11 shows a circuit diagram of the presently preferred embodiment of a sensor decoder.

FIG. 11 shows a circuit diagram of the presently preferred embodiment of the sensor decoder 52. The circuit diagram shows the short circuiting circuit 170, a control and power supply input section 186 having a pair of control and power supply inputs designated by Line-A and Line-B, a constant voltage supply 172, a microprocessor 174 and a field sensor power supply and field sensor signal amplifier 176.

The short circuiting circuit 170 comprises a differential amplifier monitoring polarity of the lines Line-A and Line-B and communication information regarding polarity of the lines Line-A and Line-B to the microprocessor 174. The short circuiting circuit 170 further comprises two transistors for unidirectional short circuiting of the lines Line-A and Line-B. The transistors are controlled by the microprocessor 174 and operated to open or close during interrupt windows 154 and answering windows 166.

The control and power supply input section 186 provides an electrical separation between the two-wire cable 28 and the sensor decoder 52. This is achieved by employing bridge circuitry in combination with a reservoir capacitor. During interrupt windows 154 and answering windows 166, the current supplied to the two-wire cable 28 is significantly reduced and therefore, in order to keep the sensor decoder functioning during these short periods, the reservoir capacitor supplies the current needed for operating the sensor decoder 52.

Figure 12:
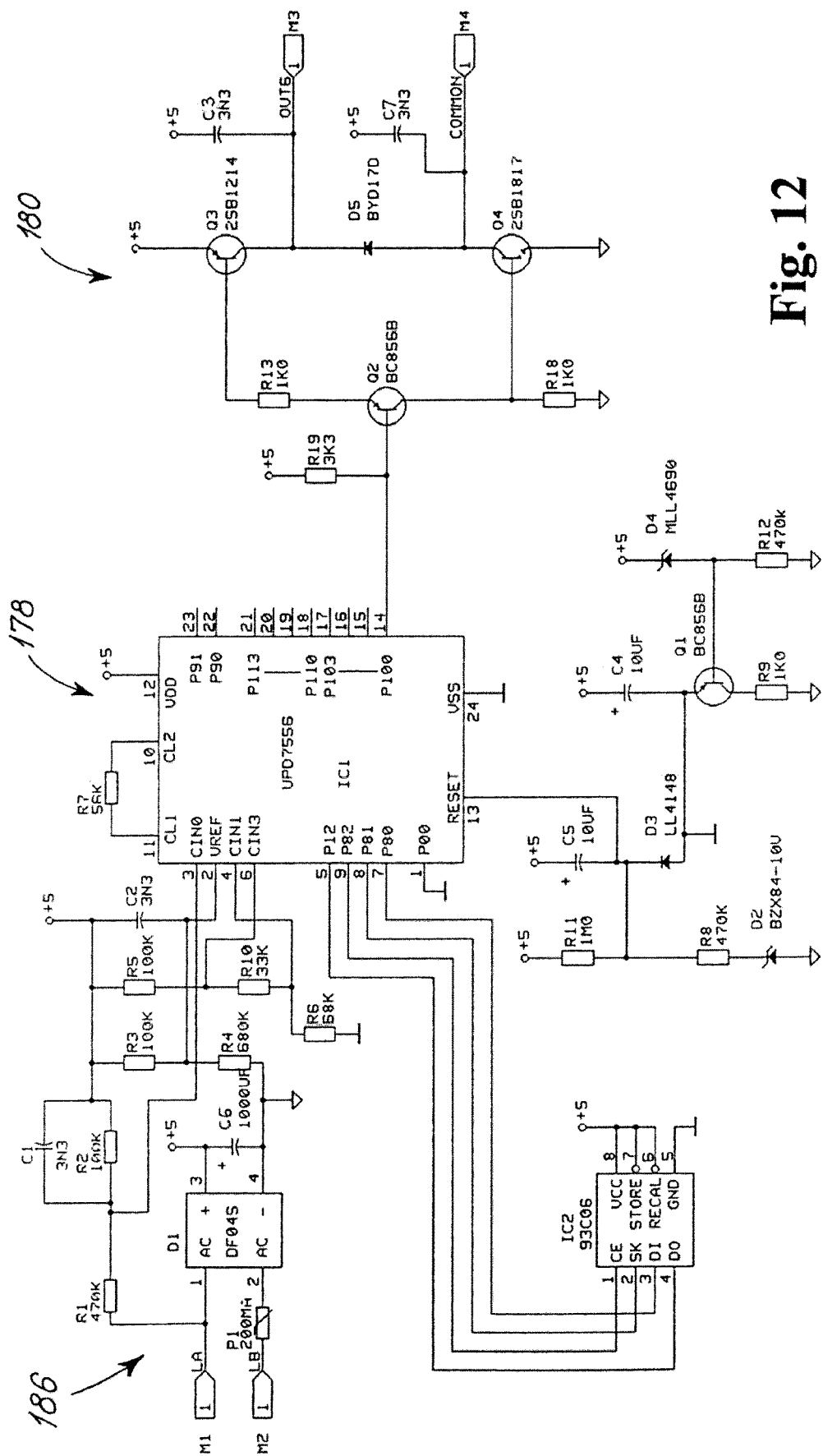
FIG. 12 shows a circuit diagram of the presently preferred embodiment of a line decoder having one valve control output.

FIG. 12 shows a circuit diagram of the presently preferred embodiment of the line decoder 44 having one valve control output. The circuit diagram shows a control and power supply input section 186 having a pair of control and power supply inputs designated by LA and LB, a microprocessor 178 and an output power stage 180 for operating the controllable irrigation valves 42 to open and closed positions.

Figure 13:
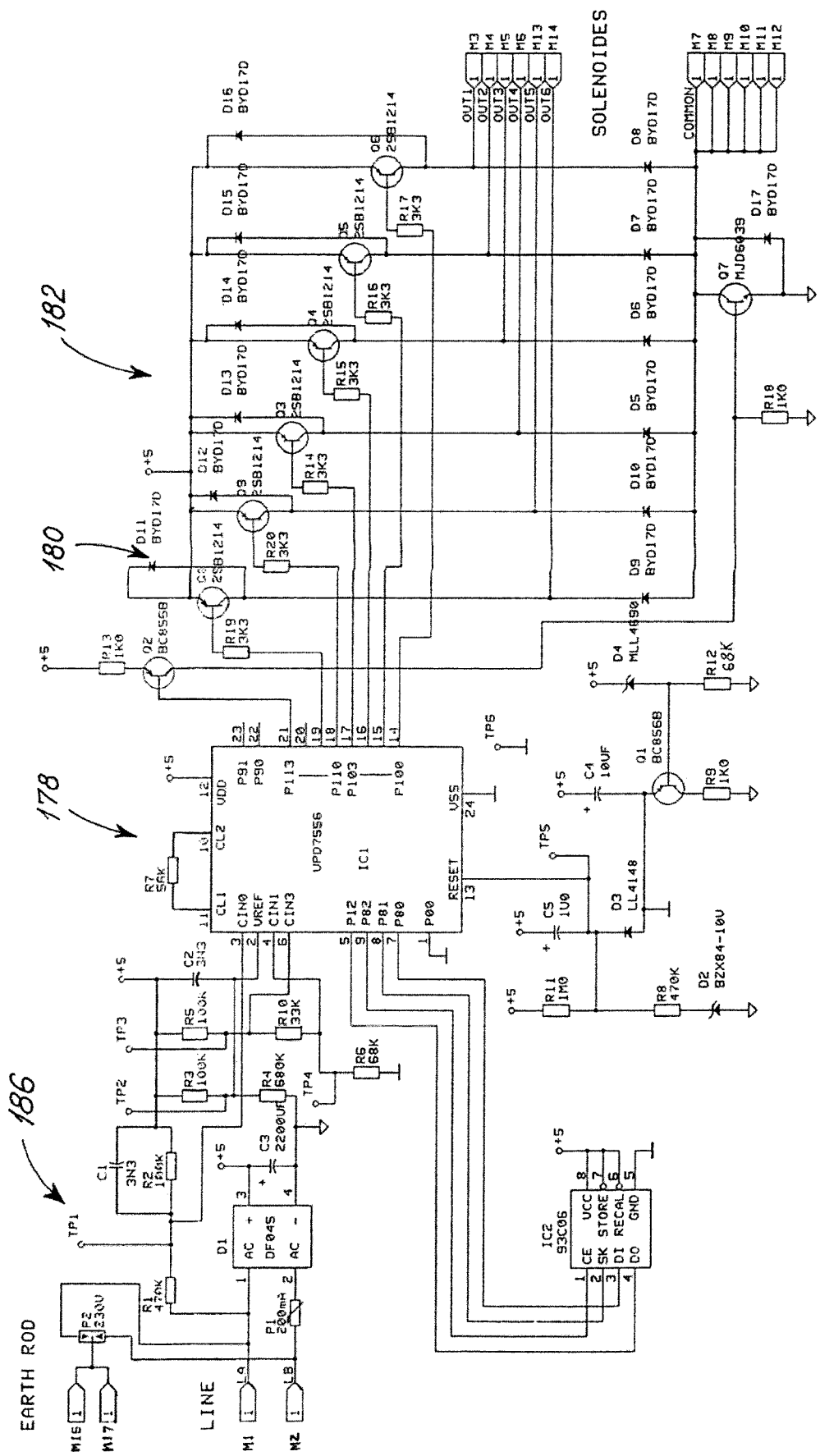
FIG. 13 shows a circuit diagram of the presently preferred embodiment of a line decoder having at least one valve control output.

FIG. 13 shows a circuit diagram of the presently preferred embodiment of the line decoder 44 having at least one valve control output. The circuit diagram shows the microprocessor 178 and a plurality 182 of the power output stage 180 for operating a series of the controllable irrigation valves 42 to open and closed positions.

Similarly to the circuit diagram for the sensor decoder 52 depicted in FIG. 11, the line decoder 44 shown in FIG. 12 and the line decoder shown in FIG. 13 comprise power supply input sections 186 electrically separating the two-wire cable 28 from the internal circuitry of the line decoders 44 in FIGS. 12 and 13. The power supply input section 186 consists of a bridge circuit and a reservoir capacitor.

Figure 14A:
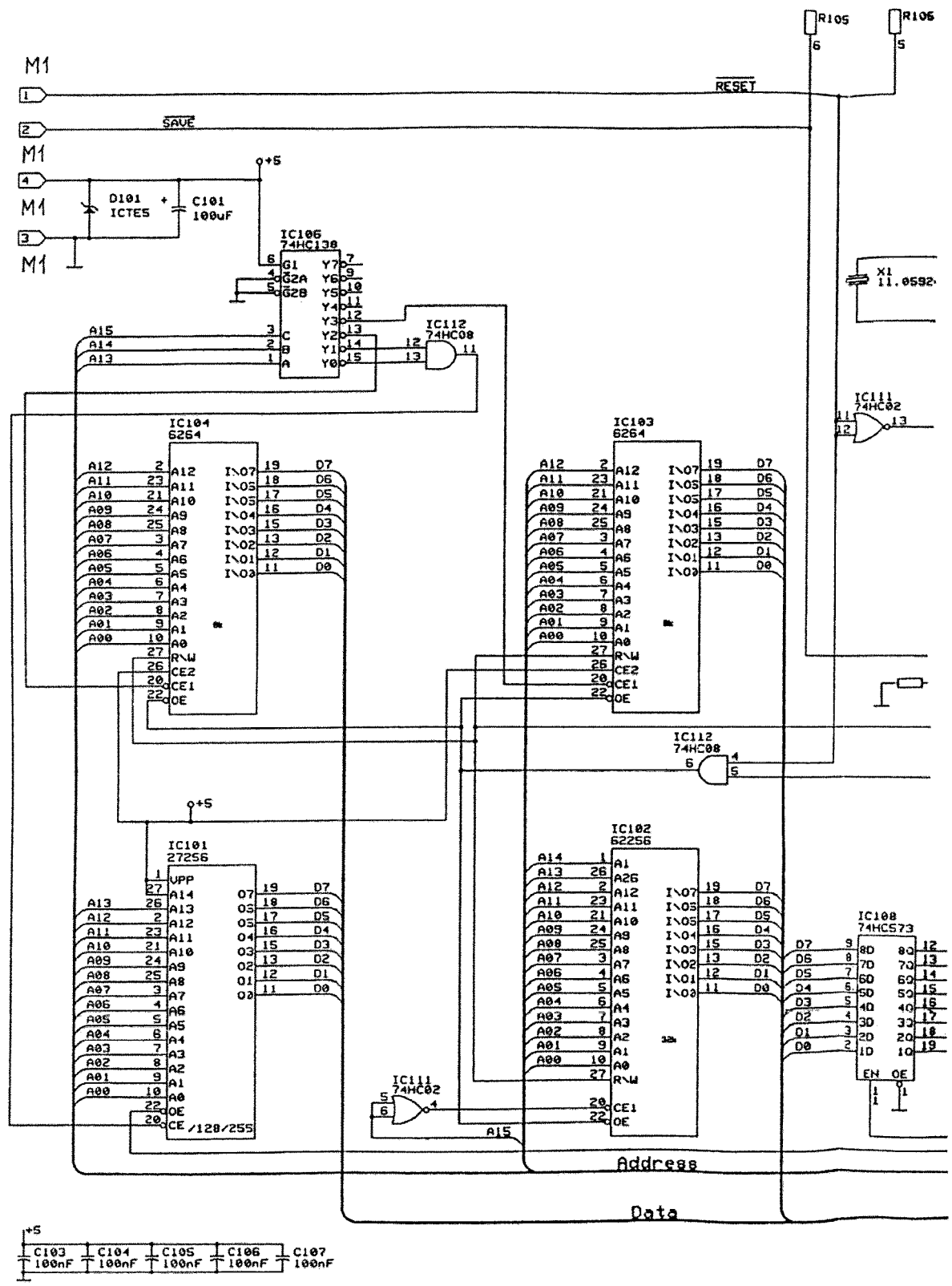
FIGS. 14a and 14b show a circuit diagram of a microprocessor and storage section included in a controller and power supply unit according to a preferred embodiment of the present invention.
Figure 14B:
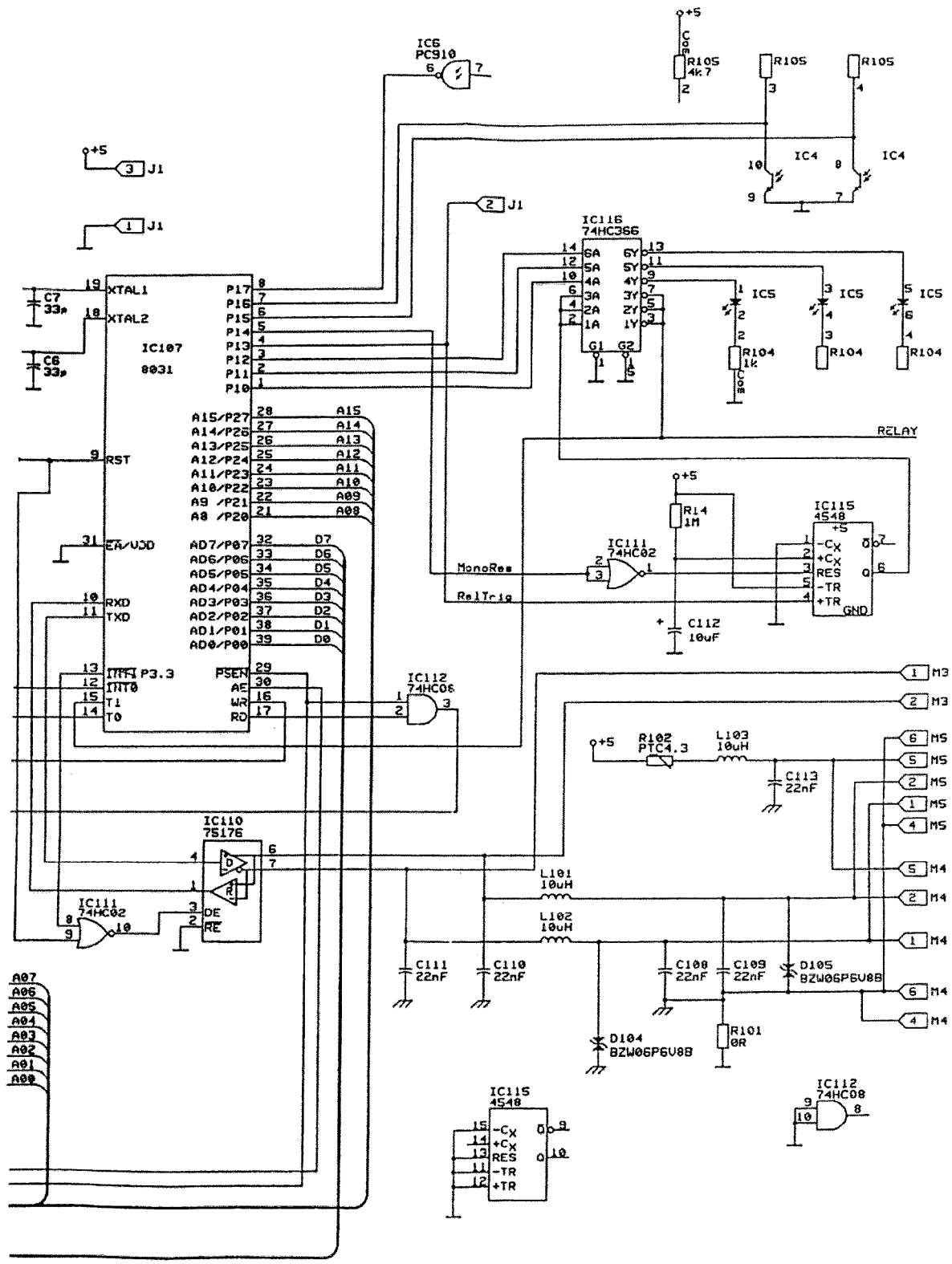

FIGS. 14a and 14b show a circuit diagram of a controller section of the presently preferred embodiment of the controller and power supply unit 30.

Figure 15A:
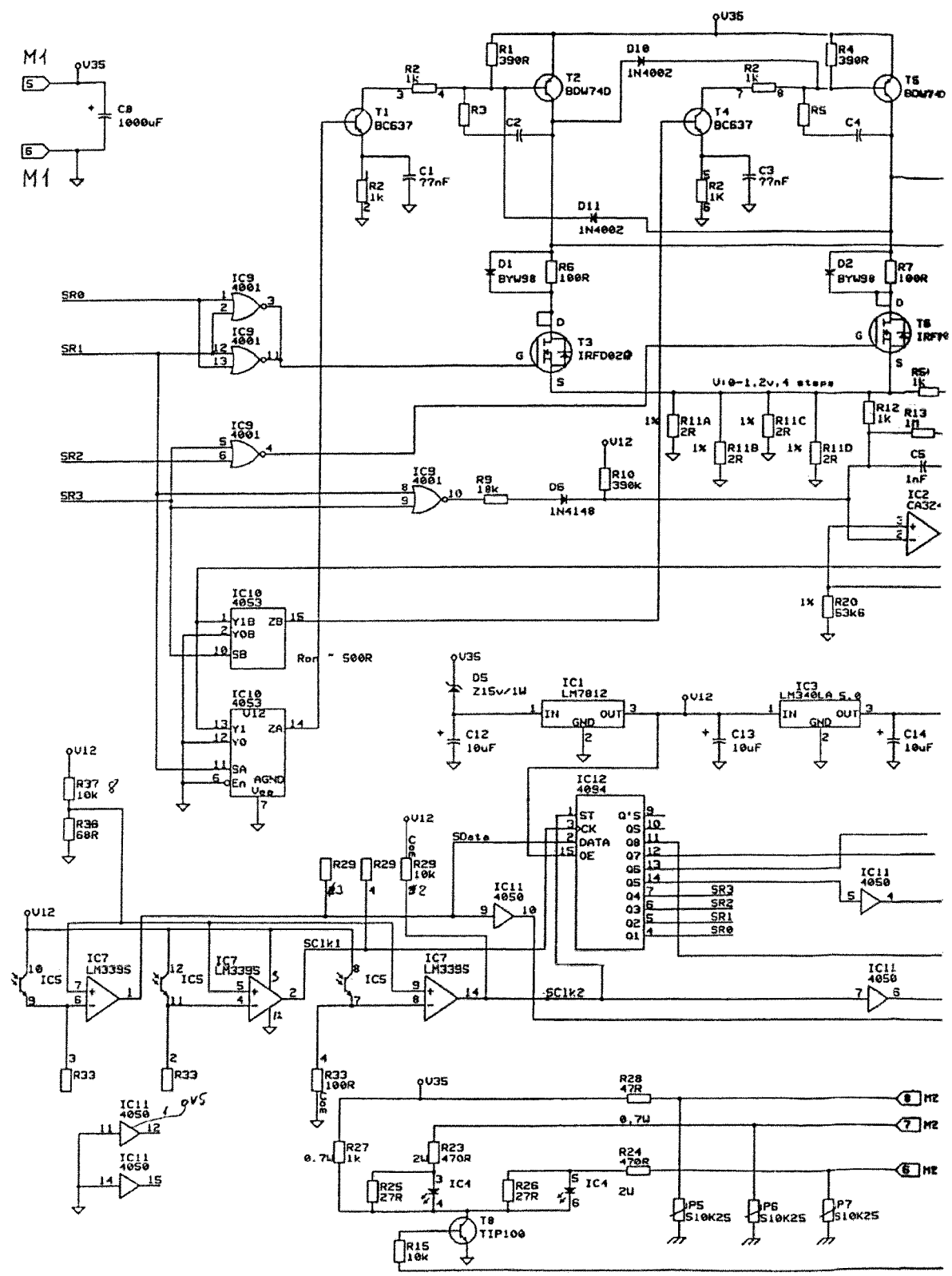
FIGS. 15a and 15b show a circuit diagram of a power output stage included in a controller and power supply unit according to a preferred embodiment of the present invention.
Figure 15B:
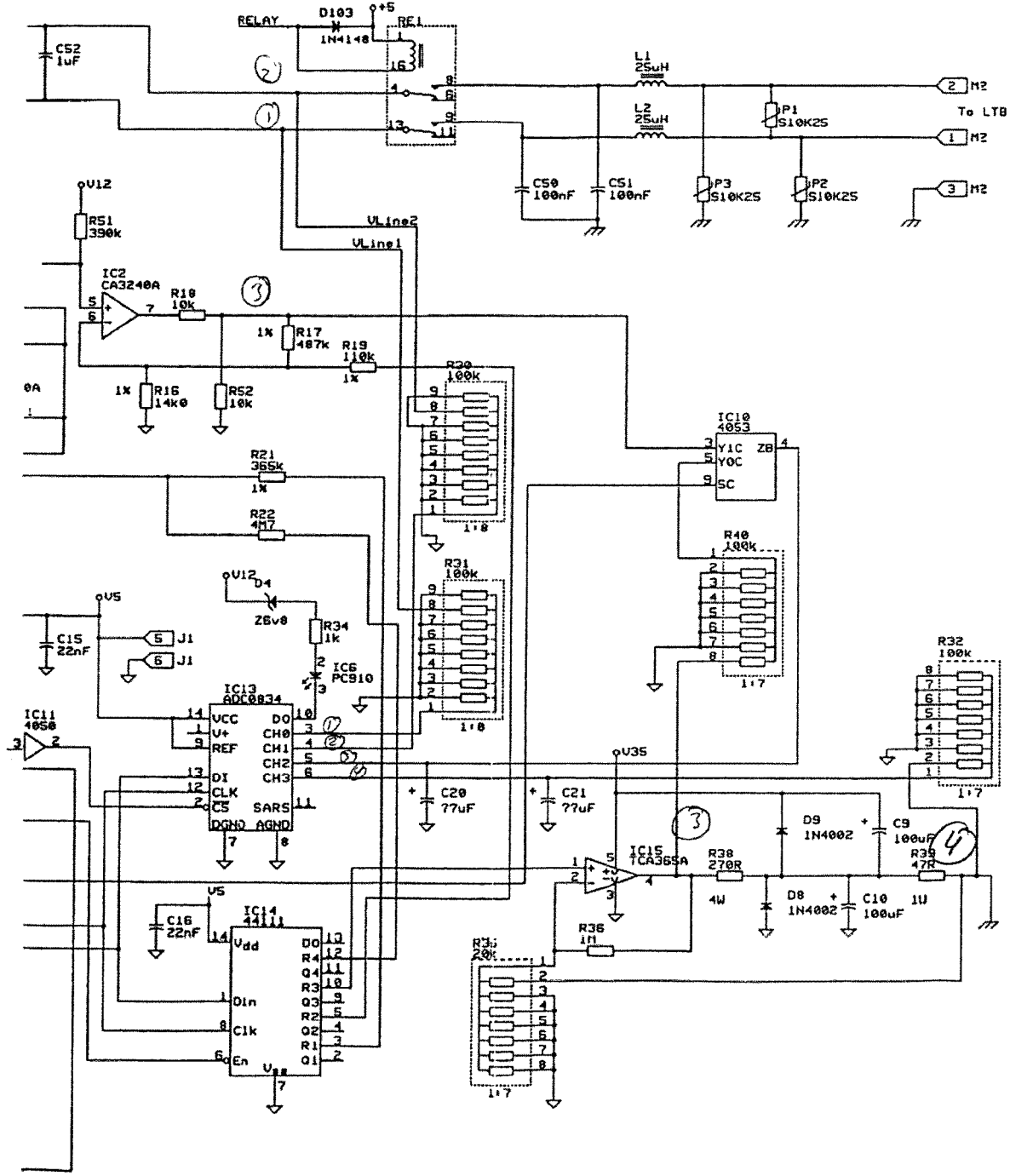

FIGS. 15a and 15b show a circuit diagram of power supply section of the presently preferred embodiment of the controller and power supply unit 30.

Figure 16A:
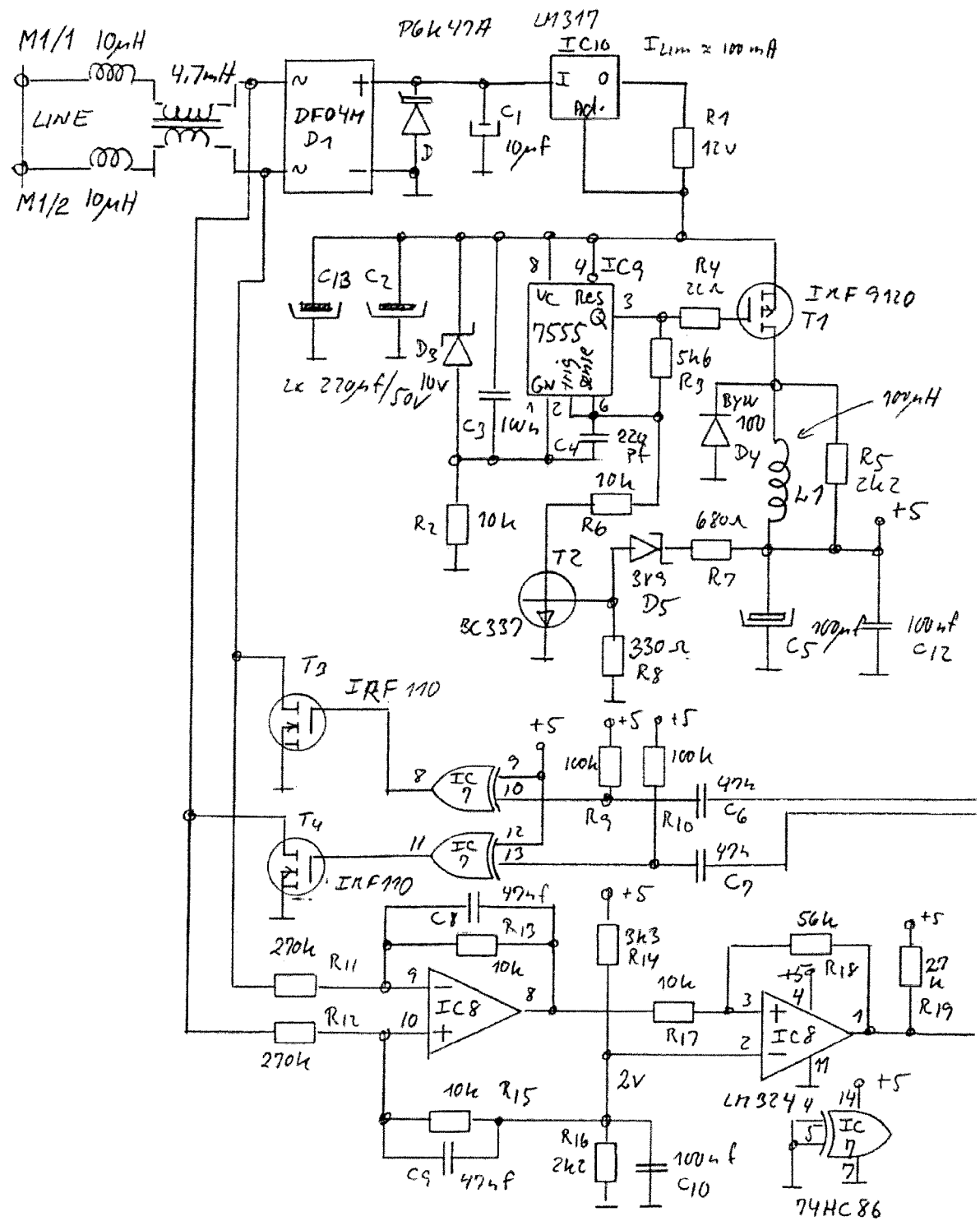
FIGS. 16a and 16b show a circuit diagram of a mark sender according to a preferred embodiment of the present invention.
Figure 16B:
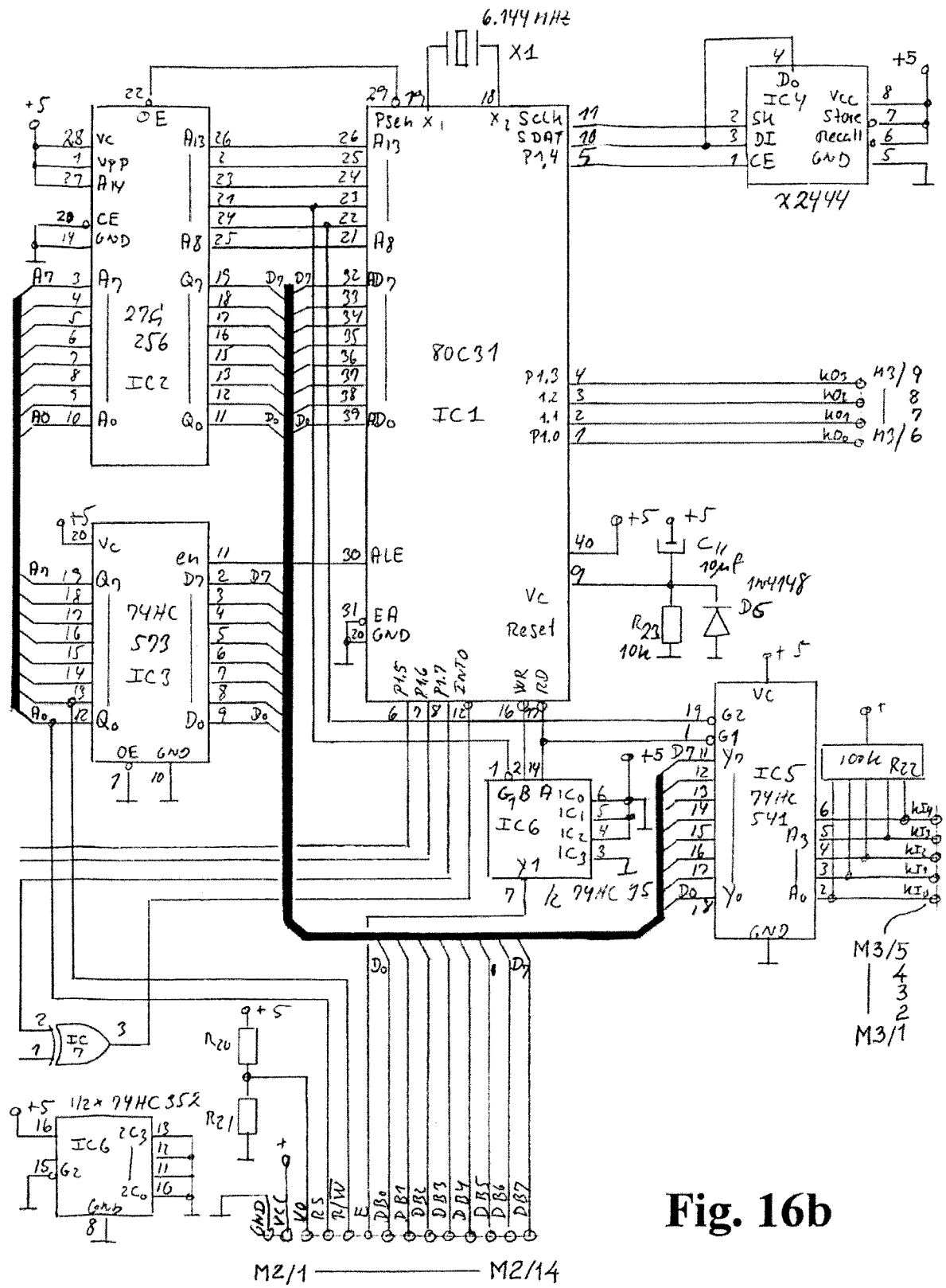

FIGS. 16a and 16b show a circuit diagram of a mark sender for transmitting start information to the controllable irrigation valves 42 irrespective of the controller and power supply unit's 34 schedules of instructions. The mark sender provides the opportunity for manually control the controllable irrigation valves 42 to open or close and thereby provide an operator the possibility to manually adjust the irrigation during inspection of for example a golf course.

Figures 17, 18:
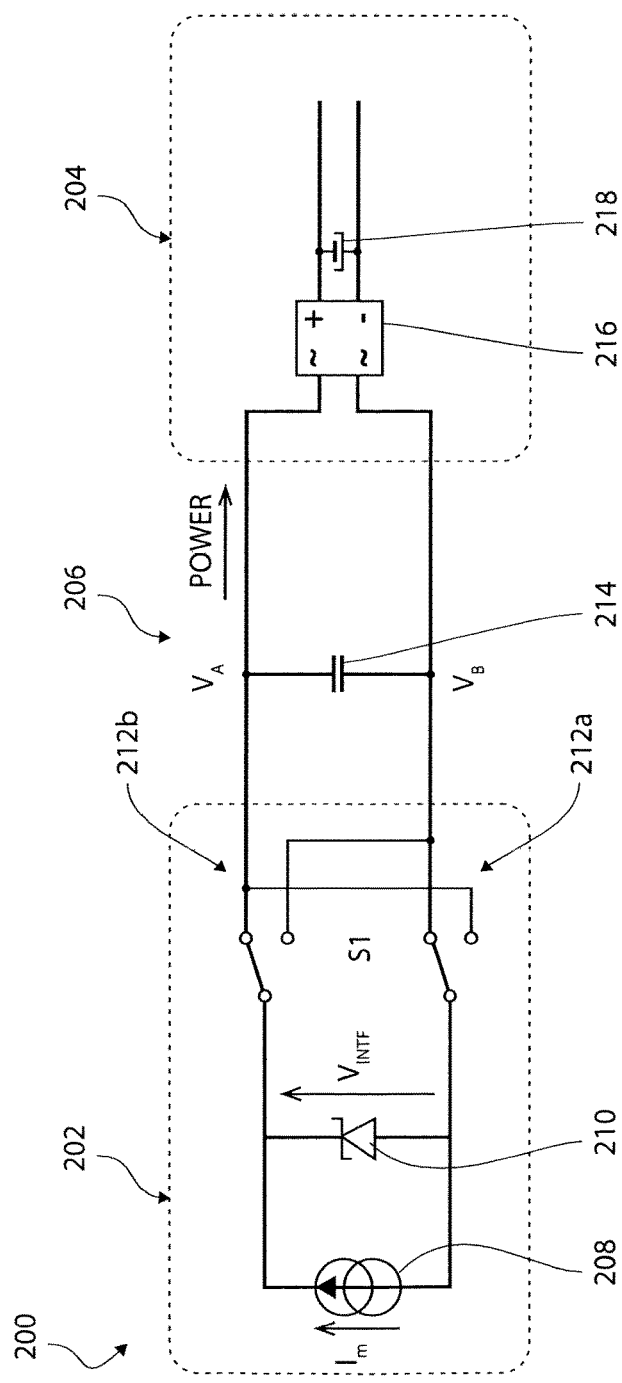
FIG. 17 show a communication sequence utilizing both the first communication protocol (KP1) and the second communication protocol (KP2).
FIG. 18 shows a two-wire controlling and monitoring system according to the preferred embodiment of the present invention.

FIG. 17 shows the communication between the controller/power supply, also called "interface", and a localized irrigation control unit, also called "localized irrigation control unit", using a second communication protocol. When the system is upgraded, i.e. for allowing a higher communication speed, new and old units may coexist so that new functions may gradually be included in older setups. All communication between the controller/power supply and the plurality of localized irrigation control units uses sequences of 1 bits and 0 bits organised in packages. This basic structure will be the same for both newer and older units. All packages have the following structure: "Stop bit"; "type"; "address"; "data"; "check"; "stop bit". A "stop bit" is used to open and to close the package. In order for a unit to be able to react on a package, the package shall:

1) Have the structure a shown above.
2) Have a known "type".
3) Have an "address" which corresponds to the address of the unit (only applicable in case the type requires an address, e.g. in case the "type" is "broadcast", no "address" is required).
4) The length of data should correspond to the "type".
5) The received "check" value should correspond to the calculated check value for the package in question.

In case the above criteria are not fulfilled, the package should be ignored. One example of an ignored package is the package formed by the mode in which the controller/power supply alternates the voltage with a frequency of about 50 Hz. This mode is used for detecting the current in the cable using a current clamp. The apparent communication signals are rejected by all units since the 50 Hz alternation cannot form a valid package. In an existing system, all communication time periods ("1 bit", "0 bit", "stop bit", "arbitration window", "interrupt window", etc.) are well defined. The communication time periods form a set of communication parameters which are called a communication protocol. The basic communication protocol described above will in the following be called KP1. Both newer and older units shall be able to communicate using KP1, i.e. a new controller/power supply should be able to communicate with an old localized irrigation control unit. In addition to the first communication protocol KP1, a new controller/power supply may be able to communicate using another set of communication time parameters, i.e. a second communication protocol, which in the following will be called KP2. The new communication time periods under KP2 are typically smaller for allowing a faster communication. KP2 may be fixedly defined in the new units or alternatively, the new communication time parameters KP2 may be downloaded from the controller/power supply. The download itself will be made using the original communication parameters under KP1.

A requirement in relation to the alternative set of parameters KP2 is that communication using KP2 should not be able to form valid packages for units under KP1. Typically, the time periods in KP1 are much longer than the time periods under KP2, since the main reason for using KP2 is an increase in communication speed. Thus, the much quicker voltage alternations under KP2 will not be able to form valid packages under KP1. A very simple method of initiating a communication sequence using KP2 is by using an inadmissible KP1 type, e.g. type equal to 1111. A KP2 communication signal is thus started by sending a KP1 "stop bit" followed by a KP1 "type" bit having a "type" which is not recognised under KP1. The communication sequence is then followed by a KP2 "stop bit" and a KP2 package which may itself include a "type", "address" and "check" as defined above. The KP2 package is ended by a KP2 "stop bit". Further, KP2 packages may be sent or the KP2 communication may be ended by sending a KP1 stop bit. Optionally, a KP1 package may follow and the communication sequence is ended by sending a KP1 "stop bit". It is thereby a requirement that the KP1 "stop bit" should be longer than the KP2 "stop bit". It should however be noticed that the KP2 packages do not have to follow the above mentioned structure according to KP1. One advantage of downloading the KP2 parameters from the controller/power supply is that the KP2 parameters may then be formed such that they are optimized in relation to the capacity of the cable network and cable resistance such that an optimal communication speed may be achieved. In other words, the KP2 must not be fixed, but may be dynamically adapted in case there is a need, since all of the units also always may be able to react on a correctly issued KP1. KP2 may easily be downloaded to all relevant units using the type "broadcast" under KP1.

In the figure, a sequence of packages from left to right are shown schematically. First, a stop bit is sent under KP1 in order to initiate communication. Then, an "illegal" type under KP1 is sent, i.e. a type having no meaning under KP1 other than telling the localized irrigation control units which are compatible with KP2 that the next bit will be under KP2. The localized irrigation control units which only operate under KP1 will ignore the "illegal" type and the rest of the communication. The localized irrigation control units compatible with KP2 will understand the "illegal" type, e.g. the sequence 1111, and enable communication under KP2, which is initiated and ended by a stop bit under KP2. There between, a data package under KP2 is sent. The communication under KP2 is ended by sending a stop bit under KP1, where after a package under KP1 may be send followed by a stop bit.

FIG. 18 shows a circuit diagram of a basic 2-wire irrigation and monitoring system 200 according to the present invention. The system 200 includes a controller/power supply 202, which is connected to a localized irrigation control unit 204 by means of a two wire cable which is schematically illustrated under reference numeral 206. The localized irrigation control unit typically constitutes a localized irrigation control unit. There may be more than one localized irrigation control unit connected to each controller/power supply 202, as will be discussed later.

The controller/power supply 202 includes a current source 208 having a Zener diode 210 in parallel in order to provide a constant voltage. The controller/power supply 202 further includes a switch (S1) which in fact constitutes two switches designated 212a and 212b. The two switches 212a and 212b may constitute MOSFETs and operate synchronously in order to switch the polarity of each of the two wires VA and VB of the two wire cable 206. The two wire cable 206 has a cable capacitance 214, which is illustrated by a capacitor. The localized irrigation control unit 204 has an line decoder 216 which decode the valve control signals and provide a non alternating DC voltage for activating the solenoid (not shown) of the valve (not shown) to be controlled. The input of the line decoder 216 is constituted by a bridge rectifier or Graetz circuit comprising a large capacitor 218 in order to supply the localized irrigation control unit during communication and providing a local energy reservoir. It follows some typical values which are used in the present system 200.

The maximum alternation frequencies should be below five kHz corresponding to a time period between alternations of below 100 us. The basic alternation time period, i.e. the time period between alternations when no data is being transmitted, is between 1 ms and 10 s. This is to ensure that no harmful corrosion will be built up. The positive line voltage in relation to earth should be between +10V and +30V. The negative line voltage in relation to earth should be −15V to −30V. The average voltage of the lines should be slightly negative biased in order to avoid a harmful corrosion. The maximum line current is between 0.5 A and 5 A. In this way, a large amount of localized irrigation control units 204 may be powered while still allowing thin cable sizes to be used. The communication on the 2-wire cable is performed by defining a time period in the range of 100 us to 49 ms to correspond to the "1 bit", a time period in the range of 50 us to 9 ms to correspond to a "0 bit" and a time period in the range of 2 ms to 70 ms to correspond to a "stop-bit". In order to allow the decoder to successfully decode the bits and to avoid errors in the decoding, there is preferably a 5-10% margin when decoding the signal. Start of interrupt window 5 ms to 550 ms. Start of arbitration window 200 us to 10 ms.

The controller/power supply 202 is automatically identifying all of the localized irrigation control units 204 attached to the 2-wire cable so that the controller/power supply may establish a register including information about the type of localized irrigation control unit, the address of the localized irrigation control unit and various data of the localized irrigation control unit such as GPS coordinates etc. The retrieval of such data is hereafter called synchronization. The retrieval of information may be sent to a centralised control unit in order to have a complete overview of the installation. The controller/power supply 202 is further capable of registering the status of the individual localized irrigation control units 204 and of the cable network and optionally, transmits this information to a centralized controller unit. The controller/power supply 202 and the localized irrigation control units 204 should always be synchronized, i.e. in case a localized irrigation control unit 204 is added or removed or in case the controller/power supply 202 is exchanged, the register should be updated.

In the prior art system, all localized irrigation control units 204 have a 16 bit address, which is used for the communication between the controller/power supply 202 and the localized irrigation control unit 204. The localized irrigation control units are typically provided with a pre-programmed address which is noted on a label on the individual unit. Despite the relatively large number of addresses which may define using 16 bit, it is still possible that occasionally, during installation, the same address is used for two different localized irrigation control units. In such cases, one of the conflicting localized irrigation control units may be reprogrammed to another address. Alternatively, the conflicting localized irrigation control unit may be excluded. The risk of conflicting localized irrigation control units may be minimized, but not entirely excluded by using addresses having a longer transmission size such as a 32 bit address or a 64 bit address. However, a longer address than 16 bit corresponding to over 36000 localized irrigation control units, which is considered to be the maximum number of units, which may be reasonably connected to a single controller/power supply would be considered a waste of the communication value. According to the present invention, all localized irrigation control units have a primary address being e.g. a 16 bit address and a secondary address being a 32 bit or even a 64 bit address. The primary address may be reprogrammed in case of a conflict while the secondary address is unique and permanently defined within the individual unit. 64 bits allows for a very large number of addresses and thus, it may be guaranteed that even though the address is unique and permanent, i.e. no other unit in the world may have the same address. The addresses will never run out. The secondary address is used in a specific search program, which is used for identifying all of the localized irrigation control units connected to the cable. The controller/power supply may also have a unique, which is used for verifying the synchronization between the controller/power supply 202 and the localized irrigation control units 204. Thus, each localized irrigation control unit 204 has a reprogrammable primary address, which is used for the normal communication between the controller/power supply 202 and the localized irrigation control units 204 and a secondary address which is used during installation and in case of reprogramming or conflicting localized irrigation control units 204.

The controller/power supply 202 uses the secondary address when identifying all of the localized irrigation control units 204 and when collecting basic data from the localized irrigation control units 204. The basic data may include the primary address, the type of the unit and similarly data. The communication may be established under communication protocol 1 (KP1) or communication protocol 2 (KP2), however, since KP2 requires less cable capacitance and resistance, which may be unknown at the time of installation, typically KP1 is used. By using typical communication parameters under KP1 and using a 32 bit secondary address, the identification will take approximately 1 second per localized irrigation control unit. Thus, a typical installation of 500 localized irrigation control units may be installed in about 8 minutes using KP1. In this way, a total overview of the localized irrigation control units including the various parameters such as cable resistance and cable capacitance, which is used for initiation of the communication under KP2. The installation and identification process is initiated by the controller/power supply sending its address as a broad cast over a 2-wire cable network. The address of the controller/power supply is stored in the localized irrigation control units. The addresses and the additional information of all of the localized irrigation control units are hereafter determined as described above.

During normal operation, it is not practical to use the above mentioned method of identifying and synchronizing the controller/power supply and the localized irrigation control units. However, after each power up or in regular intervals, the controller/power supply broadcasts the address of the controller/power supply. In case one unit does not recognize the controller/power supply address, the unit is a new unit or a replaced unit and should therefore be synchronized. It should therefore respond during the arbitration window. In case the localized irrigation control unit knows the address of the controller/power supply, the localized irrigation control unit does not respond. In case the localized irrigation control unit responds, the synchronization process as defined above may be initiated. Thus, only non-synchronized localized irrigation control units participate in the synchronization process, which thus is capable of immediately finding new or replaced localized irrigation control units. It should be noticed, in case the controller/power supply is being replaced, e.g. due to a reparation, the new controller/power supply will use a different address, which should be unique and thus, the new synchronization of the complete network will automatically be initiated.

Figure 19A:
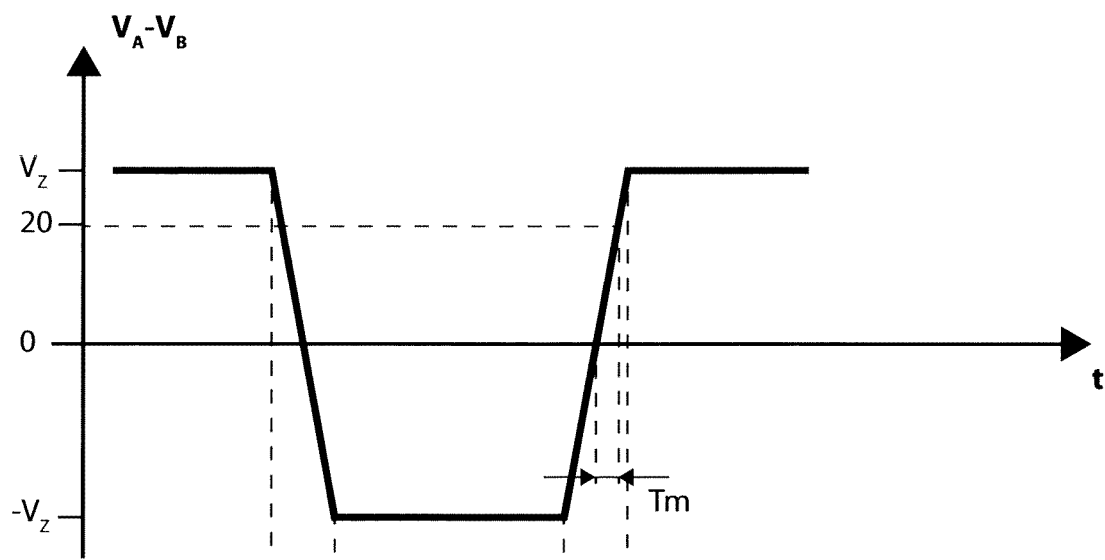
FIG. 19 shows a sequence of plots showing the alternation of the voltages on the two wire cable.

FIG. 19A shows a plot of an alternation of the voltage of one of the wires of the two wire cable from positive voltage VZ to negative voltage −VZ and back to positive voltage VZ. Even though the MOSFETs in the controller/power supply will switch very quickly, the cable and EMC capacitance the 2 wire cable will not immediately switch and thus there will be rise time and corresponding fall time of the voltage before the new value is assumed.

The rise time/fall time of the voltage may be used for calculating the cable capacitance Ck. A measurement of the time required for the voltage to rise from e.g. 0V to 20V may be made. The cable capacitance may then be calculated according to $Ck=(Im*Tm)/20V$.

Figure 19B:
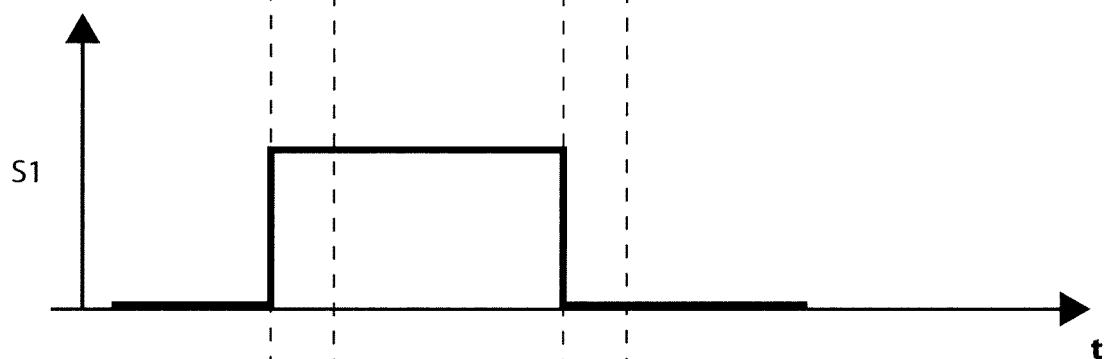

FIG. 19B shows the operation of the switch S1 in the same time scale as the plot of FIG. 19A. Ideally, as shown, the switch switches instantly between the two wires of the two wire cable. It is evident that depending on the type of switch, the switching operation itself will take some time. In any case, the alternation of the wires of the two wire cable will cause the voltage to begin to rise from the low voltage level to the high voltage level, or, fall from the high voltage level to the low voltage level, as described above. As seen in the figure, the wire is assuming the new voltage level some time after the alternation of the switch has taken place.

Figure 19C:
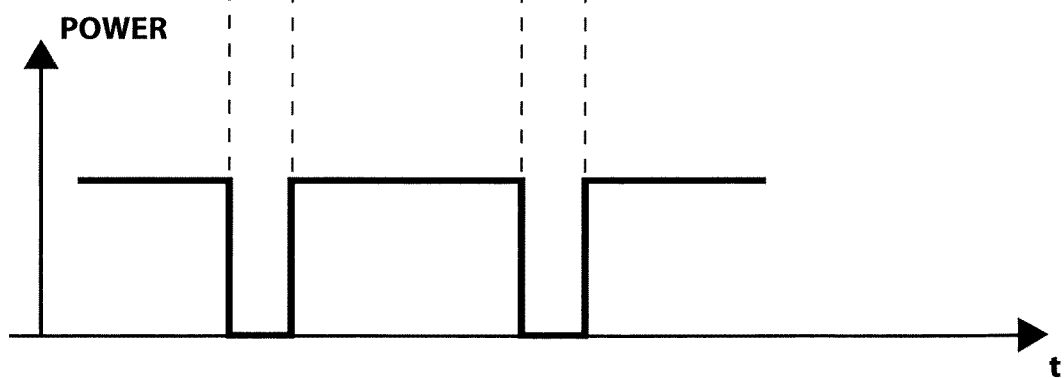

FIG. 19C shows the power bandwidth in the same time scale as in FIGS. 19A and B. Due to the use of a DC voltage, the power bandwidth is constantly at 100%, except during the switching operation. During the switching operation, in which the voltage is in-between VZ and −VZ, the power bandwidth is zero, since the power electronics of the line decoder cannot make effective use of a voltage which is lower than the peak voltage. The total power bandwidth is thus depending on the number of alternations and thus a value below 100%.

Figure 20:
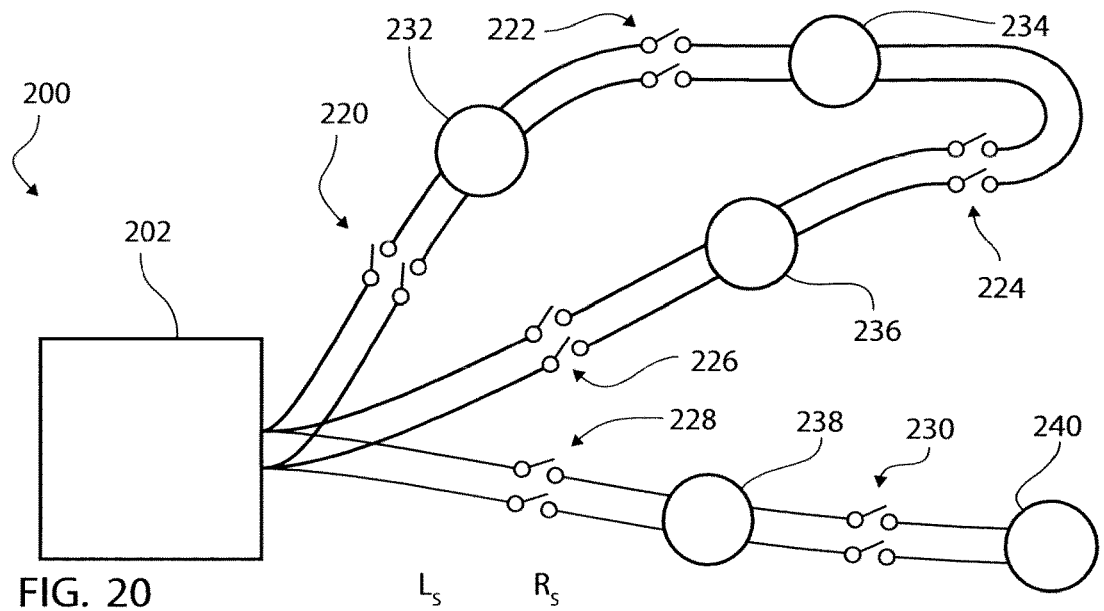
FIG. 20 shows a two-wire controlling and monitoring system including line circuit breakers.

FIG. 20 shows a two-wire controlling and monitoring system 200 including line circuit breakers 220, 222, 224, 226, 228, 230. In a 2-wire irrigation system 200, such as the one discussed above, in which a controller 200 communicates with decentralized localized irrigation control units 232, 234, 236, 238, 240 in order for the localized irrigation control units to operate such as activating a valve, the localized irrigation control units are typically connected to the 2-wire cable, i.e. a parallel connection. In this way, a short circuit of one of the localized irrigation control unit will affect the operation of all of the other localized irrigation control units. The short circuit will cause the localized irrigation control unit to draw a disproportionate amount of current from the 2-wire cable such that the other localized irrigation control units will suffer from a power shortage. This may affect both the function of the localized irrigation control unit and the ability of communicating with the localized irrigation control unit.

A very simple network including LCBs is shown, constituting two sub networks. In the first sub network, a loop structure is used, in which the controller/power supply 202 is directly connected to a cable section including the circuit breaker 220. The network continues in series by the localized irrigation control unit 232, line circuit breaker 222, the localized irrigation control unit 234, line circuit breaker 224, the localized irrigation control unit 236, the line circuit breaker 226 and back to the controller/power supply 202. The second sub network, a tree structure is used in which the controller/power supply 202 is directly connected to a cable section including the circuit breaker 228. The network continues in series by the localized irrigation control unit 238, line circuit breaker 230 and the localized irrigation control unit 240 without returning to the controller/power supply 202. The LCBs 220, 22, 224 and 226 are all LCB-L while the LCBs 228, 230 are all LCB-C In the present embodiment, there may be an overload or short circuit of e.g. the localized irrigation control unit 240. The failure is detected by the controller/power supply as the cable network will have a very high power consumption. The controller/power supply 202 cannot immediately determine the location of the failure. The controller/power supply 202 therefore interrupts the current to the whole second sub network for a time period of e.g. 60 seconds, such that all LOB's initiate the power-up reset. When the power is again applied to the LCBs, their switch will be open and the second sub network, i.e. the cable section including circuit breaker 228, the localized irrigation control unit 238, line circuit breaker 230 and the localized irrigation control unit 240 will have no power. The controller/power 202 supply will request line circuit breaker 228 to close the switch in order to apply power to the localized irrigation control unit 238. The voltage will then immediately fall to 0V for the whole network since the localized irrigation control unit or localized irrigation control units on cable section 2 should recharge their input capacitors. It should be noted that each cable section may include one or more localized irrigation control units. The recharge may take everything from 1 to 30 seconds depending on the number of localized irrigation control units of cable section 2 and the number of input capacitors. When the voltage on cable section 2 is fully re-established, the line circuit breaker 228 will report to the controller/power supply 202 that the operation has been performed. Hereafter, the controller/power supply activates the switch in line circuit breaker 230 in order to apply power to the localized irrigation control unit 240. Again, the voltage on the 2-wire cable falls to 0V, however, line circuit breaker 230 is registering that a failure has occurred since the voltage of the 2-wire cable does not return to the original value. After a specific amount of time, line circuit breaker 230 is again opened, where after the voltage of the 2-wire cable adjacent the controller/power supply again returns to its full value. The LCB2 reports to the controller/power supply that cable section 3 is defect and that it has been disconnected from the network. The controller/power supply may still perform operations on the first and part of second sub network which are not influenced by the failure.

If instead the failure was in the localized irrigation control unit 238, the procedure is according to the previous example. The controller/power supply 202 first interrupts the power from the cable in order to allow all units to perform the power-up reset. The first and second sub networks are reconnected as described above. Hereafter, the localized irrigation control unit 238 is connected. The line circuit breaker 228 notes that the second sub network cannot be recharged and disconnects the localized irrigation control unit 238. Both localized irrigation control units 238 and 240 remain disconnected by second sub network 228. The order of which the signal LOB's are activated may be established manually and/or automatically by the controller.

The first sub network constitutes a loop in which some of the LCB-C's are exchanged by LCB-L's. In the previous example, the short circuit in the localized irrigation control unit 238 resulted in the whole second sub network including the working localized irrigation control unit 240 being disconnected by the line circuit breaker 230. Thus, although the localized irrigation control unit 240 does work, it is out of power.

According to the present embodiment, a loop is generated in that an additional LCD-L is used compared to the tree structure of the second sub network. All of the LOB's in the loop, i.e. designated the reference numerals 220, 222, 224 and 226 are now LCB-L. The second sub network, including line circuit breakers 228, 230, constitutes a tree structure and therefore uses LCB-C. The start-up procedure may be that line circuit breakers 220, 222 are closed while the line circuit breakers 224, 226 are open. The line circuit breaker 222 cannot power localized irrigation control unit 234 due to a short circuit and the controller/power supply is being informed of the existence of a short circuit. The line circuit breaker 222 is therefore opened again. Thereafter, the localized irrigation control unit 234 and 236 are being connected by closing line circuit breaker 226 and 224. The line circuit breaker 224 cannot power the localized irrigation control unit 234 due to the same short circuit and again, the controller/power 202 supply is being informed and circuit breaker 222 is being opened. Thereafter, the localized irrigation control unit 232 and 236 are being powered, thus, the whole first sub network is now powered except the localized irrigation control unit 234, which is completely isolated. The controller/power supply may determine that there is a short circuit in the localized irrigation control unit 234 and that it is disconnected and that normal operations may continue on all of the remaining cable sections. In case the short circuit instead of the localized irrigation control unit 234 has taken place in the localized irrigation control unit 232, the procedure would instead be that line circuit breaker 220 would not be able to power the localized irrigation control unit 234 and the controller/power supply 202 would have been informed. Thereafter, the localized irrigation control units 234 and 236 would have been powered, where after line circuit breaker 222 would not be capable of powering the localized irrigation control unit 232. The line circuit breaker 222 would therefore again be opened. Again, the localized irrigation control unit 232 having a short circuit will be isolated while the rest of the network will operate as normal. All of the localized irrigation control units are connected in a parallel connection in relation to the 2-wire cable while the LOB's which are connected in a serial connection in relation to the 2-wire cable. Each 2-wire cable may accommodate a plurality of LOB's. Thus, the voltage drop over each LCB should be very small. The power loss when the LCB is closed should be very low. The LCB should also be capable of handling high currents caused by lightning strikes in the surrounding earth. Even when using protected circuits, which may couple the high lightning currents around the closed switch during a short time period, currents of more than 100 A may occur. A table will now follow in which different types of switches, which may be used for LOB's are described.

| Switch type | Advantages | Disadvantages |
| --- | --- | --- |
| Bipolar transistor | None | Minimum 2 transistors in series in each conductor. More than 0.3 V voltage drop over each transistor. Relatively high driving current. Expensive to implement due to number of elements which must be realized |
| MosFet | Very low driving current<br>Very low Ron<br>Very robust in relation to current impulses | Minimum 2 transistors in series in each conductor. Expensive to implement due to number of elements which must be realized |
| Triax | Very low driving current once the current is flowing through the unit.<br>Robust in relation to current impulses. Cheap to implement | More than 0.6 V voltage drop over the switch. |

| Switch type | Advantages | Disadvantages |
| --- | --- | --- |
| Relais, standard type (non-latching) | Very low Ron. Very robust in relation to current impulses. Cheap to implement. | Requires some power in order to drive |
| Relais, latching | Very low Ron. Very robust in relation to current impulses. No current is required in order to keep the contacts closed. Cheap to implement. | None |

From the above table it is evident that the latching type relay is the most promising embodiment for the LCB. Alternatively, a MosFet may be used. The present embodiment uses an LCB implementation using a latching relay as an LCB.

In case the cable network is short circuited, the most efficient method of finding the location of the short circuit is to follow the current from the controller/power supply towards the network until the location of the short circuit has been found. The short circuit is located at the location at which the current is 0 or very close to 0. This is done by sending a 40 to 100 Hz current from the controller/power supply to the network and following the current in a network by the use of a clamp ampere meter to measure the current in the wires of the 2-wire cable. The current may either be generated by an external generator or by the controller/power supply. By using the controller/power supply, the desired frequency is entered and the current limitation at the output stage of the controller/power supply is used for providing the appropriate current value. In case LOB's are used, the LCB will disconnect the failed cable section automatically and thus, the controller/power supply cannot be used for finding the exact position of the short circuit. One of the following methods may be used. Method 1: The LOB's are using a latching relay as a switch. According to the operating procedure, the LCB should open when the voltage of the cable disappears. In this way, the LCB is always open when the voltage returns. In a specific embodiment of the present invention, all of the LOB's which are closed before their first short circuit was registered are requested not to open when the voltage disappears. Further, the LCB is requested to reconnect the defect localized irrigation control unit and not disconnect it again when the voltage disappears. In this way, a direct contact from the controller/power supply through the LOB's is established. When the short circuit is found, the normal operation of the LOB's will return such that the voltage may again rise to a normal level. Please note that in case the short circuit is found at localized irrigation control unit 234, line circuit breaker 226 in the present example is open such that only line circuit breaker 224 is connected to the localized irrigation control unit 236, which is short circuited, via line circuit breakers 220 and 222. It is understood that the short circuit may be occurring in the localized irrigation control unit itself or in the surrounding two wire cable part.

The above method may only be used for LOB's which do not require any active power. The involved LOB's may be without power for an extended period. In such cases, the LCB may be configured such that it is able to drive the switch for a short period of time, such as 10 seconds without active power. In such cases, a cycle may be used so that the switch is held closed for 10 seconds and thereafter opened again for e.g. 3 seconds. In this period, the LOB's will be recharged for another 10 seconds. The cycle may continue until the failure has been removed or the controller/power supply stops the cycle. On the user level, the cycle may be noticeable by a short circuit for 10 seconds and a non-short circuit for 3 seconds and so on. A third method is to implement a current limitation in the LOB's. The current limitation may be activated by the controller/power supply. When the current limitation is activated, the LCB will limit the current which it transmits to the defect cable section. Thereby, the influence of the defect section, i.e. the short circuit or overload, will be reduced and the controller/power supply may continue to work in a normal condition. The controller/power supply may then activate the relevant LOB's until it reaches the failing section. The LCB adjacent to the failing section will then be instructed to close, however, via the current limitation. Thereafter, the controller/power supply may start alternating with a desired failure finding frequency and a clamp ampere meter may be used to find the failure as described above. A simple mode of implementing the current limitation in LOB's may be to connect resistances in series with a switch. A current limitation of e.g. 200 mA may be realized with a total resistance of 35V/0.2 A=175 Ohm. A drawback of using the present method is that there is a power loss due to the current limitation. In the present case, the power loss is 35V×0.2 A=7 W.

Figure 21:
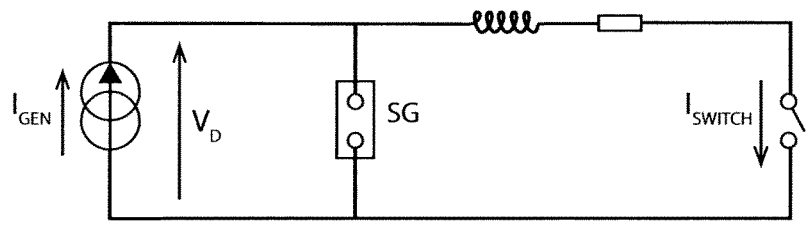
FIG. 21 shows an equivalent circuit diagram for a lightning protection circuit.

In FIG. 21, a circuit for protecting the line circuit breakers from lightning strikes is shown. As discussed above, a lightning strike in the surrounding earth may cause excessive currents in the 2-wire cable. Such currents have a characteristic saw tooth shape with a rise time of typically 2 us and a peak current value of 10 kA. After the peak value has been reached, the current typically falls back to 0 over a period of 50 us to 1 ms. Such high currents may easily damage the switch in the LCB and therefore, a further object of the present invention is to protect the switch of the LCB from the high lightning induced currents The lighting current peak has a rise time of typically 2 us and a peak value of IP. The induced current will constitute a common mode current in the 2-wire cable and therefore, effectively be half the peak value in each of the wires of the 2-wire cable. A spark gap such as a discharge tube SG may be placed parallel with the switch. A coil $L_S$ with an equivalent copper resistance of $R_S$ is placed in series with the switch. The switch is closed, i.e. the worst case situation. The rise of the current impulse may generate a voltage over the LS+RS+switch of approximately VB=IP/2 us×L. This voltage will be applied over the spark gap SG. In case the voltage applied is higher than the ignition voltage of the SG, the SG will activate and reduce the voltage to about 20V. After the activation of SG, substantially all of the lightning current will therefore flow through the SG instead of the switch. A spark gap does not activate instantly. Typical activation times for spark gaps will be under 100 ns assuming an ignition voltage over 1000V over the SG. The delay will increase for lower voltages. This will stipulate a minimum value for the $L_S$ in case at least 100V should be reached. Lmin=1000V×2 us/IP. Thus, in case IP is 5 kA, the minimum inductance LS is 0.4 uH. The current which is built up in LS before the activation of SG is IP×Tactivation/2 us. Assuming 5 kA and 100 ns, the current will be maximum 5 kA×100 ns/2 us=250 A. During the time following the activation of the SG, there is a constant voltage of approximately 20V over the SG and therefore, since the switches LS and RS are connected in parallel with the SG, the same voltage applies to the switch+LS+RS. The current flowing over the switch will thus be 20V/RS. Assuming that RS equals to 50 milliohm, the current through the switch will be 400 A. This value sounds very high, however, by calculating the current integral I2×S=400 A×400V×1 ms=160 A2S. Such values will not be critical for the switches used in the present context such as Triax or relays.

The spark gap SG used may be of a double type having a common center leg. This means that in comparison with the basic spark gap, the desired 1 kV initial voltage has been increased to 2 kV and the remaining voltage lying over LS+RS+Switch thereby increases from 20V to 40V. Therefore, the LS has been changed from 4 uH to 8 uH and RS from 50 mOhm to 100 mOhm. However, by establishing the allowable current integral of the switch, a suitable combination of maximum IP and $R_S$ may be reached. $R_S$ may be implemented as a discrete resistance as a part of a PCB layout or simply as the copper resistance inherent in $L_S$. $L_S$ acts as a coil in series with the cable which may influence the time it takes to alternate the cable. This influence may however easily be reduced by having the bindings of the two conductors wound together as a common load coil. Thereby, the effective $L_S$ and the normal operation will be reduced by at least 90% without affecting the actual LS during the lightning situation. The center leg of the two spark gaps may be connected to earth by means of an external earthing rod. Thereby, the LOB's form part of the lightning protection of the system. However, this is not necessary for protecting the features.

The addresses and the additional information of all of the localized irrigation control units are hereafter determined as described above.

Figure 22A:
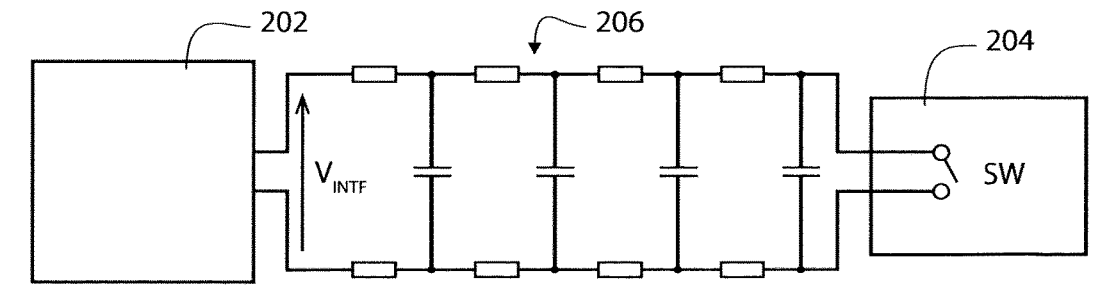
FIG. 22 shows a plot of the voltage at the controller/power supply when the localized irrigation control unit issues an interrupt by short circuiting the two wire cable.

FIG. 22A shows an equivalent circuit diagram representing the power supply 202, the localized irrigation control unit 204 and the two wire cable 206. The two wire cable 206 is represented by a number of resistors coupled in series and a number of capacitors coupled in parallel.

Figure 22B:
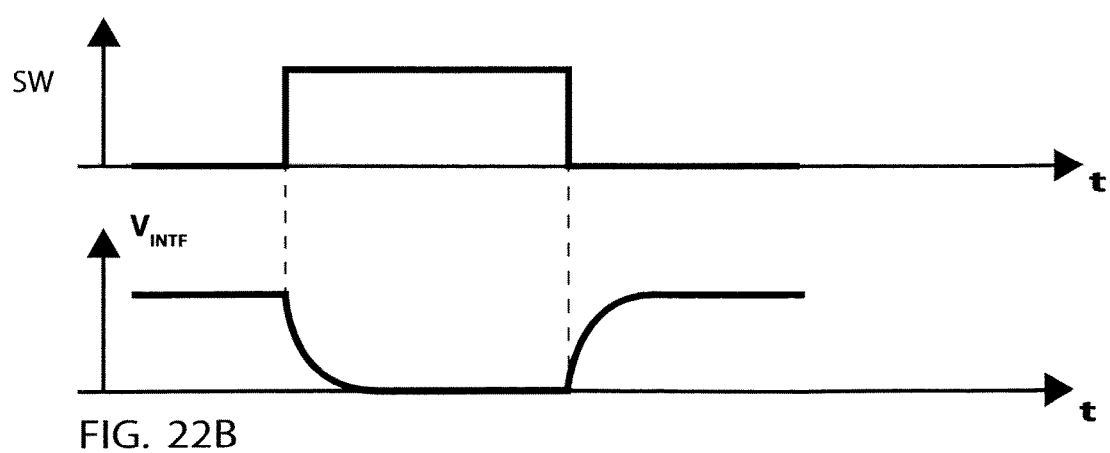

FIG. 22B shows a plot of the voltage at the controller/power supply when the localized irrigation control unit issues an interrupt by short circuiting the two wire cable. When the switch SW at the localized irrigation control unit 204 is being closed, the voltage drops to 0V at the controller/power supply 202. The voltage falls slowly due to the presence in the two wire cable 206 of line capacitance and line resistance, which has been illustrated by means of resistors and capacitances. The controller/power supply 202 interprets the voltage drop as an interrupt.

Figure 23:
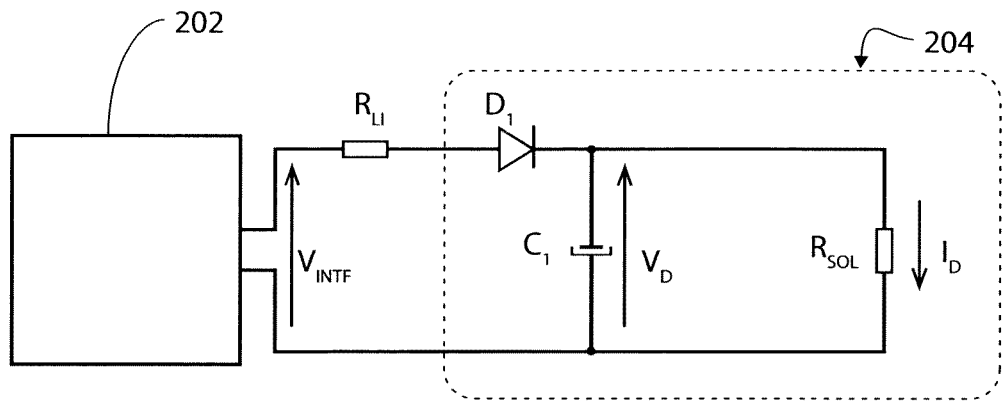
FIG. 23 shows an equivalent circuit diagram of the measurement of the line resistance during test.

FIG. 23 shows an equivalent circuit diagram of the measurement of the line resistance $R_{LI}$ during operation. The voltage $V_D$ may preferably be measured over the input capacitor $C_1$ of the localized irrigation control unit. The localized irrigation control unit 204 also includes an input diode $D_1$. The monitoring and reporting of the voltage value of the localized irrigation control unit input may be performed in several ways similar to the monitoring of the solenoid resistance and self-inductance as described above. It may be autonomous within the localized irrigation control unit constantly monitors the voltage of the input capacitor. In case the voltage of the input capacitor falls below a specific voltage figure point or voltage range, the localized irrigation control unit sends the data package to the controller/power supply, e.g. by using the interrupt system as described above, or alternatively following a request of the controller/power supply. Optionally, the localized irrigation control unit may refuse to open a valve and/or performing any tasks in case the voltage is not within the prescribed range and instead it may issue the command: 'Not acknowledged'. The monitoring may also be completely controlled by the controller/power supply, which collects measurement data regularly from a relevant localized irrigation control unit. Typically, only the localized irrigation control units at the end of a cable network must be monitored since such units will be most affected by an overloaded network. The controller/power supply may then itself react in a proper manner to the voltage measurement, e.g. by issuing a warning to the user or closing some of the valves in order to reduce the power consumption.

In order to determine the line resistance, the line decoder may measure the current in the solenoid $I_D$ and simultaneously measure the actual line voltage at the line decoder Vd. These values may then be returned to the controller/power supply. The line resistance $R_{LI}$ is calculated as $R_{LI}=(V_{INTF}-V_D)/I_D$, where $VI_{NTF}$ is the voltage at the controller/power supply 202, $V_D$ is the voltage over $C_1$, i.e. the localized irrigation control unit input capacitor, $I_D$ is the current through the solenoid $R_{SOL}$. The line resistance is preferably measured at the end of the inrush period, at which time all of the current for the solenoid is fed through $R_{SOL}$ and the inductance is negligible.

Figure 24:
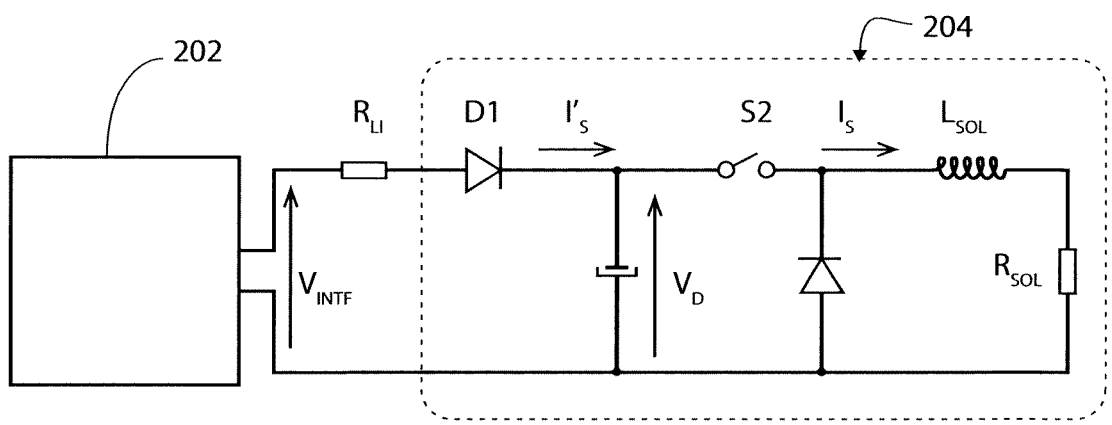
FIG. 24 shows an equivalent circuit diagram of the measurement of the line resistance during operation.

FIG. 24 shows an equivalent circuit diagram of the measurement of the line resistance during test. The measurement during test is similar to the measurement during operation, except that the circuit now includes a switch $S_1$, a second diode $D_2$ and a solenoid inductance $L_{SOL}$. When the measurement starts, the switch $S_1$ is closed and the voltage $V_D$ is measured over the input capacitor $C_1$ and the current $I_S$ is being measured at the solenoid.

Figure 25:
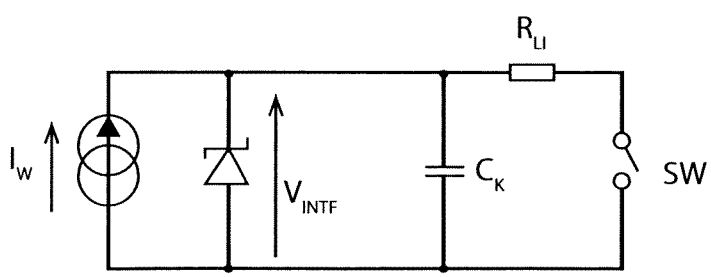
FIG. 25 shows an equivalent circuit diagram for the two wire cable when the localized irrigation control unit issues an interrupt by short circuiting the two wire cable.

FIG. 25 shows an equivalent circuit diagram for the two wire cable when the localized irrigation control unit issues an interrupt by short circuiting the two wire cable by closing the switch SW. This is normally done in the arbitration window for issuing an interrupt. By measuring the current $I_W$ and the voltage $V_{INTF}$ at the controller/power supply 202, the line resistance $R_{LI}$ may easily be derived as $R_{LI}=V_{INTF}/Iw$.

Figure 26A:
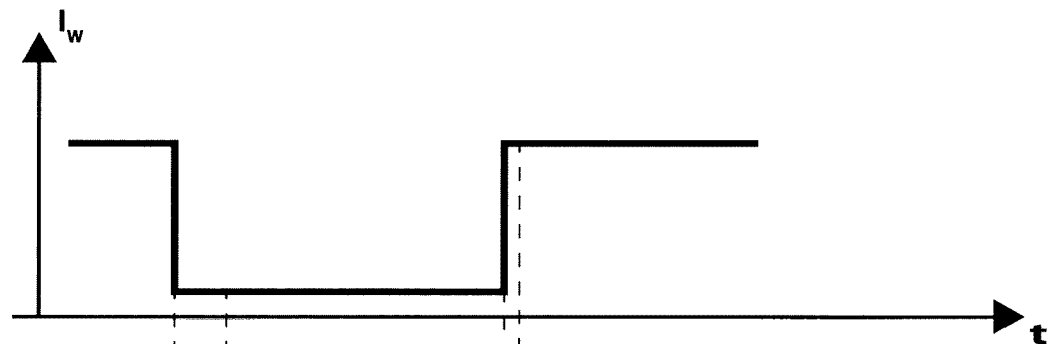
FIG. 26 shows a plot of the voltage at the controller/power supply when the localized irrigation control unit issues an interrupt by short circuiting the two wire cable.

FIG. 26A shows a plot of the current at the controller/power supply when the localized irrigation control unit issues an interrupt by short circuiting the two wire cable. In all systems having a 2-wire cable, there will be a capacity Ck between the individual conductors of the 2-wire cable. When the localized irrigation control unit short circuits the 2-wire cable, the complete capacity Ck should be recharged to a voltage below a given level, in which the controller/power supply may register that it should alternate.

Figure 26B:
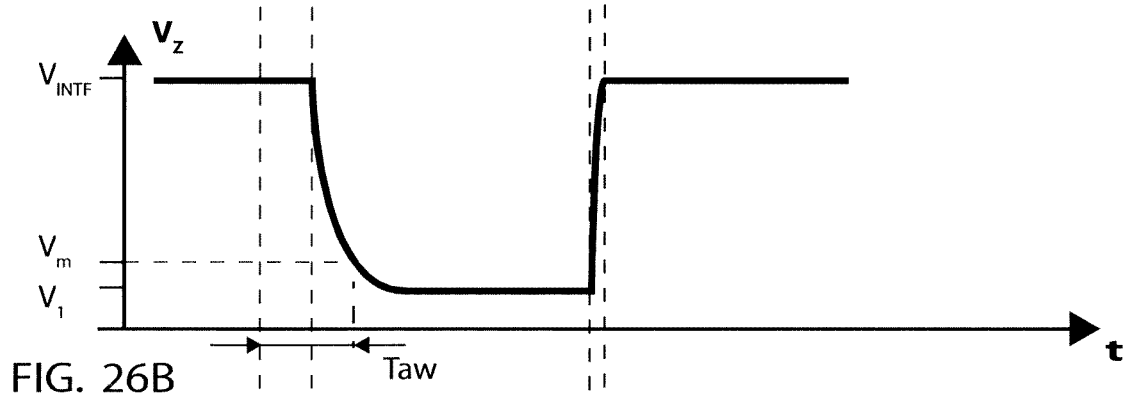

FIG. 26B shows a plot of the voltage at the controller/power supply when the localized irrigation control unit issues an interrupt by short circuiting the two wire cable. The arbitration window is started by a decrease in current $I_W$ from the controller/power supply.

Figure 26C:
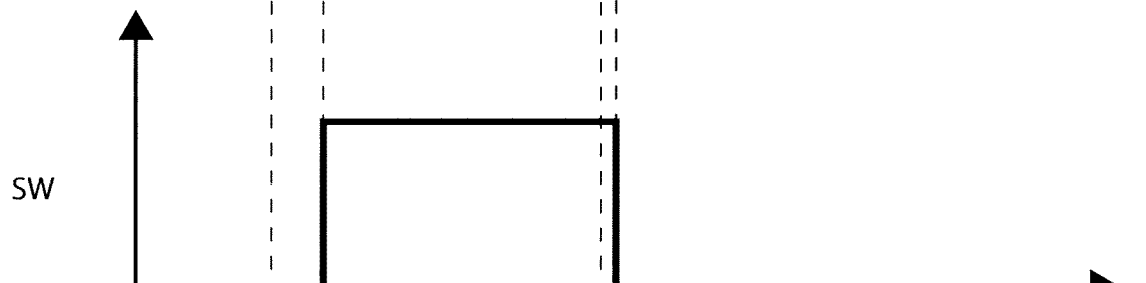

FIG. 26C shows the movement of the switch SW. The localized irrigation control unit subsequently short circuits the two wire cable by closing the switch SW. This causes the voltage Vz at the controller/power supply to fall towards a lower voltage V1. The rate of the voltage fall is determined by the line capacitance and line resistance. The voltage level Vm represents the voltage level which the controller interprets as an interrupt. Thus, the minimum arbitration window Taw may be determined to be the time period indicated, i.e. from the reduction of the current to the reaching of Vm.

Figure 27:
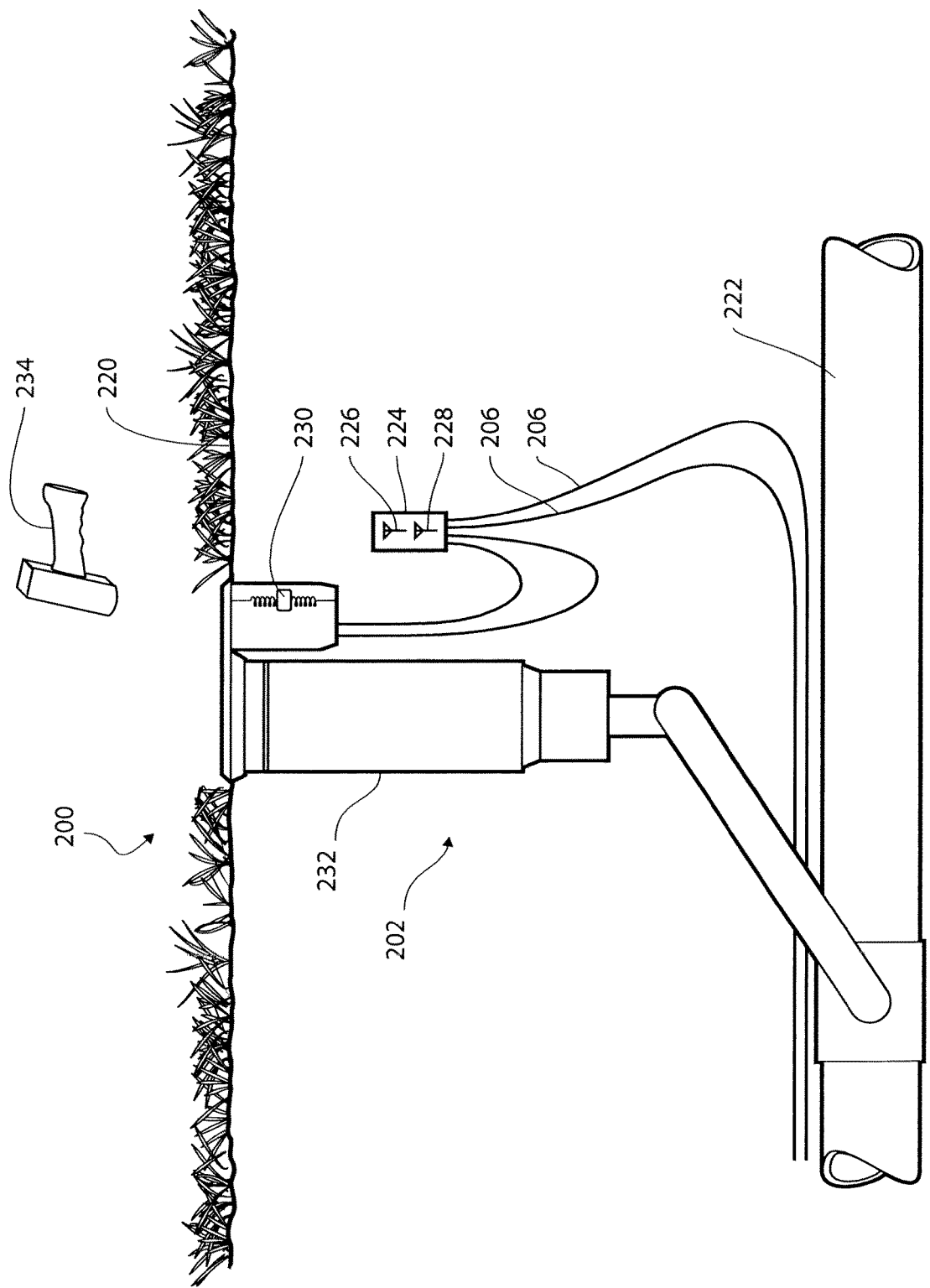
FIG. 27 shows a side view of a two-wire controlling and monitoring system.

FIG. 27 shows a side view of a localized irrigation control unit 202 of a two-wire controlling and monitoring system 200. The localized irrigation control unit 202 is installed in the soil 220 and is connected to a water pipeline 222. The localized irrigation control unit 202 comprises a line decoder 224 which is connected to the two wire cable 206. When the localized irrigation control units are installed in the soil, there is a need for providing a logical link between the physical location of the localized irrigation control unit and the identity of the localized irrigation control unit. The identity is in the present case understood to be the name which is used in the controller for identifying the localized irrigation control units on a user level. The identity is unique and coupled to the unique address of the localized irrigation control unit. Instead of a separate identity, the address may be used as the identity, e.g. a 16 bit code structure. However, typically, a more explanatory name is desired, e.g. the localized irrigation control unit number 8 on the seventh green may have the identity G7B8. When the controller is transmitting data packages from the controller/power supply to the localized irrigation control units, the address is used instead of the identity. In the past, a table was made up on a piece of paper, on which the identity, the position and the address of each localized irrigation control unit was noted by hand. This information was also included in the database of the controller. Various systems have been derived, such as providing extra labels on the localized irrigation control units, which may be removed and fastened to the table such that the address must not be manually noted in order to reduce the risk of any errors being made. Further, barcode and barcode labels may be used to simplify the registration of the address identity and location of the localized irrigation control units. It is thus a further object of the present invention to simplify the establishment of the logical link between the physical location of the localized irrigation control unit and the identity of the localized irrigation control unit.

The RFID antenna 226 may be realized as a printed coil on the PCB, however it may also be a separate RFID antenna 226. Using a suitable RFID reader 234, such as a Smartphone or a dedicated programming device or any other suitable portable communication unit, data may be transferred between the localized irrigation control unit and a portable communication unit without need of any external power supply.

The localized irrigation control unit 202 may further include a GPS antenna 228 in order to automatically establish the exact position of the localized irrigation control unit 202. The information about the position may be send to the controller/interface via the two wire cable.

The activity of the valve 232 may be detected by a chock sensor 230 located adjacent the valve 232 of the localized irrigation control unit 202. When the valve is activated, the chock sensor 230 senses the movement of the valve 232 due to the flow of water. Alternatively, a moisture sensor may be used. In addition to detecting activity or non-activity of the valve, the reaction of the localized irrigation control unit is necessary. The reaction may be either using Ack/Nack or interrupt. Then the controller/power supply sends the command: 'activate solenoid' to the localized irrigation control unit and the localized irrigation control unit will immediately react by sending an Ack or a Nack depending on whether the localized irrigation control unit is capable of activating the solenoid or not. In case the localized irrigation control unit is able to activate the solenoid, the localized irrigation control unit sends an Ack, while in case the localized irrigation control unit cannot activate the solenoid, a Nack is sent. The function of the Ack and Nack has been described in the prior art. For example, the solenoid may be disconnected or short circuited. Most valves are slow. It can take a few seconds or even minutes after the solenoid has been active before the sensor input may be used to determine whether the valve is working or not. Thus, the localized irrigation control units must be programmed from the controller/power supply or details of the valve such that the information of the sensor input may be used correctly. For instance, when using a pressure sensor, it may be established that the sensor input should be activated within a specific maximum after the solenoid activation. It should remain active until the solenoid is deactivated. In case sensor input shows that the valve reacts correctly, it should not do anything more, however, in case the sensor input shows that the valve does not react correctly, for example does not build up any pressure within the maximum allowable time, the localized irrigation control unit should inform the controller/power supply. It may be done by the controller/power supply pulling information from the localized irrigation control unit, however, more efficiently, the localized irrigation control unit sends a message to the controller/power supply via the interrupt. In this way, the communication bandwidth is not necessarily used for normal activations/deactivations of the solenoid, however, only in case of a functional error of the valve. A typical sequence may be:

1) The controller/power supply sends the command: 'activate solenoid' to the localized irrigation control unit. The localized irrigation control unit performs the operation and returns immediately:
   a) an Ack in case the operation apparently succeeded. The controller/power supply now knows that the localized irrigation control unit is working and the command was successful,
   b) a Nack in case the localized irrigation control unit immediately establishes that the command was unsuccessful. The controller/power supply now knows that the operation was unsuccessful.

2) In case Nack is received, it is further treated by the controller/power supply controller.

3.) In case Ack is received, the controller/power supply registers that the command has been performed and everything seems to be OK.

4) The controller/power supply knows that in case a failure in a valve function is established, the failure will automatically be reported to the controller/power supply. No failure reports mean that the valve is working correctly. The same sequence may in principle be used for deactivating the solenoids and for monitoring the deactivated period.

Example

The sensor decoder 52 shown in FIG. 11 and as described above was implemented in a prototype version from the following components.

Fuse:

| P1 | 230V |
|---|---|

Resistors:

| R1 | 46R4 |
|---|---|
| R2 | 46R4 |
| R3 | 100K |
| R4 | 86K6 |

| | |
|---|---|
| R5 | 100K |
| R6 | 100K |
| R7 | 100K |
| R8 | 10K |
| R9 | 150K |
| R10 | 768K |
| R11 | 22K1 |
| R12 | 100K |
| R13 | 39K |
| R14 | 39R2 |
| R15 | 10K |
| R16 | 39K |
| R17 | 39K |
| R18 | 10K |
| R19 | 39K |
| R20 | 39K |
| R21 | 86K6 |
| R22 | 4R7 |
| R23 | 10K |
| R24 | 10K |
| R25 | 10K |
| R26 | 10K |
| R27 | 470K |
| R28 | 470K |
| R29 | 56K |
| R30 | 39K |
| R31 | 27K1 |
| R32 | 39K |
| R33 | 56K |
| R34 | 100K |
| R35 | 2K49 |
| R36 | 825R |
| R37 | 2R2 |
| R38 | 39K |

Capacitors:

| | |
|---|---|
| C1 | 1000u |
| C2 | 10n |
| C3 | 100n |
| C4 | 10u |
| C5 | 33p |
| C6 | 33p |
| C7 | 1n |
| C8 | 1n |
| C9 | 100n |
| C10 | 100n |
| C11 | 1n |
| C12 | 1n |
| C13 | 1n |

Diodes:

| | |
|---|---|
| D1 | DF04S |
| D2 | 10V |
| D3 | BYD17D |
| D4 | BYD17D |
| D5 | BYD17D |
| D6 | BYD17D |
| D7 | 6V8 |
| D8 | LL4148 |
| D9 | LL4148 |
| D10 | 3V2 |
| D11 | 22V |
| D12 | 22V |
| D13 | 15V |

Transistors:

| | |
|---|---|
| Q1 | TIP122 |
| Q2 | BC856 |
| Q3 | BC846 |
| Q4 | BC856 |
| Q5 | BC846 |
| Q6 | MJD6039 |
| Q7 | MJD6039 |

Integrated Circuits and Crystal

| | |
|---|---|
| IC1 | ST6220 |
| IC2 | 93C05 |
| IC3 | LM317LM |
| IC4 | LM358N |
| IC5 | LMC662C |
| X1 | 6.144 MHz |

The line decoder 44 shown in FIG. 12 and as described above was implemented in a prototype version from the following components.

Fuse:

| | |
|---|---|
| P1 | 200 mA |

Resistors:

| | |
|---|---|
| R1 | 470K |
| R2 | 100K |
| R3 | 100K |
| R4 | 680K |
| R5 | 100K |
| R6 | 68K |
| R7 | 56K |
| R8 | 470K |
| R9 | 1K |
| R10 | 33K |
| R11 | 1M |
| R12 | 470K |
| R13 | 1K |
| R18 | 1K |
| R19 | 3K3 |

Capacitors:

| | |
|---|---|
| C1 | 3n3 |
| C2 | 3n3 |
| C3 | 3n3 |
| C4 | 10u |
| C5 | 10u |
| C6 | 1000u |
| C7 | 3n3 |

Diodes:

| | |
|---|---|
| D1 | DF04S |
| D2 | BZX84-10V |
| D3 | LL4148 |
| D4 | MLL4690 |
| D5 | BYD17D |
| D6 | BYD17D |

Transistors

| | |
|---|---|
| Q1 | BC856B |
| Q2 | BC856B |
| Q3 | 2SB1214 |
| Q4 | 2SB1817 |

Integrated Circuits

| | |
|---|---|
| IC1 | uPD7556 |
| IC2 | 93C06 |

The line decoder 44 shown in FIG. 12 and as described above was implemented in a prototype version from the following components.

Resistors:

| | |
|---|---|
| R1 | 470K |
| R2 | 100K |
| R3 | 100K |
| R4 | 680K |
| R5 | 100K |
| R6 | 68K |
| R7 | 56K |
| R8 | 470K |
| R9 | 1K |
| R10 | 33K |
| R11 | 1M |
| R12 | 68K |
| R13 | 1K |
| R14 | 3K3 |
| R15 | 3K3 |
| R16 | 3K3 |
| R17 | 3K3 |
| R18 | 1K |
| R19 | 3K3 |

Capacitors:

| | |
|---|---|
| C1 | 3n3 |
| C2 | 3n3 |
| C3 | 2200u |
| C4 | 10u |
| C5 | 1u |

Diodes:

| | |
|---|---|
| D1 | DF04S |
| D2 | BZX84-10V |
| D3 | LL4148 |
| D4 | MLL4690 |
| D5 | BYD17D |
| D6 | BYD17D |
| D7 | BYD17D |
| D8 | BYD17D |
| D9 | BYD17D |
| D10 | BYD17D |
| D11 | BYD17D |
| D12 | BYD17D |
| D13 | BYD17D |
| D14 | BYD17D |
| D15 | BYD17D |
| D16 | BYD17D |
| D17 | BYD17D |

Transistors:

| | |
|---|---|
| Q1 | BC856B |
| Q2 | BC855B |
| Q3 | 2SB1214 |
| Q4 | 2SB1214 |
| Q5 | 2SB1214 |
| Q6 | 2SB1214 |
| Q7 | MJD6039 |
| Q8 | 2SB1214 |
| Q9 | 2SB1214 |

Integrated Circuits:

| | |
|---|---|
| IC1 | uPD7556 |
| IC2 | 93C06 |

The microprocessor and storage section shown in FIGS. 14*a* and 14*b* and as described above was implemented in a prototype version from the following components.

Resistors:

| | | | | | |
|---|---|---|---|---|---|
| R105 | 4K7 | R14 | 1M | R102 | PTC4.3 |
| R104 | 1K | R4 | 680K | R101 | 0R |

Capacitors and Inductors:

| | |
|---|---|
| C101 | 100u |
| C103 | 100n |
| C104 | 100n |
| C105 | 100n |
| C106 | 100n |
| C107 | 100n |
| C108 | 22n |
| C109 | 22n |
| C110 | 22n |
| C111 | 22n |
| C112 | 10u |
| C113 | 22n |
| C6 | 33p |
| C7 | 33p |
| L101 | 10u |
| L102 | 10u |
| L103 | 10u |

Diodes:

| | | | | |
|---|---|---|---|---|
| D1 | ICTE5 | D104 | BZW06P6V8BD105 | BZW06P6V8B |

Integrated Circuits and Crystal:

| | |
|---|---|
| IC101 | 27256 |
| IC102 | 62256 |
| IC103 | 6264 |
| IC104 | 6264 |
| IC106 | 74HC138 |
| IC107 | 8031 |
| IC108 | 74HC573 |
| IC110 | 75175 |
| IC111 | 74HC02 |
| IC112 | 74HC08 |
| IC115 | 4548 |
| IC116 | 74HC366 |
| IC4 | PC812 |
| IC5 | PC813 |
| IC6 | PC910 |
| X1 | 11.0592 |

The power output stage shown in FIGS. 15*a* and 15*b* and as described above was implemented in a prototype version from the following components.

Resistors:

| | |
|---|---|
| R1 | 390R |
| R2 | 1K |
| R3 | Not Used |
| R4 | 390R |
| R5 | Not Used |
| R6 | 100R |

-continued

| | |
|---|---|
| R7 | 100R |
| R8 | 10K |
| R9 | 18K |
| R10 | 390K |
| R11A | 2R |
| R11B | 2R |
| R11C | 2R |
| R11D | 2R |
| R12 | 1K |
| R13 | 1M |
| R15 | 10K |
| R16 | 14K |
| R17 | 487K |
| R18 | 10K |
| R19 | 110K |
| R20 | 53K6 |
| R21 | 365K |
| R22 | 4R7 |
| R23 | 470R |
| R24 | 470R |
| R25 | 27R |
| R26 | 27R |
| R27 | 1K |
| R28 | 47R |
| R29 | 10K |
| R30 | 100K |
| R31 | 100K |
| R32 | 100K |
| R33 | 100R |
| R34 | 1K |
| R35 | 20K |
| R36 | 1M |
| R37 | 68R |
| R38 | 270R |
| R39 | 47R |
| R40 | 100K |
| R51 | 390K |
| R52 | 10K |
| R53 | 1K |
| P1 | S10K25 |
| P2 | S10K25 |
| P3 | S10K25 |
| P5 | S10K25 |
| P6 | S10K25 |
| P7 | S10K25 |

Capacitors and Inductors:

| | |
|---|---|
| C1 | Not Used |
| C2 | Not Used |
| C3 | Not Used |
| C4 | Not Used |
| C5 | 1n |
| C8 | 1000u |
| C9 | 100u |
| C10 | 100u |
| C12 | 10u |
| C13 | 10u |
| C14 | 10u |
| C15 | 22n |
| C16 | 22n |
| C20 | Not Used |
| C21 | Not Used |
| C50 | 100n |
| C51 | 100n |
| C52 | 1u |
| L1 | 25u |
| L2 | 25u |
| RE1 | Relay |

Diodes:

| | |
|---|---|
| D1 | BYW98 |
| D2 | BYW98 |
| D4 | Z6V8 |

-continued

| | |
|---|---|
| D5 | Z15V/1W |
| D6 | 1N4148 |
| D8 | 1N4002 |
| D9 | 1N4002 |
| D10 | 1N4002 |
| D11 | 1N4002 |
| D103 | 1N4148 |

Transistors:

| | |
|---|---|
| T1 | B0637 |
| T2 | BDW74D |
| T3 | IRFD02 |
| T4 | B0637 |
| T5 | BDW74D |
| T6 | IRFD02 |
| T8 | TIP100 |

Integrated Circuits:

| | |
|---|---|
| IC1 | LM7812 |
| IC2 | CA3240A |
| IC3 | LM340LA |
| IC7 | LM3395 |
| IC9 | 4001 |
| IC10 | 4053 |
| IC11 | 4094 |
| IC12 | 4094 |
| IC13 | ADC0834 |
| IC14 | 44111 |
| IC15 | TCA365A |

The mark sender shown in FIGS. 16*a* and 16*b* and as described above was implemented in a prototype version from the following components.

Resistors:

| | |
|---|---|
| R1 | 12R |
| R2 | 10K |
| R3 | 5K6 |
| R4 | 22R |
| R5 | 2K2 |
| R6 | 10K |
| R7 | 680R |
| R8 | 330R |
| R9 | 100K |
| R10 | 100K |
| R11 | 270K |
| R12 | 270K |
| R13 | 10K |
| R14 | 3K3 |
| R15 | 10K |
| R16 | 2K2 |
| R17 | 10K |
| R18 | 56K |
| R19 | 27K |
| R20 | 10K |
| R21 | 1K |
| R22 | 100K |
| R23 | 10K |

Capacitors and Inductors:

| | |
|---|---|
| C1 | 10u |
| C2 | 220u |
| C3 | 100n |
| C4 | 220p |
| C5 | 100u |
| C6 | 47n |

-continued

|  |  |
|---|---|
| C7 | 47n |
| C8 | 47n |
| C9 | 47n |
| C10 | 100n |
| C11 | 10u |
| C12 | 100n |
| C13 | 220u |
| L1 | 100u |

Diodes:

|  |  |
|---|---|
| D1 | DFO4M |
| D2 | P6KE47A |
| D3 | 10V |
| D4 | BYW100 |
| D5 | 3V9 |
| D6 | 1N4148 |

Transistors:

|  |  |
|---|---|
| T1 | IRF9120 |
| T2 | BC337 |
| T3 | IRF110 |
| T4 | IRF110 |

Integrated Circuits and Crystal:

|  |  |
|---|---|
| IC1 | 80031 |
| IC2 | 26G256 |
| IC3 | 74HC573 |
| IC4 | X2444 |
| IC5 | 74HC541 |
| IC6A | 74HC95 |
| IC6B | 74HC352 |
| IC7 | 74HC86 |
| IC8 | LM324 |
| IC9 | 7555 |
| IC10 | LM317 |
| X1 | 6.144MHz |

Points

1. A two-wire controlling and monitoring system for in particular irrigation of localized areas of soil and comprising:
   a water pipeline providing water to said localized areas of soil,
   a first plurality of controllable irrigation valves each positioned at a specific area of said localized areas of soil, each connected to said water pipeline for providing watering or non-watering of said specific area of said localized areas of soil and each having a pair of valve control inputs,
   a second plurality of field sensors positioned at specific areas of said localized areas of soil, providing specific irrigation parameters and having a pair of sensor outputs,
   a third plurality of localized irrigation control units each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs,
   a controller and power supply unit having a first set of schedules of instructions according to a first communications protocol and a second set of schedules of instructions according to a second communications protocol, said controller and power supply having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped, but of inverted polarity as compared to said first alternating DC voltage signal to another of said pair of control and power outputs and applying an alternating DC current defining a current maximum having a third pulse width and defining a current minimum having a fourth pulse width to said pair of control and power outputs,
   a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units,
   said controller and power supply unit transmitting a type declaration to said third plurality of localized irrigation control units through said two-wire cable using said first communications protocol, said type declaration providing communication under said second communication protocol,
   said controller and power supply unit transmitting said second set of schedules of instructions to said third plurality of localized irrigation control units through said two-wire cable using said second communications protocol, and
   said controller and power supply unit transmitting said first set of schedules of instructions to said third plurality of localized irrigation control units through said two-wire cable using said first communications protocol.

2. The two-wire controlling and monitoring system according to point 1, wherein, before transmitting said type declaration, said controller and power supply unit transmitting said second communications protocol to said third plurality of localized irrigation control units through said two-wire cable using said first communications protocol.

3. A two-wire controlling and monitoring system for in particular irrigation of localized areas of soil and comprising:
   a water pipeline providing water to said localized areas of soil,
   a first plurality of controllable irrigation valves, each positioned at a specific area of said localized areas of soil, each connected to said water pipeline for providing watering or non-watering of said specific area of said localized areas of soil and each having a pair of valve control inputs, a second plurality of field sensors positioned at specific areas of said localized areas of soil, providing specific irrigation parameters and having a pair of sensor outputs, a third plurality of localized irrigation control units, each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs, a controller and power supply unit having a set of schedules of instructions and a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units, provided said second plurality of field sensors and said third plurality of localized irrigation control units are disconnected from said two-wire cable, said controller and power supply unit supplying a specific constant current for alternating said first alternating DC voltage signal from a first voltage to a second voltage during a specific time period and calculating the capacity of said two-wire cable by multiplying said specific current by said time period and dividing the product by the difference between said first voltage and said second voltage.

4. The two-wire controlling and monitoring system according to point 3, wherein said controller and power supply unit supplying a specific low constant current, a leakage voltage being measured between said pair of control and power outputs of said controller and power supply unit and a leakage resistance in said two-wire cable being calculated by dividing said leakage voltage by said specific low constant current.

5. A two-wire controlling and monitoring system for in particular irrigation of localized areas of soil and comprising:

a water pipeline providing water to said localized areas of soil, a first plurality of controllable irrigation valves each positioned at a specific area of said localized areas of soil, each connected to said water pipeline for providing watering or non-watering of said specific area of said localized areas of soil and each having a pair of valve control inputs, a second plurality of field sensors positioned at specific areas of said localized areas of soil, providing specific irrigation parameters and having a pair of sensor outputs, a third plurality of localized irrigation control units each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs, a controller and power supply unit having a set of schedules of instructions and a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units, said controller and power supply unit determining at the end of said third pulse width the difference between a first voltage measured between said pair of control and power outputs, and, a second voltage measured between said pair of control and power supply inputs of said sensor decoder and/or line decoder, and calculating a cable resistance by dividing said difference with said current maximum.

6. The two-wire controlling and monitoring system according to point 5, wherein said current maximum is compensated for the duty cycle used.

7. The two-wire controlling and monitoring system according to point 5 or 6, wherein a test program is used for calculating the cable resistance or alternatively, the cable resistance is calculated during normal operation.

8. The two-wire controlling and monitoring system according to point 5, 6 or 7, wherein said cable resistance is calculated during the arbitration window.

9. A two-wire controlling and monitoring system for in particular irrigation of localized areas of soil and comprising:
- a water pipeline providing water to said localized areas of soil,
- a first plurality of controllable irrigation valves each positioned at a specific area of said localized areas of soil, each connected to said water pipeline for providing watering or non-watering of said specific area of said localized areas of soil and each having a pair of valve control inputs,
- a second plurality of field sensors positioned at specific areas of said localized areas of soil, providing specific irrigation parameters and having a pair of sensor outputs,
- a third plurality of localized irrigation control units each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs,
- a controller and power supply unit having a set of schedules of instructions and a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs,
- a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units,
- said controller and power supply unit transmitting said schedules of instructions to said third plurality of localized irrigation control units through said two-wire cable and receiving said specific irrigation parameters from said third plurality of localized irrigation control units through said two-wire cable,
- wherein said controller and power supply unit comprises a microprocessor, a storage unit for storing said schedules of instructions, an output section for providing power to said two-wire cable and transmitting said schedules of instruction on said two-wire cable, and an input section for monitoring voltage of said two-wire cable, said microprocessor controlling said output section to apply said minimum current to said two-wire cable during an interrupt window and/or wherein each of said sensor decoders and/or line decoders comprise a short circuiting circuit providing an interrupt signal during said interrupt window to said controller and power supply unit by unidirectional short circuiting said pair of control and power supply inputs hence reducing differential voltage of said two-wire cable and no interrupt signal by open circuiting said pair of control and power supply inputs, said interrupt signal is constituted by a voltage drop of said differential voltage of said two-wire cable in the range of 5V to 65V such as a range of 15V to 60V, or preferably said voltage drop is 50V and/or wherein said interrupt window is initiated following a DC alternation of said first alternating DC voltage signal and said second alternating DC voltage signal and a power supply period, said power supply period is in the range 5 ms to 550 ms such as ranges 10 ms to 250 ms or 50 ms to 100 ms, said interrupt window being dependent on the distance between said controller and power supply unit and each of said sensor decoders and/or line decoders, said interrupt window being in the range of 0.2 ms to 10 ms or preferably said interrupt window is shorter than 1 ms.

10. A two-wire controlling and monitoring system for in particular irrigation of localized areas of soil and comprising:
- a water pipeline providing water to said localized areas of soil,
- a first plurality of controllable irrigation valves, each positioned at a specific area of said localized areas of soil, each connected to said water pipeline for providing watering or non-watering of said specific area of said localized areas of soil and each having a pair of valve control inputs,
- a second plurality of field sensors positioned at specific areas of said localized areas of soil, providing specific irrigation parameters and having a pair of sensor outputs,
- a third plurality of localized irrigation control units, each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs,
- a controller and power supply unit having a set of schedules of instructions and a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and wherein said maximum current and said minimum current are temporarily increased/decreased during alternation of said first and second alternating DC voltage signal.

11. The two-wire controlling and monitoring system according to point 10 wherein said cable maximum current being in the range of 0.5 A to 5 A such as 0.75 A to 1.5 A, said maximum current being in the range 2-4 A, such as 3 A.

12. A two-wire controlling and monitoring system for in particular irrigation of localized areas of soil and comprising:

a water pipeline providing water to said localized areas of soil, a first plurality of controllable irrigation valves, each positioned at a specific area of said localized areas of soil, each connected to said water pipeline for providing watering or non-watering of said specific area of said localized areas of soil and each having a pair of valve control inputs, a second plurality of field sensors positioned at specific areas of said localized areas of soil, providing specific irrigation parameters and having a pair of sensor outputs, a third plurality of localized irrigation control units, each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units, and said controller and power supply unit transmitting said schedules of instructions to said third plurality of localized irrigation control units through said two-wire cable and receiving said specific irrigation parameters from said third plurality of localized irrigation control units through said two-wire cable.

wherein said schedules of instructions comprise a an address of a specific designated group of localized irrigation control unit of said third plurality of localized irrigation control units, data disclosing information regarding actions to be taken by said specific designated group of localized irrigation control unit of said third plurality of localized irrigation control units.

13. The two-wire controlling and monitoring system according to point 12, wherein said specific irrigation parameters from said third plurality of localized irrigation control units including said address of said specific designated group of localized irrigation control units followed by specific irrigation parameters of each of said localized irrigation control units of said specific designated group of localized irrigation control units.

14. A two-wire controlling and monitoring system for in particular irrigation of localized areas of soil and comprising:

a water pipeline providing water to said localized areas of soil, a first plurality of controllable irrigation valves, each positioned at a specific area of said localized areas of soil, each connected to said water pipeline for providing watering or non-watering of said specific area of said localized areas of soil and each having a pair of valve control inputs, a second plurality of field sensors positioned at specific areas of said localized areas of soil, providing specific irrigation parameters and having a pair of sensor outputs, a third plurality of localized irrigation control units, each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units, and said controller and power supply including a register for storing a register balance value representing the difference between the accumulated time of maximum voltage of said first alternating DC voltage signal and the accumulated time of minimum voltage of said first alternating DC voltage signal or alternatively the average voltage of said first alternating DC voltage signal.

15. The two-wire controlling and monitoring system according to point 14, wherein said first and second pulse widths are chosen such that said register balance value is equal to or approaches zero.

16. The two-wire controlling and monitoring system according to point 14 or 15, wherein said controller and power supply unit calculating an instruction balance value representing the difference between the accumulated time of maximum voltage of said first alternating DC voltage signal and the accumulated time of minimum voltage of said first alternating DC voltage signal according to said schedules of instructions.

17. The two-wire controlling and monitoring system according to point 16, wherein said controller and power supply unit transmitting said schedules of instructions to said third plurality of localized irrigation control units through said two-wire cable and the voltage of said first and second alternating DC voltage signals before the start of the transmission are chosen such that said register balance value after said transmission is equal to zero or approaches zero.

18. The two-wire controlling and monitoring system according to any of the points 14-17, wherein said schedules of instructions are transmitted onto said two-wire system by re-scaling said first pulse width or said second pulse width to fifth pulse width in the range 100 us to 49 ms indicating a binary "1", or by re-scaling said first pulse width or said second pulse width to a sixth pulse width in the range 50 us to 9 ms indicating binary "0", said transmission being terminated by stop signal having a seventh pulse width in the range 2 ms to 70 ms, said fifth, sixth and seventh pulse width being altered by no more than 10%, preferably no more than 5% such that said register balance value after said transmission is equal to zero or approaches zero.

19. A two-wire controlling and monitoring system for in particular irrigation of localized areas of soil and comprising:

a water pipeline providing water to said localized areas of soil, a first plurality of controllable irrigation valves each positioned at a specific area of said localized areas of soil, each connected to said water pipeline for providing watering or non-watering of said specific area of said localized areas of soil and each having a pair of valve control inputs, a second plurality of field sensors positioned at specific areas of said localized areas of soil, providing specific irrigation parameters and having a pair of sensor outputs, a third plurality of localized irrigation control units each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units, said controller and power supply unit transmitting said schedules of instructions to said third plurality of localized irrigation control units through said two-wire cable and receiving said specific irrigation parameters from said third plurality of localized irrigation control units through said two-wire cable, wherein said schedules of instructions comprise a type declaration determining a primary address of a specific designated localized irrigation control unit of said third plurality of localized irrigation control units, said primary address of said specific designated localized irrigation control unit of said third plurality of localized irrigation control units being defined by said controller and power supply and comprising an address transmission size in the range 0 to 128 bits such as ranges 0 to 64 bits or 0 to 32, or said address transmission size preferably 16 bits, and wherein said schedules of instructions comprise a type declaration determining a secondary address of a specific designated localized irrigation control unit of said third plurality of localized irrigation control units, said secondary address of said specific designated localized irrigation control unit of said third plurality of localized irrigation control units being unique, permanently predefined and comprising an address transmission size greater than the address transmission size of said primary address, said address transmission size of said secondary address being in the range of 0 to 256 bits such as ranges 0 to 128 bits or 0 to 64, or said address transmission size preferably 32 bits.

20. The two-wire controlling and monitoring system according to point 19, wherein said schedules of instructions comprise a type declaration determining basic data of a specific designated localized irrigation control unit of said third plurality of localized irrigation control units, said basic data including e.g. the resistance and the capacitance of said two-wire cable and/or GPS coordinates of the specific designated localized irrigation control unit.

21. The two-wire controlling and monitoring system according to point 19 or 20, wherein said schedules of instructions comprise a type declaration determining an address of said controller and power supply unit.

22. The two-wire controlling and monitoring system according to point 19, 20 or 21, wherein said controller and power supply unit receives said primary address and/or said secondary address through said two-wire cable.

23. A two-wire controlling and monitoring system for in particular irrigation of localized areas of soil and comprising:
a water pipeline providing water to said localized areas of soil,
a first plurality of controllable irrigation valves each positioned at a specific area of said localized areas of soil, each connected to said water pipeline for providing watering or non-watering of said specific area of said localized areas of soil and each having a pair of valve control inputs,
a second plurality of field sensors positioned at specific areas of said localized areas of soil, providing specific irrigation parameters and having a pair of sensor outputs,
a third plurality of localized irrigation control units each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs, each of said localized irrigation control units further comprising a wireless communication unit for communicating with a portable communication device.

24. The two-wire controlling and monitoring system according to point 24, wherein said wireless communication unit comprises a Bluetooth communication unit.

25. The two-wire controlling and monitoring system according to point 24, wherein said wireless communication unit comprises an RFID communication unit.

26. The two-wire controlling and monitoring system according to point 25, wherein said wireless communication unit communicates in the frequency range of 10 MHz to 20 MHz, such as 13.45 MHz to 13.65 MHz.

27. The two-wire controlling and monitoring system according to any of the points 23-26, wherein said wireless communication unit transmits an address of said specific designated localized irrigation control unit of said third plurality of localized irrigation control units to said portable communication device or vice versa.

28. The two-wire controlling and monitoring system according to point 27, wherein said address comprises an address transmission size in the range of 0 to 128 bits, such as ranges 0 to 64 bits or 0 to 32.

29. The two-wire controlling and monitoring system according to any of the points 23-28, wherein said portable communication device includes a GPS receiver and wherein said portable device transmits GPS coordinates corresponding to said specific area of said localized areas of soil to said localized irrigation control unit.

30. The two-wire controlling and monitoring system according to point 29, wherein said two-wire controlling and monitoring system further comprises a controller and power supply unit having a pair of control and power outputs supplying power and a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units, said GPS coordinates are transmitted via said two-wire cable from each of said third plurality of localized irrigation control units to said controller and power supply unit.

31. The two-wire controlling and monitoring system according to point 30, wherein said GPS coordinates are displayed on a screen, preferably in conjunction with a map software such as Google Earth.

32. A two-wire controlling and monitoring system for in particular irrigation of localized areas of soil and comprising:
a water pipeline providing water to said localized areas of soil,
a first plurality of controllable irrigation valves, each positioned at a specific area of said localized areas of soil, each connected to said water pipeline for providing watering or non-watering of said specific area of said localized areas of soil and each having a pair of valve control inputs,
a second plurality of localized irrigation control units, each comprising a line decoder having a pair of valve control outputs connected to said pair of valve control inputs of a specific controllable irrigation valve of said first plurality of controllable irrigation valves for providing valve control signals to said first plurality of controllable irrigation valves, said line decoder further each having a pair of control and power supply inputs for communicating with a controller and power supply over a two-wire cable,
said specific controllable irrigation valve of said first plurality of controllable irrigation valves comprise a solenoid connected to said valve control inputs, a core operable between a first position and a second position, and a piston connected to said core,
said line decoder defining an inrush DC voltage level signal for forcing said core into said second position,
said line decoder defining a hold DC voltage level signal for retaining said core in said second position,
said line decoder determining said first position or said second position of said core, measuring a self inductance value and a resistance value of said solenoid, and said line decoder transmitting said self inductance value and said resistance value to said controller and power supply via said two-wire cable or alternatively monitors said self inductance value and said resistance value and signals said controller and power supply in case any of said self inductance value and said resistance value is outside a predetermined range.

33. A two-wire controlling and monitoring system for in particular irrigation of localized areas of soil and comprising:

a water pipeline providing water to said localized areas of soil, a first plurality of controllable irrigation valves each positioned at a specific area of said localized areas of soil, each connected to said water pipeline for providing watering or non-watering of said specific area of said localized areas of soil and each having a pair of valve control inputs, a second plurality of field sensors positioned at specific areas of said localized areas of soil, providing specific irrigation parameters and having a pair of sensor outputs, a third plurality of localized irrigation control units each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs, a controller and power supply unit having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs, a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units, and said sensor decoder and/or said line decoder measuring a voltage value on said control and power inputs, and said sensor decoder and/or line decoder transmitting said voltage value to said controller and power supply via said two-wire cable or alternatively monitors said voltage value and signals said controller and power supply in case any of said self voltage value is outside a predetermined range.

34. A two-wire controlling and monitoring system for in particular irrigation of localized areas of soil and comprising:

a water pipeline providing water to said localized areas of soil, a first plurality of controllable irrigation valves, each positioned at a specific area of said localized areas of soil, each connected to said water pipeline for providing watering or non-watering of said specific area of said localized areas of soil and each having a pair of valve control inputs, a second plurality of localized irrigation control units, each comprising a line decoder having a pair of valve control outputs connected to said pair of valve control inputs of a specific controllable irrigation valve of said first plurality of controllable irrigation valves for providing valve control signals to said first plurality of controllable irrigation valves, said line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, and a two-wire cable interconnecting said controller and power supply unit and said third plurality of localized irrigation control units and connecting said pair of control and power outputs of said controller and power supply unit to said control and power inputs of said third plurality of localized irrigation control units in a parallel connection, said two-wire cable including one or more line circuit breaker in a series connection for automatically interrupting the connection between at least one of said pair of control and power outputs of said controller and power supply unit and at least one of said control and power inputs of at least one of said third plurality of localized irrigation control units, 35. The two-wire controlling and monitoring system according to point 34, wherein said line circuit breaker automatically interrupts in case the current in said two wire cable exceeds a trigger level.

36. The two-wire controlling and monitoring system according to point 34, wherein said line circuit breaker constitutes an LCB-C having an input oriented towards said controller and power supply unit and an output oriented against at least one of said third plurality of localized irrigation control units.

37. The two-wire controlling and monitoring system according to any of the points 34-35, wherein said two-wire cable forms a loop beginning and ending at said pair of control and power outputs of said controller and power supply unit or alternatively forms a loop constituting a part of said two-wire cable.

38. The two-wire controlling and monitoring system according to any of the points 34-37, wherein said two-wire cable including at least two line circuit breakers having at least one of said third plurality of localized irrigation control units in-between themselves, said two-wire controlling and monitoring system being capable of detecting a failure of said at least one of said third plurality of localized irrigation control units by opening and closing said line circuit breakers.

39. The two-wire controlling and monitoring system according to any of the points 34-38, wherein said line circuit breaker constitutes a MOSFET or a latching relay.

40. The two-wire controlling and monitoring system according to any of the points 34-39, wherein said two-wire controlling and monitoring system is capable of finding the location of a short circuit by supplying from said controller and power supply unit a current having a frequency of 40-100 HZ and finding the location of the short circuit by using a clamp ampere meter.

41. The two-wire controlling and monitoring system according to any of the points 34-40, wherein said line circuit breaker is protected from overcurrent by a spark gap.

42. A two-wire controlling and monitoring system for in particular irrigation of localized areas of soil and comprising:
   a water pipeline providing water to said localized areas of soil,
   a first plurality of controllable irrigation valves, each positioned at a specific area of said localized areas of soil, each connected to said water pipeline for providing watering or non-watering of said specific area of said localized areas of soil and each having a pair of valve control inputs, each of said first plurality of controllable irrigation valves including an activity sensor for detecting whether said controllable irrigation valve providing watering or non-watering of said specific area of said localized areas of soil,
   a second plurality of localized irrigation control units, each comprising a line decoder having a pair of valve control outputs connected to said pair of valve control inputs of a specific controllable irrigation valve of said first plurality of controllable irrigation valves for providing valve control signals to said first plurality of controllable irrigation valves, said line decoder further each having a pair of control and power supply inputs,
   a controller and power supply unit having a set of schedules of instructions and having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped, but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, and
   a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units.

43. The two-wire controlling and monitoring system according to point 42, wherein said activity sensor comprises a pressure sensor located at a water outlet of said controllable irrigation valve.

44. The two-wire controlling and monitoring system according to point 42, wherein said activity sensor comprises a moisture sensor located at a water outlet of said controllable irrigation valve, said moisture sensor being affected by water from said water outlet but protected from natural water flows such as rain.

45. The two-wire controlling and monitoring system according to point 42, wherein said activity sensor comprises a chock detector or an accelerometer.

46. The two-wire controlling and monitoring system according to point 42, wherein said activity sensor comprises a microphone, a pressure sensor or an accelerometer.

47. A method for controlling and monitoring in particular irrigation of localized areas of soil and comprising the following steps of:
   providing water to said localized areas of soil through a water pipeline, controlling discharge or supply of water from said water pipeline, providing watering or non-watering of a specific area of said localized areas of soil through a first plurality of controllable irrigation valves, each positioned at said specific area of said localized areas of soil and said first plurality of controllable irrigation valves having a pair of valve control inputs,
   measuring specific irrigation parameters through a second plurality of field sensors positioned at said specific areas of said localized areas of soil and said second plurality of field sensors having a pair of sensor outputs,
   transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs,
   providing a first set of schedules of instructions according to a first communications protocol and a second set of schedules of instructions according to a second communications protocol by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs,
   providing a two-wire cable, interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, and transmitting a type declaration from said controller and power supply unit transmitting to said third plurality of localized irrigation control units through said two-wire cable using said first communications protocol, said type declaration providing communication under said second communication protocol, transmitting said second set of schedules of instructions from said controller and power supply unit to said third plurality of localized irrigation control units through said two-wire cable using said second communications protocol, and transmitting said first set of schedules of instructions from said controller and power supply unit to said third plurality of localized irrigation control units through said two-wire cable using said first communications protocol.

48. A method for controlling and monitoring in particular irrigation of localized areas of soil and comprising the following steps of:

providing water to said localized areas of soil through a water pipeline, controlling discharge or supply of water from said water pipeline, providing watering or non-watering of a specific area of said localized areas of soil through a first plurality of controllable irrigation valves, each positioned at said specific area of said localized areas of soil and said first plurality of controllable irrigation valves having a pair of valve control inputs, measuring specific irrigation parameters through a second plurality of field sensors positioned at said specific areas of said localized areas of soil and said second plurality of field sensors having a pair of sensor outputs, transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, providing a two-wire cable, interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, disconnecting said second plurality of field sensors and said third plurality of localized irrigation control units from said two-wire cable, supplying a specific constant current from said controller and power supply unit for alternating said first alternating DC voltage signal from a first voltage to a second voltage during a specific time period, and calculating the capacity of said two-wire cable by multiplying said specific current by said time period and dividing the product by the difference between said first voltage and said second voltage.

49. A method for controlling and monitoring in particular irrigation of localized areas of soil and comprising the following steps of:

providing water to said localized areas of soil through a water pipeline, controlling discharge or supply of water from said water pipeline, providing watering or non-watering of a specific area of said localized areas of soil through a first plurality of controllable irrigation valves, each positioned at said specific area of said localized areas of soil and said first plurality of controllable irrigation valves having a pair of valve control inputs, measuring specific irrigation parameters through a second plurality of field sensors positioned at said specific areas of said localized areas of soil and said second plurality of field sensors having a pair of sensor outputs, transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, providing a two-wire cable, interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, determining at the end of said third pulse width by using said controller and power supply unit the difference between a first voltage measured between said pair of control and power outputs, and, a second voltage measured between said pair of control and power supply inputs of said sensor decoder, and calculating a cable resistance by dividing said difference with said current maximum.

50. A method for controlling and monitoring in particular irrigation of localized areas of soil and comprising the following steps of:

providing water to said localized areas of soil through a water pipeline, controlling discharge or supply of water from said water pipeline, providing watering or non-watering of a specific area of said localized areas of soil through a first plurality of controllable irrigation valves, each positioned at said specific area of said localized areas of soil and said first plurality of controllable irrigation valves having a pair of valve control inputs, measuring specific irrigation parameters through a second plurality of field sensors positioned at said specific areas of said localized areas of soil and said second plurality of field sensors having a pair of sensor outputs, transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, providing a two-wire cable interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, and transmitting said schedules of instructions from said controller and power supply unit to said third plurality of localized irrigation control units through said two-wire cable and receiving said specific irrigation parameters from said third plurality of localized irrigation control units through said two-wire cable, wherein said controller and power supply unit comprising a microprocessor, a storage unit for storing said schedules of instructions, an output section for providing power to said two-wire cable and transmitting said schedules of instruction on said two-wire cable, and an input section for monitoring voltage of said two-wire cable, said microprocessor controlling said output section to apply said minimum current to said two-wire cable during an interrupt window and/or wherein each of said sensor decoders and/or line decoders comprise a short circuiting circuit providing an interrupt signal during said interrupt window to said controller and power supply unit by unidirectional short circuiting said pair of control and power supply inputs, hence reducing differential voltage of said two-wire cable and no interrupt signal by open circuiting said pair of control and power supply inputs, said interrupt signal being constituted by a voltage drop of said differential voltage of said two-wire cable in the range 5V to 35V, such as a range of 15V to 30V, or preferably said voltage drop is 25V and/or wherein said interrupt window is initiated following a DC alternation of said first alternating DC voltage signal and said second alternating DC voltage signal and a power supply period, said power supply period being in the range of 5 ms to 550 ms, such as ranges 10 ms to 250 ms or 50 ms to 100 ms, said interrupt window being dependent on the distance between said controller and power supply unit and each of said sensor decoders and/or line decoders, said interrupt window being in the range of 0.2 ms to 10 ms or preferably said interrupt window is shorter than 1 ms.

51. A method for controlling and monitoring in particular irrigation of localized areas of soil and comprising the following steps of:

providing water to said localized areas of soil through a water pipeline, controlling discharge or supply of water from said water pipeline, providing watering or non-watering of a specific area of said localized areas of soil through a first plurality of controllable irrigation valves, each positioned at said specific area of said localized areas of soil and said first plurality of controllable irrigation valves having a pair of valve control inputs, measuring specific irrigation parameters through a second plurality of field sensors positioned at said specific areas of said localized areas of soil and said second plurality of field sensors having a pair of sensor outputs, transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped, but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, providing a two-wire cable, interconnecting the controller and power supply unit and the third plurality of localized irrigation control units through a two-wire cable connecting the pair of control and power outputs of the controller and power supply unit to the control and power inputs of the third plurality of localized irrigation control units and providing the power from the control and power unit to each of the third plurality of localized irrigation control units, and temporarily increasing said maximum current and decreasing said minimum current during alternation of said first and second alternating DC voltage signal.

52. A method for controlling and monitoring in particular irrigation of localized areas of soil and comprising the following steps of:

providing water to said localized areas of soil through a water pipeline, controlling discharge or supply of water from said water pipeline, providing watering or non-watering of a specific area of said localized areas of soil through a first plurality of controllable irrigation valves, each positioned at said specific area of said localized areas of soil and said first plurality of controllable irrigation valves having a pair of valve control inputs, measuring specific irrigation parameters through a second plurality of field sensors positioned at said specific areas of said localized areas of soil and said second plurality of field sensors having a pair of sensor outputs, transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped, but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, providing a two-wire cable, interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, and transmitting said schedules of instructions from said controller and power supply unit to said third plurality of localized irrigation control units through said two-wire cable and receiving said specific irrigation parameters from said third plurality of localized irrigation control units through said two-wire cable, wherein said schedules of instructions comprise a an address of a specific designated group of localized irrigation control unit of said third plurality of localized irrigation control units, data disclosing information regarding actions to be taken by said specific designated group of localized irrigation control unit of said third plurality of localized irrigation control units.

53. A method for controlling and monitoring in particular irrigation of localized areas of soil and comprising the following steps of:

providing water to said localized areas of soil through a water pipeline, controlling discharge or supply of water from said water pipeline, providing watering or non-watering of a specific area of said localized areas of soil through a first plurality of controllable irrigation valves, each positioned at said specific area of said localized areas of soil and said first plurality of controllable irrigation valves having a pair of valve control inputs, measuring specific irrigation parameters through a second plurality of field sensors positioned at said specific areas of said localized areas of soil and said second plurality of field sensors having a pair of sensor outputs, transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, providing a two-wire cable, interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, transmitting said schedules of instructions from said controller and power supply unit to said third plurality of localized irrigation control units through said two-wire cable and receiving said specific irrigation parameters from said third plurality of localized irrigation control units through said two-wire cable, and registering in a register a balance value representing the difference between the accumulated time of maximum voltage of said first alternating DC voltage signal and the accumulated time of minimum voltage of said first alternating DC voltage signal or alternatively registering in a register the average voltage of said first alternating DC voltage signal.

54. A method for controlling and monitoring in particular irrigation of localized areas of soil and comprising the following steps of:

providing water to said localized areas of soil through a water pipeline, controlling discharge or supply of water from said water pipeline, providing watering or non-watering of a specific area of said localized areas of soil through a first plurality of controllable irrigation valves each positioned at said specific area of said localized areas of soil and said first plurality of controllable irrigation valves having a pair of valve control inputs, measuring specific irrigation parameters through a second plurality of field sensors positioned at said specific areas of said localized areas of soil and said second plurality of field sensors having a pair of sensor outputs, transmitting control signals to said first plurality of controllable irrigation valves and second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, providing a two-wire cable, interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, and transmitting said schedules of instructions from said controller and power supply unit to said third plurality of localized irrigation control units through said two-wire cable and receiving said specific irrigation parameters from said third plurality of localized irrigation control units through said two-wire cable, wherein said schedules of instructions comprise a type declaration determining a primary address of a specific designated localized irrigation control unit of said third plurality of localized irrigation control units, said primary address of said specific designated localized irrigation control unit of said third plurality of localized irrigation control units being defined by said controller and power supply and comprising an address transmission size in the range of 0 to 128 bits, such as ranges 0 to 64 bits or 0 to 32, or said address transmission size being preferably 16 bits, wherein said schedules of instructions comprise a type declaration determining a secondary address of a specific designated localized irrigation control unit of said third plurality of localized irrigation control units, said secondary address of said specific designated localized irrigation control unit of said third plurality of localized irrigation control units being unique, permanently predefined and comprises an address transmission size greater than the address transmission size of said primary address, said address transmission size of said secondary address being in the range of 0 to 256 bits, such as ranges 0 to 128 bits or 0 to 64, or said address transmission size being preferably 32 bits.

55. A method for controlling and monitoring in particular irrigation of localized areas of soil and comprising the following steps of:
providing a water pipeline providing water to said localized areas of soil,
providing a first plurality of controllable irrigation valves, each positioned at a specific area of said localized areas of soil, each connected to said water pipeline for providing watering or non-watering of said specific area of said localized areas of soil and each having a pair of valve control inputs,
providing a second plurality of field sensors positioned at specific areas of said localized areas of soil, providing specific irrigation parameters and having a pair of sensor outputs,
providing a third plurality of localized irrigation control units, each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs, each of said localized irrigation control units further comprising a wireless communication unit providing a portable communication device, and
communicating between said portable communication device and said wireless communication unit.

56. A method for controlling and monitoring in particular irrigation of localized areas of soil and comprising the following steps of:
providing a water pipeline providing water to said localized areas of soil,
providing a first plurality of controllable irrigation valves, each positioned at a specific area of said localized areas of soil, each connected to said water pipeline for providing watering or non-watering of said specific area of said localized areas of soil and each having a pair of valve control inputs,
providing a second plurality of localized irrigation control units, each comprising a line decoder having a pair of valve control outputs connected to said pair of valve control inputs of a specific controllable irrigation valve of said first plurality of controllable irrigation valves for providing valve control signals to said first plurality of controllable irrigation valves, said line decoder further each having a pair of control and power supply inputs for communicating with a controller and power supply over a two-wire cable, said specific controllable irrigation valve of said first plurality of controllable irrigation valves comprise a solenoid connected to said valve control inputs, a core operable between a first position and a second position, and a piston connected to said core,
defining in said line decoder an inrush DC voltage level signal for forcing said core into said second position,
defining in said line decoder a hold DC voltage level signal for retaining said core in said second position,
determining by means of said line decoder, said first position or said second position of said core,
measuring a self inductance value and a resistance value of said solenoid, and
transmitting by means of said line decoder said self inductance value and said resistance value to said controller and power supply via said two-wire cable or alternatively monitoring said self inductance value and said resistance value and signals in said controller and power supply in case any of said self inductance value and said resistance value is outside a predetermined range.

57. A method for controlling and monitoring in particular irrigation of localized areas of soil and comprising the following steps of:
providing water to said localized areas of soil through a water pipeline, controlling discharge or supply of water from said water pipeline, providing watering or non-watering of a specific area of said localized areas of soil through a first plurality of controllable irrigation valves, each positioned at said specific area of said localized areas of soil and said first plurality of controllable irrigation valves having a pair of valve control inputs,
measuring specific irrigation parameters through a second plurality of field sensors positioned at said specific areas of said localized areas of soil and said second plurality of field sensors having a pair of sensor outputs,
transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs,
providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped, but of inverted polarity as compared to said first alternating DC voltage signal to another of said pair of control and power outputs and applying an alternating DC current defining a current maximum having a third pulse width and defining a current minimum having a fourth pulse width to said pair of control and power outputs,
providing a two-wire cable, interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, measuring a voltage value on said control and power inputs by using said sensor decoder and/or said line decoder, and transmitting said voltage value from said sensor decoder and/or said line decoder to said controller and power supply via said two-wire cable or alternatively monitoring said voltage value and signals said controller and power supply in case any of said voltage value is outside a predetermined range 58. A method for controlling and monitoring in particular irrigation of localized areas of soil and comprising the following steps of:

providing a water pipeline providing water to said localized areas of soil, providing a first plurality of controllable irrigation valves each positioned at a specific area of said localized areas of soil, each connected to said water pipeline for providing watering or non-watering of said specific area of said localized areas of soil and each having a pair of valve control inputs, providing a second plurality of localized irrigation control units, each comprising a line decoder having a pair of valve control outputs connected to said pair of valve control inputs of a specific controllable irrigation valve of said first plurality of controllable irrigation valves for providing valve control signals to said first plurality of controllable irrigation valves, said line decoder further each having a pair of control and power supply inputs, providing a controller and power supply unit having a set of schedules of instructions and having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped, but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, providing a two-wire cable interconnecting said controller and power supply unit and said third plurality of localized irrigation control units and connecting said pair of control and power outputs of said controller and power supply unit to said control and power inputs of said third plurality of localized irrigation control units in a parallel connection, providing one or more line circuit breaker in said two-wire cable in a series connection, and interrupting the connection between at least one of said pair of control and power outputs of said controller and power supply unit and at least one of said control and power inputs of at least one of said third plurality of localized irrigation control units by using said one or more line circuit breakers.

59. A method for controlling and monitoring in particular irrigation of localized areas of soil and comprising the following steps of:

providing water to said localized areas of soil through a water pipeline, controlling discharge or supply of water from said water pipeline, providing watering or non-watering of a specific area of said localized areas of soil through a first plurality of controllable irrigation valves, each positioned at said specific area of said localized areas of soil and said first plurality of controllable irrigation valves having a pair of valve control inputs, each of said first plurality of controllable irrigation valves including an activity sensor for detecting whether said controllable irrigation valve providing watering or non-watering of said specific area of said localized areas of soil, measuring specific irrigation parameters through a second plurality of field sensors positioned at said specific areas of said localized areas of soil and said second plurality of field sensors having a pair of sensor outputs, transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to the pair of valve control inputs of a specific controllable irrigation valve of said first plurality of controllable irrigation valves and/or a pair of sensor inputs connected to said pair of sensor outputs of a specific field sensor of the second plurality of field sensors and having a pair of control and power supply inputs, providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of the pair of control and power outputs, simultaneously applying a second alternating DC voltage signal similarly shaped, but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, providing a two-wire cable, interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, and transmitting said schedules of instructions from said controller and power supply unit to said third plurality of localized irrigation control units through said two-wire cable and receiving said specific irrigation parameters from said third plurality of localized irrigation control units through said two-wire cable.

60. A two-wire controlling and monitoring system for in particular irrigation of localized areas of soil and comprising:

a water pipeline providing water to said localized areas of soil, a first plurality of controllable irrigation valves each positioned at a specific area of said localized areas of soil, each connected to said water pipeline for providing watering or non-watering of said specific area of said localized areas of soil and each having a pair of valve control inputs, a second plurality of field sensors positioned at specific areas of said localized areas of soil, providing specific irrigation parameters and having a pair of sensor outputs, a third plurality of localized irrigation control units each comprising a sensor decoder having a pair of sensor inputs connected to said pair of sensor outputs of a specific field sensor of said second plurality of field sensors for providing power to said second plurality of field sensors and recording said specific irrigation parameters from said second plurality of field sensors and/or a line decoder having a pair of valve control outputs connected to said pair of valve control inputs of a specific controllable irrigation valve of said first plurality of controllable irrigation valves for providing valve control signals to said first plurality of controllable irrigation valves, said sensor decoder and said line decoder further each having a pair of control and power supply inputs, a controller and power supply unit having a set of schedules of instructions and having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped but of inverted polarity as compared to said first alternating DC voltage signal to another of said pair of control and power outputs and applying an alternating DC current defining a current maximum having a third pulse width and defining a current minimum having a fourth pulse width to said pair of control and power outputs, a two-wire cable interconnecting said controller and power supply unit and said third plurality of localized irrigation control units and connecting said pair of control and power outputs of said controller and power supply unit to said control and power inputs of said third plurality of localized irrigation control units and providing said power from said controller and power supply unit to each of said third plurality of localized irrigation control units, and said controller and power supply unit transmitting said schedules of instructions to said third plurality of localized irrigation control units through said two-wire cable and receiving said specific irrigation parameters from said third plurality of localized irrigation control units through said two-wire cable.

61. The two-wire irrigation controlling and monitoring system according to point 60, wherein said water pipeline is wholly or partly buried under ground, or said water pipeline is placed on the ground and/or wherein said water pipeline are constructed from plastic materials or metal materials such as iron, steel, copper, silver, gold or any alloys thereof in any combinations thereof.

62. The two-wire irrigation controlling and monitoring system according to any of the points 60 to 61, wherein said first plurality of controllable irrigation valves are magnetically, electrically, hydraulically or pneumatically operated or combinations thereof and/or wherein said first plurality of controllable irrigation valves are opened by applying an inrush voltage or current signal followed by a hold voltage or current signal to said pair of valve control inputs and closed by applying no voltage or current signal to said pair of valve control inputs and/or wherein said second plurality of field sensors comprises a selection of temperature sensors, humidity sensors, pressure sensors, flow sensors, magnetic field sensors, mechanical movement sensors, mechanical strain sensors, fertilizer sensors or any combination thereof.

63. The two-wire irrigation controlling and monitoring system according to any of the points 60 to 62, wherein said first pulse width is equal to said second pulse width or wherein said first pulse width is smaller than said second pulse width or wherein said first pulse width is greater than said second pulse width.

64. The two-wire irrigation controlling and monitoring system according to any of the points 60 to 63, wherein said first alternating DC voltage signal and said second alternating DC voltage signal alternate with a frequency less than AC frequency of power networks such as 50 Hz or 60 Hz or less.

65. The two-wire irrigation controlling and monitoring system according to any of the points 60 to 64, wherein said first pulse width of said first alternating DC voltage signal and said second alternating DC voltage signal is in the range of 1 ms to 10 s such as ranges within 200 ms to 2 s, 300 ms to 1 s, 400 ms to 800 ms, 450 ms to 550 ms, 475 ms to 525 ms or 490 ms to 510 ms, or preferably said first pulse width is 500 ms and/or wherein said second pulse width of said first alternating DC voltage signal and said second alternating DC voltage signal is in the range of 1 ms to 10 s, such as ranges of 200 ms to 2 s, 300 ms to 1 s, 400 ms to 800 ms, 450 ms to 550 ms, 475 ms to 525 ms or 490 ms to 510 ms, or preferably said second pulse width is 500 ms.

66. The two-wire irrigation controlling and monitoring system according to any of the points 60 to 65, wherein said voltage maximum is in a range from +10V to +30V, such as ranges of +13V to +19V or +14V to +17V, or preferably, said voltage maximum is +15V and/or wherein said voltage minimum in a range from −15V to −25V, such as ranges from −17V to −23V and −19V to −21V, or preferable said voltage minimum is −20V.

67. The two-wire irrigation controlling and monitoring system according to any of the points 60 to 66, wherein said first alternating DC voltage signal and said second alternating DC voltage signal during said first pulse width and said second pulse width averages voltages greater than or equal to zero voltage, or wherein said first alternating DC voltage signal and said second alternating DC voltage signal during said first pulse width and said second pulse width averages voltages less than or equal to zero voltage and/or wherein said first alternating DC voltage signal and said second alternating DC voltage signal averages during said first pulse width and said second pulse width an average voltage in the range of −5V to −0.5V, such as ranges from −4V to −1V or −2.5V to −1.5V, or preferably said average voltages are −2V.

68. The two-wire irrigation controlling and monitoring system according to any of the points 60 to 67, wherein said maximum current is in the range of 0.5 A to 5 A such as 0.75 A to 1.5 A, or preferably said maximum current is 1.1 A and/or wherein said minimum current is in the range of 20 mA to 150 mA, such as ranges from 30 mA to 100 mA or 35 mA to 85 mA, or preferably said minimum current is 40 mA.

69. The two-wire irrigation controlling and monitoring system according to any of the points 60 to 68, wherein said third pulse width is greater than said fourth pulse width and/or wherein said fourth pulse width is in the range of 10 us to 10 ms, such as in the range of 0.5 ms to 7 ms, or preferably said fourth pulse width is shorter than 5 ms.

70. The two-wire irrigation controlling and monitoring system according to any of the points 60 to 69, wherein said line decoders provides said inrush voltage, said hold voltage and said zero voltage to said first plurality of controllable irrigation valves by supplying from said pair of valve control outputs a pulsed alternating DC control signal to said pair of valve control inputs in accordance with said transmitted schedules of instructions and/or wherein said pulsed alternating DC signal defining a maximum voltage in the range of 25V to 45V such as ranges from 27V to 43V or 30V to 40V, or preferably said maximum voltage being 35V, defining a minimum voltage in the range of 0V to 5V, such as ranges from 0V to 3V or 0V to 1V, or preferably said minimum voltage being 0V, defining a line decoder output pulse width in the range of 100 us to 0.1 s such as ranges 200 us to 2 ms or 800 us to 1.25 ms, or preferably said first decode output pulse width being 1 ms, said line decoder output pulse width defining a first part having said maximum voltage and a second part having said minimum voltage, and wherein said pulsed alternating DC signal constituting said inrush voltage by having said first part longer than or equal to said second part during a period in the range 10 ms to 1 s, such as 30 ms to 100 ms and constituting said hold voltage by having said first part shorter than said second part during a period determined in accordance with said schedule of instructions transmitted to said line decoders by said controller and power supply unit.

71. The two-wire irrigation controlling and monitoring system according to any of the points 60 to 70, wherein said schedules of instructions are transmitted onto said two-wire system by re-scaling said first pulse width or said second pulse width to fifth pulse width in the range of 100 us to 49 ms, such as ranges from 15 ms to 35 ms or 17 ms to 25 ms, or preferably said fifth pulse width is 20 ms indicating a binary "1", or by re-scaling said first pulse width or said second pulse width to a sixth pulse width in the range of 50 us to 9 ms, such as ranges from 2 ms to 8 ms or 3 ms to 6 ms, or preferably said sixth pulse width is 5 ms indicating binary "0" and/or wherein said schedules of instructions comprise a type declaration determining additional content of a transmission from said controller and power supply unit to said third plurality of localized irrigation control units, said additional content, such as an address of a specific designated localized irrigation control unit of said third plurality of localized irrigation control units, data disclosing information regarding actions to be taken by said specific designated localized irrigation control unit of said third plurality of localized irrigation control units and/or a first check and a second check ensuring a safe reception of said transmission is terminated by a stop signal having a seventh pulse width and/or wherein said seventh pulse width is in the range of 2 ms to 70 ms, such as 5 ms to 65 ms, or preferably said seventh pulse width is 10 ms.

72. The two-wire irrigation controlling and monitoring system according to the point 71, wherein said type declaration comprising 4 bits provides 16 optional operations such as Arbitration, Data, Control (On/Off), Broadcast, Test and Poll and/or wherein said address of said specific designated localized irrigation control unit of said third plurality of localized irrigation control units comprises an address transmission size in the range of 0 to 128 bits, such as ranges 0 to 64 bits or 0 to 32, or said address transmission size preferably 16 bits and/or wherein said data disclosing information regarding actions to be taken by said specific designated localized irrigation control unit of said third plurality of localized irrigation control units comprises a data transmission size in the range of 0 to 64 KBYTE and/or wherein said first check and said second check ensuring a safe reception of said transmission comprises a check transmission size in the range 0 to 128, such as ranges 0 to 64 bits or 0 to 32 bits or preferably said check transmission size is 4 bit for each of said first and second check.

73. The two-wire irrigation controlling and monitoring system according to any of the points 60 to 72, wherein said controller and power supply unit comprises a microprocessor, a storage unit for storing said schedules of instructions, an output section for providing power to said two-wire cable and transmitting said schedules of instruction on said two-wire cable, and an input section for monitoring voltage of said two-wire cable, said microprocessor controls said output section to apply said minimum current to said two-wire cable during an interrupt window and/or wherein each of said sensor decoders and/or line decoders comprises a short circuiting circuit providing an interrupt signal during said interrupt window to said controller and power supply unit by unidirectional short circuiting said pair of control and power supply inputs, hence reducing differential voltage of said two-wire cable and no interrupt signal by open circuiting said pair of control and power supply inputs, said interrupt signal is constituted by a voltage drop of said differential voltage of said two-wire cable in the range of 5V to 65V, such as range of 15V to 30V, or preferably said voltage drop is 25V and/or wherein said interrupt window is initiated following a DC alternation of said first alternating DC voltage signal and said second alternating DC voltage signal and a power supply period, said power supply period is in the range of 5 ms to 550 ms, such as ranges from 300 ms to 500 ms or 350 ms to 450 ms, or preferably said power supply time period is 400 ms and said interrupt window is in the range of 0 ms to 20 ms, or preferably said interrupt window is shorter than 5 ms.

74. The two-wire irrigation controlling and monitoring system according to the point 73, wherein said microprocessor records said interrupt signal from at least one sensor decoder and/or line decoder of said third plurality of localized irrigation control units through said input section monitoring voltage of said two-wire cable and subsequently operates said output section to perform a DC alternation of said first alternating DC voltage signal and said second alternating DC voltage signal and operates said output section to terminate said interrupt window and apply said maximum current to said two-wire cable and/or wherein said microprocessor following a recording of said interrupt signal from at least one interrupting sensor decoder and/or line decoder of said third plurality of localized irrigation control units performs a DC alternation of said first alternating DC voltage signal and said second alternating DC voltage signal and transmits said type declaration Arbitration followed by a series of binary "1"s including an answer window for said at least one interrupting sensor decoder and/or line decoder of said third plurality of localized irrigation control units to answer to said binary "1" and/or wherein said answer window is initiated following a DC alternation of said first alternating DC voltage signal and said second alternating DC voltage signal and a pause period, said pause period is in the range of 200 us to 10 ms, such as ranges from 3 ms to 8 ms or 4 ms to 6 ms, or preferably said pause period is 5 ms and said answer window is in the range 0 ms to 20 ms, or preferably said answer window is shorter than 2.5 ms.

75. The two-wire irrigation controlling and monitoring system according to the points 73 or 74, wherein said short circuiting circuit providing an answer signal during said answer window to said controller and power supply unit by unidirectional short circuiting said pair of control and power supply inputs, hence reducing differential voltage of said two-wire cable and no answer signal by open circuiting said pair of control and power supply inputs, said answer signal is constituted by a voltage drop of said differential voltage of said two-wire cable in the range of 5V to 65V such as range 15V to 30V, or preferably said voltage drop is 25V and/or wherein said microprocessor controls said output section to supply said minimum current to said two-wire cable during said answer window.

76. The two-wire irrigation controlling and monitoring system according to any of the points 60 to 75, wherein said controller and power supply unit during a declared type of transmission of schedules and instructions request said specific irrigation parameters from an addressed sensor decoder of said third plurality of localized irrigation control units and subsequently said controller and power supply unit transmits a series of binary "1" including said answer window for said addressed decoder to answer to said binary "1" and/or wherein said microprocessor records said answer signal from at least one sensor decoder of said third plurality of localized irrigation control units through said input section monitoring said voltage of said two-wire cable and operates said output section to perform a DC alternation of said first alternating DC voltage signal and said second alternating DC voltage signal and subsequently operates said output section to terminate said answer window and to apply said maximum current to said two-wire cable and/or wherein said microprocessor interprets said answer signal as an indication of a binary "0" and no answer signal as a binary "1".

77. A method for controlling and monitoring in particular irrigation of localized areas of soil and comprising the following steps of:
providing water to said localized areas of soil through a water pipeline, controlling the discharge or supply of water from said water pipeline, providing watering or non-watering of said specific area of a localized area of soil through a first plurality of controllable irrigation valves, each positioned at a specific area of said localized areas of soil and said first plurality of controllable irrigation valves having a pair of valve control inputs,
measuring specific irrigation parameters through a second plurality of field sensors positioned at specific areas of said localized areas of soil and said second plurality of field sensors having a pair of sensor outputs,
transmitting control signals to said first plurality of controllable irrigation valves and said second plurality of field sensors though a third plurality of localized irrigation control units comprising a sensor decoder and a line decoder, providing valve control signals to said first plurality of controllable irrigation valves and/or recording said specific irrigation parameters from said second plurality of field sensors, each of said third plurality of localized irrigation control units having a pair of valve control outputs connected to said pair of valve control inputs of a specific controllable irrigation valve of said first plurality of controllable irrigation valves and/or a pair of sensor inputs connected to said pair of sensor outputs of a specific field sensor of said second plurality of field sensors and having a pair of control and power supply inputs,
providing a set of schedules of instructions by means of a controller and power supply unit having a pair of control and power outputs supplying power by applying a first alternating DC voltage signal defining a voltage maximum having a first pulse width and defining a voltage minimum having a second pulse width to one of said pair of control and power outputs, simultaneously applying a second alternating DC voltage signal similarly shaped, but of inverted polarity as compared to said first alternating DC voltage signal to another of said pair of control and power outputs and applying an alternating DC current defining a current maximum having a third pulse width and defining a current minimum having a fourth pulse width to said pair of control and power outputs,
providing a two-wire cable, interconnecting said controller and power supply unit and said third plurality of localized irrigation control units through a two-wire cable connecting said pair of control and power outputs of said controller and power supply unit to said control and power inputs of said third plurality of localized irrigation control units and providing said power from said control and power unit to each of said third plurality of localized irrigation control units, and
transmitting said schedules of instructions from said controller and power supply unit to said third plurality of localized irrigation control units through said two-wire cable and receiving said specific irrigation parameters from said third plurality of localized irrigation control units through said two-wire cable.

78. The method according to point 77, wherein said method further includes any of the features of any of the points 60-77.

79. A localized irrigation control unit for a two-wire controlling and monitoring system including a controller and power supply unit and for in particular irrigation of localized areas of soil and said localized irrigation control unit comprising:
a sensor decoder for receiving input signals from a field sensor, converting said input signals to a binary number and transmitting said binary number to said controller and power supply unit, and
a line decoder for receiving instructions from said controller and power supply unit or a mark sender unit, converting said instructions to a control signal and providing said control signal to a controllable irrigation valve.

80. The localized irrigation control unit according to point 79, wherein said input signals comprising analogue voltage signals, analogue current signals, digital pulse count signals, digital pulse width modulated signals or digital pulse frequency modulated signals, or any combinations thereof and/or wherein said sensor decoder comprising a field sensor power supply and field sensor signal amplifier having a pair of sensor inputs connected to a pair of sensor outputs of a specific field sensor, a control and power supply input section having a pair of control and power supply inputs connected to a two-wire cable interconnecting said sensor decoder and said controller and power supply unit, a short circuiting circuit having switching means connected between said pair of control and power supply inputs, and a first microprocessor unit interconnecting said field sensor power supply and field sensor signal amplifier and said short circuiting circuit and/or wherein said line decoder comprising a control and power supply input section having a pair of control and power supply inputs connected to said two-wire cable interconnecting said line decoder and said controller and power supply unit, a valve control power output stage having at least one pair of valve control outputs connected to a pair of valve control inputs of a specific controllable irrigation valve, and a second microprocessor unit interconnecting said control and power supply input section and said valve control output.

The invention claimed is:

1. A method for controlling and monitoring irrigation of localized areas of soil, the method comprising the steps of:
providing a water pipeline providing water to the localized areas of soil;
providing a plurality of controllable irrigation valves, each of the controllable irrigation valves being positioned at a specific area of the localized areas of soil, each of the controllable irrigation valves being connected to the water pipeline for providing watering or non-watering of the specific area of the localized areas of soil, and each of the controllable irrigation valves having a pair of valve control inputs;
providing a plurality of localized irrigation control units, each of the localized irrigation control units comprising a line decoder having a pair of valve control outputs connected to the pair of valve control inputs of a specific controllable irrigation valve of the plurality of controllable irrigation valves for providing valve control signals to the plurality of controllable irrigation valves, each of the line decoders having a pair of control and power supply inputs configured for communicating with a controller and power supply unit over a two-wire cable, the specific controllable irrigation valve of the plurality of controllable irrigation valves comprising (a) a solenoid connected to the valve control inputs, (b) a core operable between a first position and a second position, and (c) a piston connected to the core;
defining in each of the line decoders an inrush DC voltage level signal for forcing the core into the second position;
defining in each of the line decoders a hold DC voltage level signal for retaining the core in the second position;
determining, by means of the line decoders, which of the first position and the second position the core is in;
measuring a self-inductance value and a resistance value of the solenoid;
transmitting, by means of the line decoders, the measured self-inductance value and the measured resistance value to the controller and power supply unit via the two-wire cable, wherein, in response to an increase in the measured resistance value and the measured self-inductance value, the controller and power supply unit determines that the solenoid has degenerated, and wherein, in response to an increase in the measured resistance value with an unchanged measured self-inductance value, the controller and power supply unit determines a likely connection fault between the localized irrigation control unit and the solenoid.

2. A two-wire controlling and monitoring system for irrigation of localized areas of soil, the system comprising:
a water pipeline configured for providing water to the localized areas of soil;
a plurality of controllable irrigation valves, each of the controllable irrigation valves being positioned at a specific area of the localized areas of soil, each of the controllable irrigation valves being connected to the water pipeline so as to provide watering or non-watering of the specific area of the localized areas of soil, and each of the controllable irrigation valves having a pair of valve control inputs;
a plurality of localized irrigation control units, each of the localized irrigation control units comprising a line decoder having a pair of valve control outputs connected to the pair of valve control inputs of a specific controllable irrigation valve of the plurality of controllable irrigation valves, each of the line decoders being configured for providing valve control signals to one of the plurality of controllable irrigation valves, each of the line decoders further having a pair of control and power supply inputs configured for communicating with a controller and power supply unit over a two-wire cable;
the specific controllable irrigation valve of the plurality of controllable irrigation valves comprising (a) a solenoid connected to the valve control inputs, (b) a core operable between a first position and a second position, and (c) a piston connected to the core;
wherein each of the line decoders is configured to (a) define (a) an inrush DC voltage level that forces the core into the second position, (b) define a hold DC voltage level signal that retains the core in the second position, determine which of the first position and the second position the core is in, (d) measure a self-inductance value and a resistance value of the solenoid, and (e) transmit the measured self-inductance value and the measured resistance value to the controller and power supply unit via the two-wire cable;
wherein, in response to an increase in the measured resistance value and the measured self-inductance value, the controller and power supply unit determines that the solenoid has degenerated; and
wherein, in response to an increase in the measured resistance value with an unchanged measured self-inductance value, the controller and power supply unit determines a likely connection fault between the localized irrigation control unit and the solenoid.

* * * * *